(12) United States Patent
Yakubo et al.

(10) Patent No.: US 8,587,342 B2
(45) Date of Patent: Nov. 19, 2013

(54) SEMICONDUCTOR INTEGRATED CIRCUIT

(75) Inventors: Yuto Yakubo, Isehara (JP); Shuhei Nagatsuka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/471,920

(22) Filed: May 15, 2012

(65) Prior Publication Data

US 2012/0293207 A1    Nov. 22, 2012

(30) Foreign Application Priority Data

May 20, 2011   (JP) ................................. 2011-113430

(51) Int. Cl.
*H03K 19/094*   (2006.01)
*H03K 17/00*    (2006.01)

(52) U.S. Cl.
USPC ............. 326/102; 326/52; 326/113; 326/112; 327/408

(58) Field of Classification Search
USPC ......... 326/102, 83, 52, 55, 95, 112, 113, 122; 327/408, 409
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys Lett. (Applied Physics Letters), Sep. 27, 2004, vol. 85, No. 13, pp. 2541-2543.

(Continued)

*Primary Examiner* — Daniel D Chang
(74) *Attorney, Agent, or Firm* — Eric J. Robinson; Robinson Intellectual Property Law Office, P.C.

(57) ABSTRACT

A novel logic circuit in which data is held even after power is turned off is provided. Further, a novel logic circuit whose power consumption can be reduced is provided. In the logic circuit, a comparator comparing two output nodes, a charge holding portion, and an output-node-potential determining portion are electrically connected to each other. Such a structure enables data to be held in the logic circuit even after power is turned off. Further, the total number of transistors in the logic circuit can be reduced. Furthermore, the area of the logic circuit can be reduced by stacking a transistor including an oxide semiconductor and a transistor including silicon.

16 Claims, 49 Drawing Sheets

(56) References Cited

U.S. PATENT DOCUMENTS

| | | | |
|---|---|---|---|
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,411,420 B2 * | 8/2008 | Doi ................................ | 326/82 |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,125,268 B2 * | 2/2012 | Pan et al. ...................... | 327/563 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0052777 A1 * | 3/2010 | Pan et al. ...................... | 327/563 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-042236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-303580 A | 10/2005 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp 262106-1-262106-3.

Takahashi.M et al., "Theoretical Analysis of Igzo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

(56) References Cited

OTHER PUBLICATIONS

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26 pp. 181-184.

Osada.T et al., "15.2: Development of Driver-Integrated Panel using Amorphous In-Ga-Zn-Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Ll.C et al., "Modulated Structures of Homologous Compounds InMO3(ZnO)m (M=In, Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08: SID International Symposium Digest of Technical Papers, May 20, 2008, vol. 39, pp. 633-636.

Lee.J et al., "World'S Largest (15-Inch) XGA Amlcd Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", ID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD'09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09: SID International Symposium of Technical Papers, May 31, 2009, pp. 191-193.

Jin.D et al., "65.2: Distinguished Paper:World-Largest (6.5") Flexible Full Color Top Emission AMOLED Display on Plastic Film and Its Bending Properties,", SID Digest '09: SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09: Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", Am-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3: Invited Paper: Transparent Amorphous Oxide Semiconductors for High Performance TT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09: SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09: SID International Symposium Digest of Technical Papers, May 31, 2009, pp. 284-287.

Miyasaka.M, "SUFTLA Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Amplifications,", SID Digest '09: SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09: SID International Symposium Digest of Technical Papers, May 31, 2009, pp 395-398.

Lee.H et al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2: Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 24-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures over 1000°C,", Journal of Solid State Chemistry, 1985, vol. 60, pp. 382-384.

Kitzerow.H et al., "Observation of Blue Phases in Chiral Networks,", Liquid Crystals, 1993, vo. 14, No. 3, pp. 911-916.

(56) References Cited

OTHER PUBLICATIONS

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29: Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies In ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical.Review. B), 2008, vol. 77, pp. 245202-1-245202-6.

Orita.M et al., "Amorphous transparent conductive oxide InGaO3(ZnO)m (m<4): a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physial Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Let. (Applied Physics Letters), Sep. 1, 2003, vol. 83, No. 9, pp. 1755-1757.

* cited by examiner

FIG. 35A  FIG. 35B
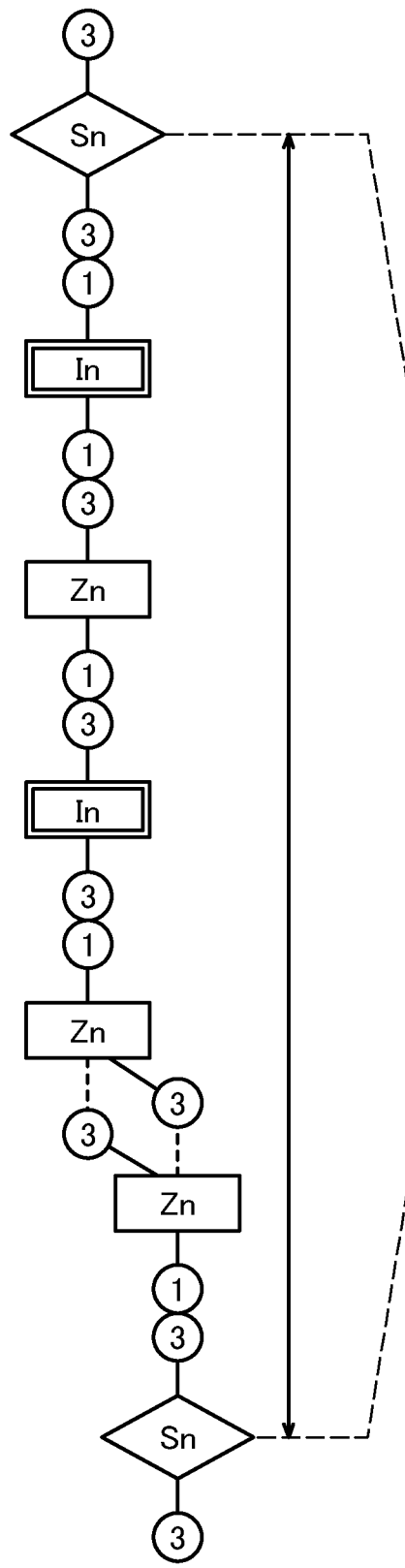
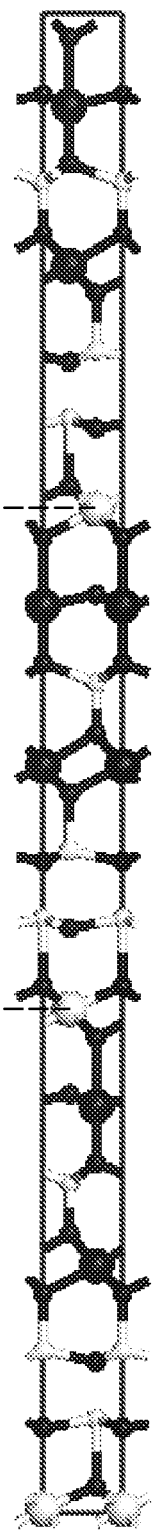
FIG. 35C
● In
○ Sn
○ Zn
● O

FIG. 36A
FIG. 36B
FIG. 36C
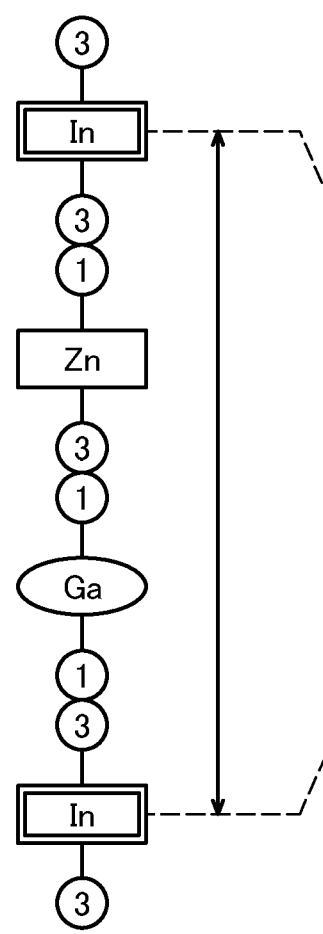
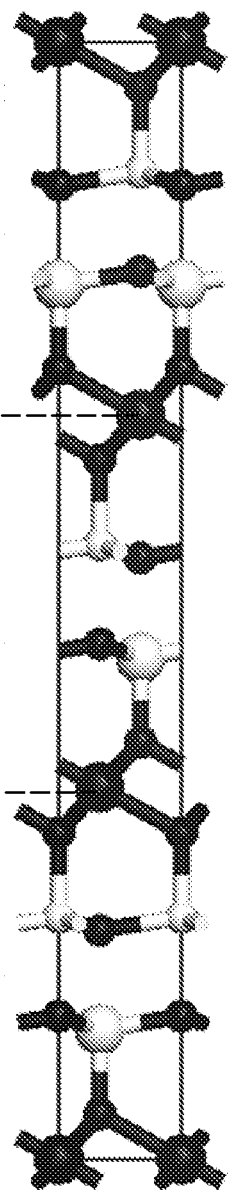
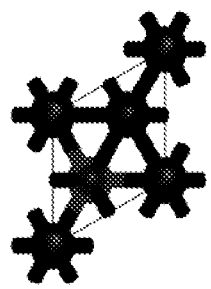
- In
- Ga
- Zn
- O

- In
- Ga or Zn
- O

- In
- Ga
- Zn
- O

SEMICONDUCTOR INTEGRATED CIRCUIT

BACKGROUND OF THE INVENTION

1. Field of the Invention

The present invention relates to a semiconductor integrated circuit using an oxide semiconductor and a method of driving the semiconductor integrated circuit.

2. Description of the Related Art

In a semiconductor integrated circuit, a NAND circuit, a NOR circuit, an inverter circuit (NOT circuit), and the like are used in combination.

In a conventional circuit configuration of a NAND circuit, a NOR circuit, or the like, two p-channel transistors and two n-channel transistors are used in combination, for example.

As one kind of NAND circuit, for example, a NAND circuit including a ferroelectric capacitor is known (see Patent Document 1).

REFERENCE

Patent Document

[Patent Document 1] Japanese Published Patent Application No. 2005-303580

SUMMARY OF THE INVENTION

A conventional logic circuit includes a CMOS circuit in which a p-channel transistor and an n-channel transistor are complementarily combined. In a conventional logic circuit of this type, data is erased when power is off.

In view of this, an object of one embodiment of the present invention is to provide a novel logic circuit in which data is held even after power is turned off.

In a conventional logic circuit using a CMOS circuit, power consumption in a standby period is large because there are a large number of paths from a power supply potential (VDD) terminal to a reference potential (GND) terminal.

Another object is to provide a novel logic circuit with low power consumption.

Another object is to achieve a reduction in area of a logic circuit for further miniaturization of a semiconductor integrated circuit.

Another object is to provide a novel logic circuit in which the number of elements is smaller than that in a conventional logic circuit, specifically, the total number of transistors is reduced.

As a novel logic circuit in which data is held even after power is turned off, a logic circuit having a register function is formed.

One embodiment of the present invention disclosed in this specification is a semiconductor integrated circuit including a logic circuit. The logic circuit includes a comparator comparing two output nodes; a charge holding portion electrically connected to the comparator; and an output-node-potential determining portion electrically connected to the charge holding portion. The charge holding portion includes an n-channel transistor whose gate is electrically connected to a transistor including an oxide semiconductor.

Another embodiment of the present invention disclosed in this specification is a semiconductor integrated circuit including a logic circuit. The logic circuit includes a comparator comparing two output nodes; a charge holding portion electrically connected to the comparator; and an output-node-potential determining portion electrically connected to the charge holding portion. The charge holding portion includes a p-channel transistor whose gate is electrically connected to a transistor including an oxide semiconductor.

One embodiment of the present invention disclosed in this specification is a semiconductor integrated circuit including a logic circuit. The logic circuit includes a comparator comparing two output nodes; a charge holding portion electrically connected to the comparator; and an output-node-potential determining portion electrically connected to the charge holding portion. The charge holding portion includes a first transistor whose gate is electrically connected to a first transistor including an oxide semiconductor and which includes silicon; a second transistor whose gate is electrically connected to a second transistor including an oxide semiconductor and which includes silicon; a third transistor whose gate is electrically connected to a third transistor including an oxide semiconductor and which includes silicon; and a fourth transistor whose gate is electrically connected to a fourth transistor including an oxide semiconductor and which includes silicon.

In the above structure, the comparator may include two p-channel transistors whose gates are each supplied with a clock signal and two p-channel transistors whose gates are each connected to a corresponding one of the two output nodes. The output-node-potential determining portion may be one n-channel transistor whose gate is supplied with a clock signal. A drain of the n-channel transistor may be electrically connected to a ground potential terminal. A source of the n-channel transistor may be electrically connected to a power supply potential terminal.

In the above structure, the comparator may include two n-channel transistors whose gates are each supplied with a clock signal and two n-channel transistors whose gates are each connected to a corresponding one of the two output nodes. Further, the output-node-potential determining portion may be one p-channel transistor whose gate is supplied with the clock signal, whose drain is electrically connected to a power supply potential terminal, and whose source is electrically connected to the ground potential terminal.

Another embodiment of the present invention disclosed in this specification is a semiconductor integrated circuit including a logic circuit. The logic circuit includes a comparator comparing two output nodes; a charge holding portion electrically connected to the comparator; and an output-node-potential determining portion electrically connected to the charge holding portion. The charge holding portion includes a first storage capacitor electrically connected to one of a source and a drain of a first transistor including an oxide semiconductor and a gate of a first transistor including silicon; a second storage capacitor electrically connected to one of a source and a drain of a second transistor including an oxide semiconductor and a gate of a second transistor including silicon; a third storage capacitor electrically connected to one of a source and a drain of a third transistor including an oxide semiconductor and a gate of a third transistor including silicon; and a fourth storage capacitor electrically connected to one of a source and a drain of a fourth transistor including an oxide semiconductor and a gate of a fourth transistor including silicon.

In the above structure, the first transistor including the oxide semiconductor and the first transistor including silicon may overlap with each other. The second transistor including the oxide semiconductor and the second transistor including silicon may overlap with each other. The third transistor including the oxide semiconductor and the third transistor including silicon may overlap with each other. The fourth transistor including the oxide semiconductor and the fourth transistor including silicon may overlap with each other.

For the n-channel transistor, an oxide can be used as a semiconductor.

Further, for the p-channel transistor, an oxide can be used as a semiconductor.

For the n-channel transistor, silicon can also be used as a semiconductor.

Further, for the p-channel transistor, silicon can also be used as a semiconductor.

This specification discloses a novel logic circuit having a register function, in which charge is held in a node between a transistor including a silicon semiconductor and a transistor including an oxide semiconductor even after power is turned off so that data is stored and held.

In a novel logic circuit having a register function, which is disclosed in this specification, the number of paths from a power supply potential terminal to a reference potential terminal is small; thus, a reduction in power consumption can be achieved. Further, by turning off power in a standby period, a further reduction in power consumption can be achieved.

In a novel logic circuit having a register function, which is disclosed in this specification, a transistor including an oxide semiconductor and a transistor including a silicon semiconductor (p-channel transistor and/or n-channel transistor) can be stacked. In the case where these transistors are stacked, the area of the logic circuit can be reduced.

A conventional register circuit using only a CMOS circuit includes two clocked inverters and one inverter, in which ten transistors (five p-channel transistors and five n-channel transistors) are used. Since a NAND circuit or NOR circuit includes four transistors (two p-channel transistors and two n-channel transistors) as described above, a conventional NAND circuit or NOR circuit having a register circuit includes 14 transistors in total.

A novel logic circuit having a register function, which is disclosed in this specification, can be formed using 13 transistors (four p-channel (n-channel) transistors, five n-channel (p-channel) transistors, and four transistors including an oxide semiconductor). The number of transistors in the novel logic circuit is smaller than that in a conventional NAND circuit or NOR circuit having a register circuit by one.

One embodiment of the present invention provides a logic circuit in which a comparator comparing two output nodes, a charge holding portion, and an output-node-potential determining portion are electrically connected to each other. In such a logic circuit, data can be held even after power is turned off. Since the number of paths from a power supply potential terminal to a reference potential terminal can be reduced, power consumption of the logic circuit can be reduced. Further, a NAND circuit or NOR circuit in which the area of a logic circuit is reduced can be obtained.

BRIEF DESCRIPTION OF THE DRAWINGS

FIGS. 35A to 35C illustrate a crystal structure of an oxide material.

FIGS. 36A to 36C illustrate a crystal structure of an oxide material.

DETAILED DESCRIPTION OF THE INVENTION

Figure 1:
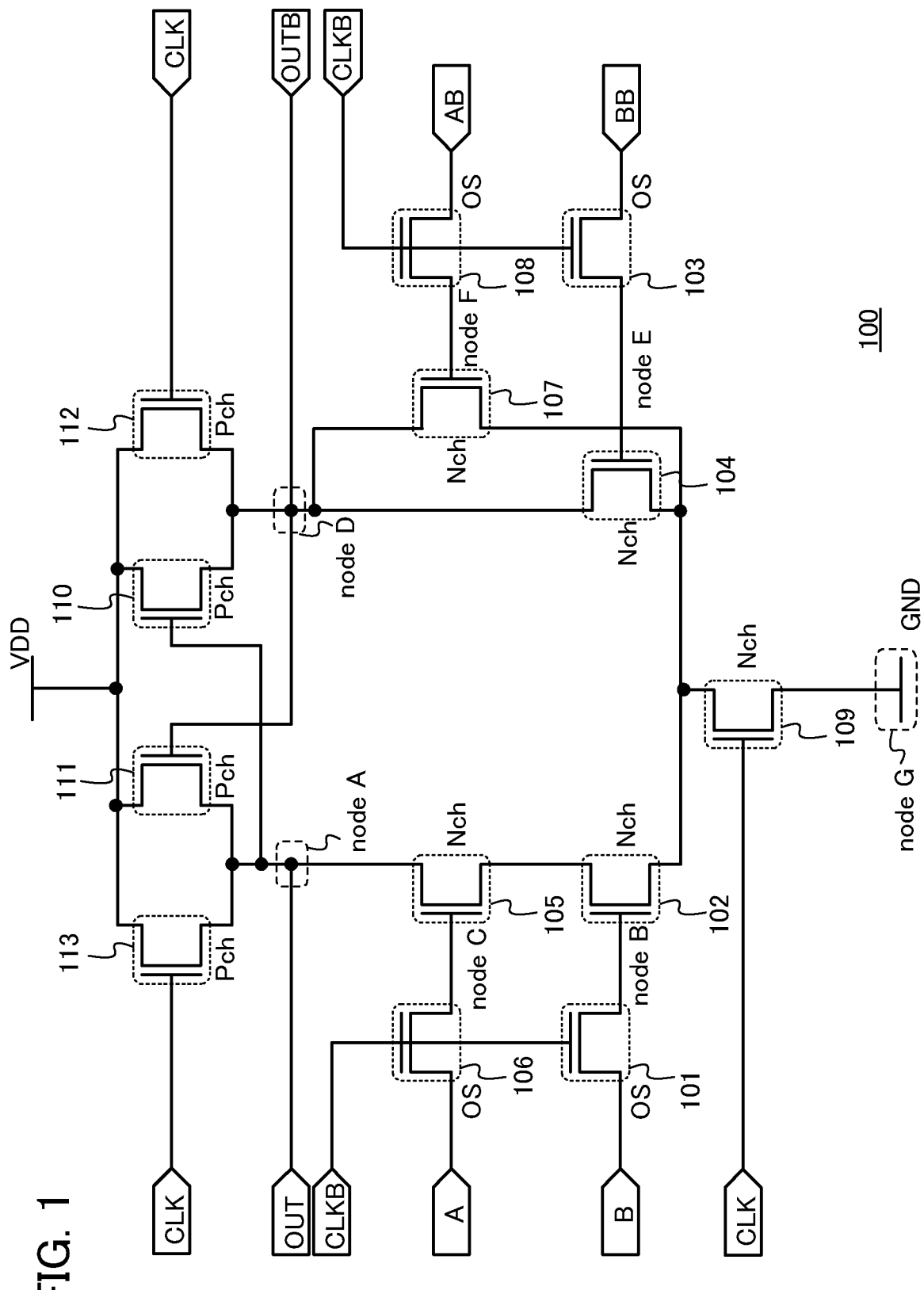
FIG. 1 illustrates a NAND circuit according to Embodiment 1.

Embodiments will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the present invention described below, the same portions or portions having similar functions are denoted by the same reference numerals in different drawings, and explanation thereof will not be repeated.

Embodiment 1

In this embodiment, a NAND circuit which has a data holding function and whose power consumption is reduced will be described with reference to FIG. 1, FIGS. 2A to 2C, FIG. 3, FIG. 4, FIG. 5, FIG. 6, FIG. 7, and FIG. 8.

<Structure of NAND Circuit 100>

FIG. 1 is a circuit diagram of a NAND circuit of this embodiment. A NAND circuit 100 illustrated in FIG. 1 includes a 1st transistor 101, a 2nd transistor 102, a 3rd transistor 103, a 4th transistor 104, a 5th transistor 105, a 6th transistor 106, a 7th transistor 107, an 8th transistor 108, a 9th transistor 109, a 10th transistor 110, an 11th transistor 111, a 12th transistor 112, and a 13th transistor 113.

N-channel transistors are used as the following five transistors: the 2nd transistor 102, the 4th transistor 104, the 5th transistor 105, the 7th transistor 107, and the 9th transistor 109. P-channel transistors are used as the following four transistors: the 10th transistor 110, the 11th transistor 111, the 12th transistor 112, and the 13th transistor 113.

Transistors in which channels are formed in oxide semiconductor layers are used as the following four transistors: the 1st transistor 101, the 3rd transistor 103, the 6th transistor 106, and the 8th transistor 108. Note that the transistor including an oxide semiconductor is an n-channel transistor.

The transistor including an oxide semiconductor has an advantage of extremely small leakage current (also referred to as off-state current). For example, an advantage which is obtained because of the extremely small leakage current of the transistor is that a data holding function per unit area in the logic circuit is improved. In general, data holding time is proportional to leakage current. For example, in the case where the leakage current is $1.0 \times 10^{-24}$ A, the data holding time is ten years, and in the case where the leakage current is $1.0 \times 10^{-21}$ A, the data holding time is three days to four days. When leakage current is changed by one digit, the data holding time is largely changed, which has great influence on the whole logic circuit. It is preferable that optimal transistors be selected in accordance with needed characteristics.

In the case of an n-channel transistor including an oxide semiconductor, the leakage current can be less than or equal to 100 yA/μm ($1.0 \times 10^{-22}$ A), preferably less than or equal to 10 yA/μm ($1.0 \times 10^{-23}$ A), more preferably less than or equal to 1 yA/μm ($1.0 \times 10^{-24}$ A). Note that the absolute value of a drain voltage is preferably equal to that of a gate voltage at the time of measurement. The leakage current of the transistor including an oxide semiconductor is kept extremely small even when the gate voltage becomes less than or equal to −3 V. On the other hand, in the case of an n-channel transistor including a silicon semiconductor, the leakage current is approximately 10 pA/μm ($1.0 \times 10^{-11}$ A), and when the gate voltage becomes less than or equal to −3 V, the leakage current is rapidly increased. Further, the leakage current also depends on the temperature of the transistor at the time of measurement. The higher the temperature is, the larger the leakage current becomes.

Transistors in which channels are formed in silicon layers are used as the following nine transistors: the 2nd transistor 102, the 4th transistor 104, the 5th transistor 105, the 7th transistor 107, the 9th transistor 109, the 10th transistor 110, the 11th transistor 111, the 12th transistor 112, and the 13th transistor 113. The silicon layers may be each a single crystal silicon layer, a microcrystalline silicon layer, or an amorphous silicon layer.

Note that all or some of the five transistors, the 2nd transistor 102, the 4th transistor 104, the 5th transistor 105, the 7th transistor 107, and the 9th transistor 109, may be replaced with transistors including an oxide semiconductor. However, a transistor including an oxide semiconductor has a slower operation speed than a transistor including a silicon semiconductor while having extremely small off-state current. Therefore, when these transistors are replaced with transistors including an oxide semiconductor, influence on the operation speed of the NAND circuit 100 needs to be taken into consideration.

An input signal A of two signals which are input to the NAND circuit 100 is input to one of a source and a drain of the 6th transistor 106. An input signal B is input to one of a source and a drain of the 1st transistor 101. A signal AB whose phase is the inverse of that of the input signal A is input to one of a source and a drain of the 8th transistor 108. A signal BB whose phase is the inverse of that of the input signal B is input to one of a source and a drain of the 3rd transistor 103.

A gate of the 1st transistor 101 is electrically connected to a gate of the 6th transistor 106. The other of the source and the drain of the 1st transistor 101 is electrically connected to a gate of the 2nd transistor 102. Note that a point where the other of the source and the drain of the 1st transistor 101 and the gate of the 2nd transistor 102 are connected to each other is referred to as a node B. One of a source and a drain of the 2nd transistor 102 is electrically connected to one of a source and a drain of the 5th transistor 105, and the other thereof is electrically connected to one of a source and a drain of the 9th transistor 109, one of a source and a drain of the 4th transistor 104, and one of a source and a drain of the 7th transistor 107.

A gate of the 3rd transistor 103 is electrically connected to a gate of the 8th transistor 108. The other of the source and the drain of the 3rd transistor 103 is electrically connected to a gate of the 4th transistor 104. Note that a point where the other of the source and the drain of the 3rd transistor 103 and the gate of the 4th transistor 104 are connected to each other is referred to as a node E. The other of the source and the drain of the 4th transistor 104 is electrically connected to the other of the source and the drain of the 7th transistor 107, one of a source and a drain of the 10th transistor 110, one of a source and a drain of the 12th transistor 112, and a gate of the 11th transistor 111. Note that a point where the other of the source and the drain of the 4th transistor 104, the other of the source and the drain of the 7th transistor 107, the one of the source and the drain of the 10th transistor 110, the one of the source and the drain of the 12th transistor 112, and the gate of the 11th transistor 111 are connected to each other is referred to as a node D.

A gate of the 5th transistor 105 is electrically connected to the other of the source and the drain of the 6th transistor 106. Note that a point where the gate of the 5th transistor 105 and the other of the source and the drain of the 6th transistor 106 are connected to each other is referred to as a node C. The other of the source and the drain of the 5th transistor 105 is electrically connected to a gate of the 10th transistor 110, one of a source and a drain of the 11th transistor 111, and one of a source and a drain of the 13th transistor 113. Note that a point where the other of the source and the drain of the 5th transistor 105, the gate of the 10th transistor 110, the one of the source and the drain of the 11th transistor 111, and the one of the source and the drain of the 13th transistor 113 are connected to each other is referred to as a node A.

A signal CLKB whose phase is the inverse of that of a clock signal CLK is input to the gate of the 6th transistor 106. A gate of the 7th transistor 107 is electrically connected to the other of the source and the drain of the 8th transistor 108. Note that a point where the gate of the 7th transistor 107 and the other of the source and the drain of the 8th transistor 108 are connected to each other is referred to as a node F. The clock signal CLKB whose phase is the inverse of that of the clock signal CLK is input to the gate of the 8th transistor 108. The clock signal CLK is input to a gate of the 9th transistor 109, and the other of the source and the drain of the 9th transistor 109 is electrically connected to a ground potential GND terminal. Note that a point where the other of the source and the drain of the 9th transistor 109 and the ground potential GND terminal are connected to each other is referred to as a node G.

The other of the source and the drain of the 10th transistor 110, the other of the source and the drain of the 11th transistor 111, the other of the source and the drain of the 12th transistor 112, and the other of the source and the drain of the 13th transistor 113 are electrically connected to each other, and a power supply potential VDD is supplied to a node where they are connected to each other. The clock signal CLK is input to a gate of the 12th transistor 112, and the clock signal CLK is input to a gate of the 13th transistor 113.

The potential of the node A is output as an output signal OUT of the NAND circuit 100. The potential of the node D is output as a signal OUTB whose phase is the inverse of that of the output signal OUT of the NAND circuit 100.

In the NAND circuit 100 of this embodiment, when the gates of the transistors including an oxide semiconductor are closed, there is only one path of leakage current, which goes from a power supply potential VDD terminal to the ground potential GND terminal Consequently, the power consumption of the NAND circuit 100 can be reduced.

Figure 2A:
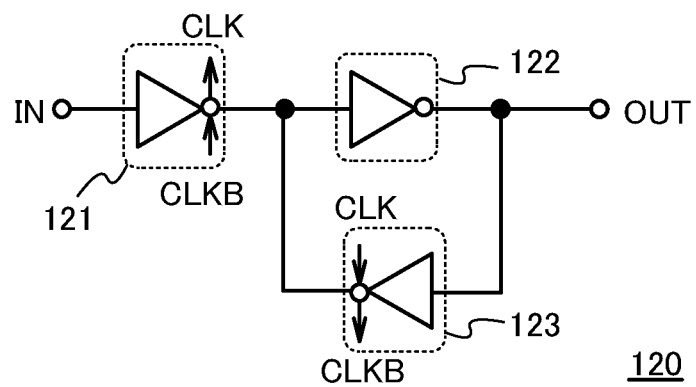
FIGS. 2A to 2C are circuit diagrams of a latch circuit, an inverter, and a clocked inverter.
Figure 2B:
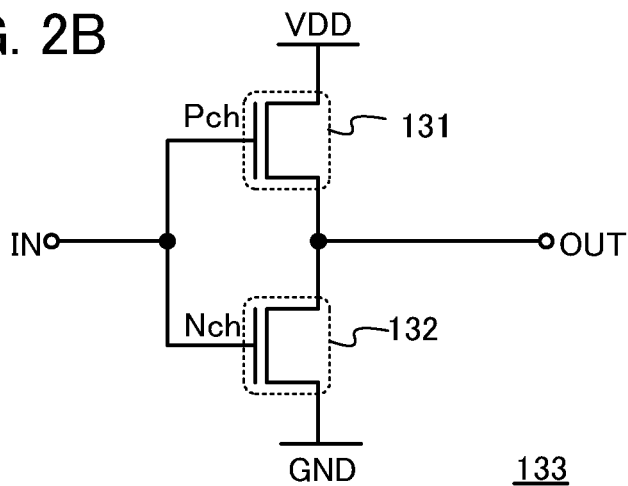
Figure 2C:
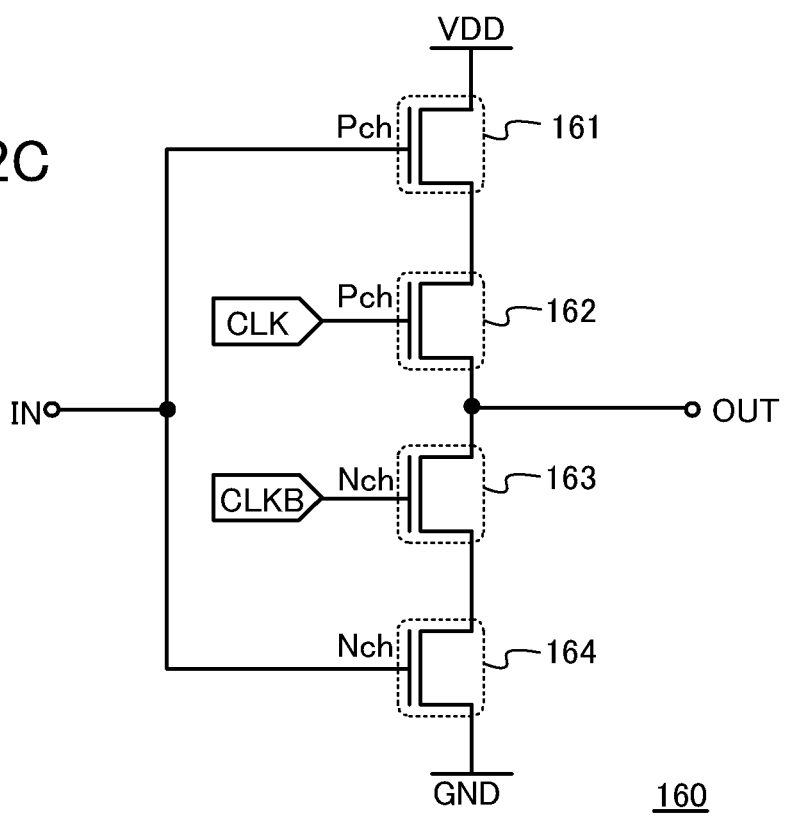

FIGS. 2A to 2C illustrate a conventional latch circuit as a comparative example. A latch circuit 120 illustrated in FIG. 2A includes a clocked inverter 121, an inverter 122, and a clocked inverter 123.

An input terminal of the clocked inverter 121 functions as an input terminal IN of the latch circuit 120.

An output terminal of the clocked inverter 121 is electrically connected to an input terminal of the inverter 122 and an output terminal of the clocked inverter 123.

An output terminal of the inverter 122 is electrically connected to an input terminal of the clocked inverter 123 and functions as an output terminal OUT of the latch circuit 120.

FIG. 2B illustrates a circuit configuration applicable to the inverter 122.

An inverter 133 illustrated in FIG. 2B includes a transistor 131 that is a p-channel transistor and a transistor 132 that is an n-channel transistor.

A gate of the transistor 131 is electrically connected to a gate of the transistor 132 in the inverter 133, and functions as an input terminal IN of the inverter 133. One of a source and a drain of the transistor 131 is supplied with a power supply potential VDD. The other of the source and the drain of the transistor 131 is electrically connected to one of a source and a drain of the transistor 132 and functions as an output terminal OUT of the inverter 133.

The other of the source and the drain of the transistor 132 is electrically connected to a ground potential GND terminal.

FIG. 2C illustrates a circuit configuration applicable to each of the clocked inverter 121 and the clocked inverter 123.

A clocked inverter 160 illustrated in FIG. 2C includes a transistor 161 that is a p-channel transistor, a transistor 162 that is a p-channel transistor, a transistor 163 that is an n-channel transistor, and a transistor 164 that is an n-channel transistor.

A gate of the transistor 161 is electrically connected to a gate of the transistor 164 and functions as an input terminal IN of the clocked inverter 160. One of a source and a drain of the transistor 161 is supplied with a power supply potential VDD. The other of the source and the drain of the transistor 161 is electrically connected to one of a source and a drain of the transistor 162.

A clock signal CLK is input to a gate of the transistor 162. The other of the source and the drain of the transistor 162 is electrically connected to one of a source and a drain of the transistor 163, and functions as an output terminal OUT of the clocked inverter 160.

A signal CLKB whose phase is the inverse of that of the clock signal CLK is input to a gate of the transistor 163. The other of the source and the drain of the transistor 163 is electrically connected to one of a source and a drain of the transistor 164.

The other of the source and the drain of the transistor 164 is electrically connected to a ground potential GND terminal.

Figure 3:
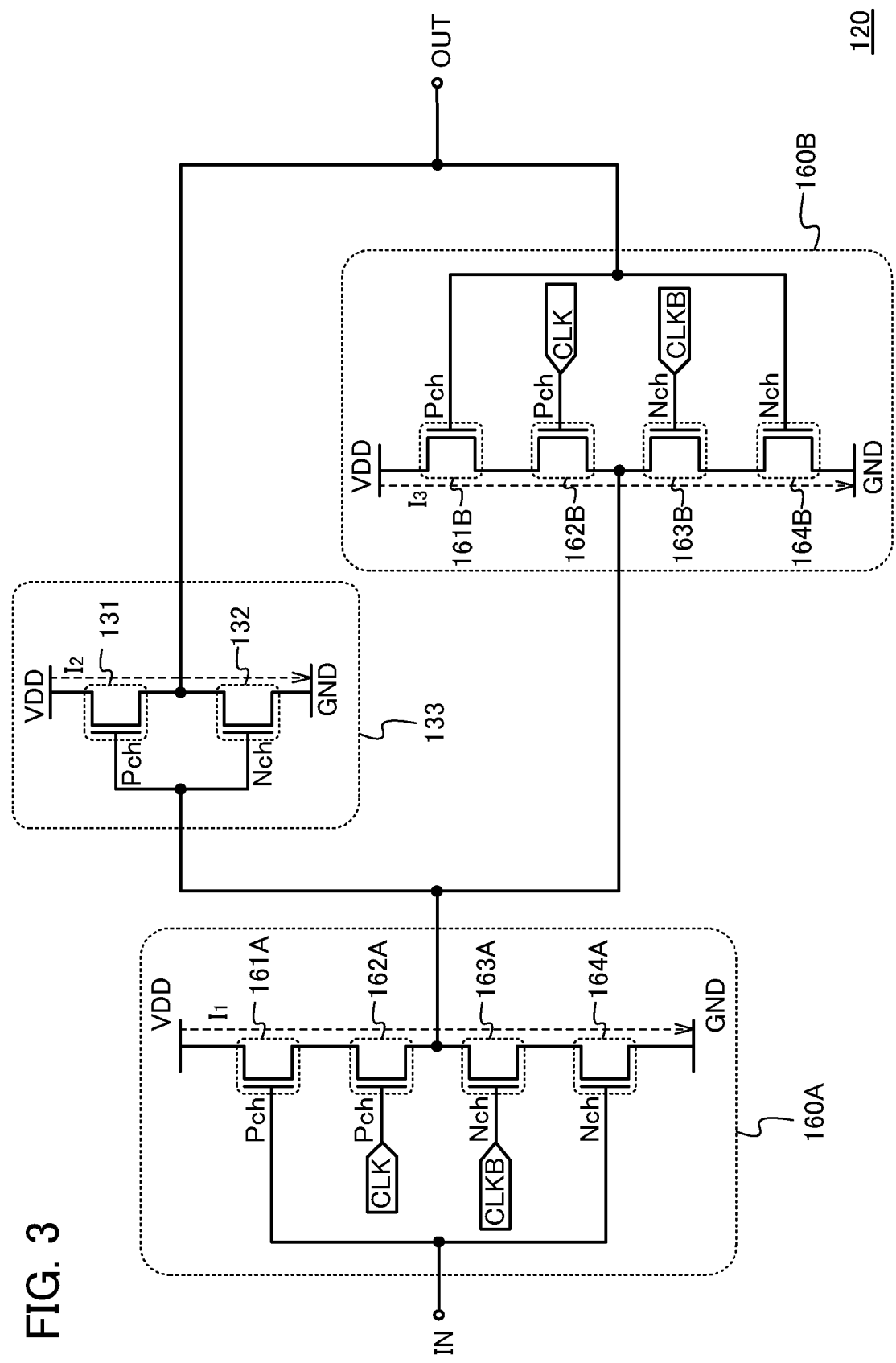
FIG. 3 is a circuit diagram of a latch circuit.

FIG. 3 illustrates a specific circuit configuration of the latch circuit 120 including the inverter 133, a clocked inverter 160A, and a clocked inverter 160B. Note that the clocked inverter 160A and the clocked inverter 160B are each similar to the clocked inverter 160. Further, transistors in the clocked inverter 160A and transistors in the clocked inverter 160B are similar to those in the clocked inverter 160 and additionally denoted by "A" and "B", respectively, in FIG. 3.

As illustrated in FIG. 3, there are three paths of leakage current which go from a power supply potential VDD terminal to a ground potential GND terminal (paths I1 to I3) in the latch circuit 120. Accordingly, the power consumption of the latch circuit 120 might be increased.

As described above, the NAND circuit 100 of this embodiment has the one path of leakage current, which goes from the power supply potential VDD terminal to the ground potential GND terminal. Therefore, the power consumption of the NAND circuit 100 of this embodiment can be reduced.

The NAND circuit 100 of this embodiment includes the four transistors including an oxide semiconductor and the nine transistors including a silicon semiconductor.

As described above, the leakage current of the transistor including an oxide semiconductor is extremely small. Therefore, even when supply of the power supply potential VDD to the NAND circuit 100 is stopped, charge accumulated between the gate of the 2nd transistor 102 and the other of the source and the drain of the 1st transistor 101 that is the transistor including an oxide semiconductor (i.e., in the node B) is held, for example. Accordingly, in response to restart of the supply of the power supply potential VDD, the NAND circuit 100 can start its operation from the state before the stop of the supply of the power supply potential VDD.

In this manner, the NAND circuit 100 does not lose data even when the supply of the power supply potential VDD is stopped. In other words, the NAND circuit 100 of this embodiment is a nonvolatile memory circuit. Therefore, it is possible to stop the supply of the power supply potential VDD when the gates of the transistors including an oxide semiconductor are closed in the NAND circuit 100. Therefore, the power consumption of the nonvolatile NAND circuit 100 can be reduced.

Further, in the NAND circuit 100 of this embodiment, the transistor including an oxide semiconductor and the transistor including a silicon semiconductor can be stacked (which is described later). Therefore, it is possible to reduce the area of the NAND circuit 100.

<Operation of NAND Circuit 100>

Figure 4:
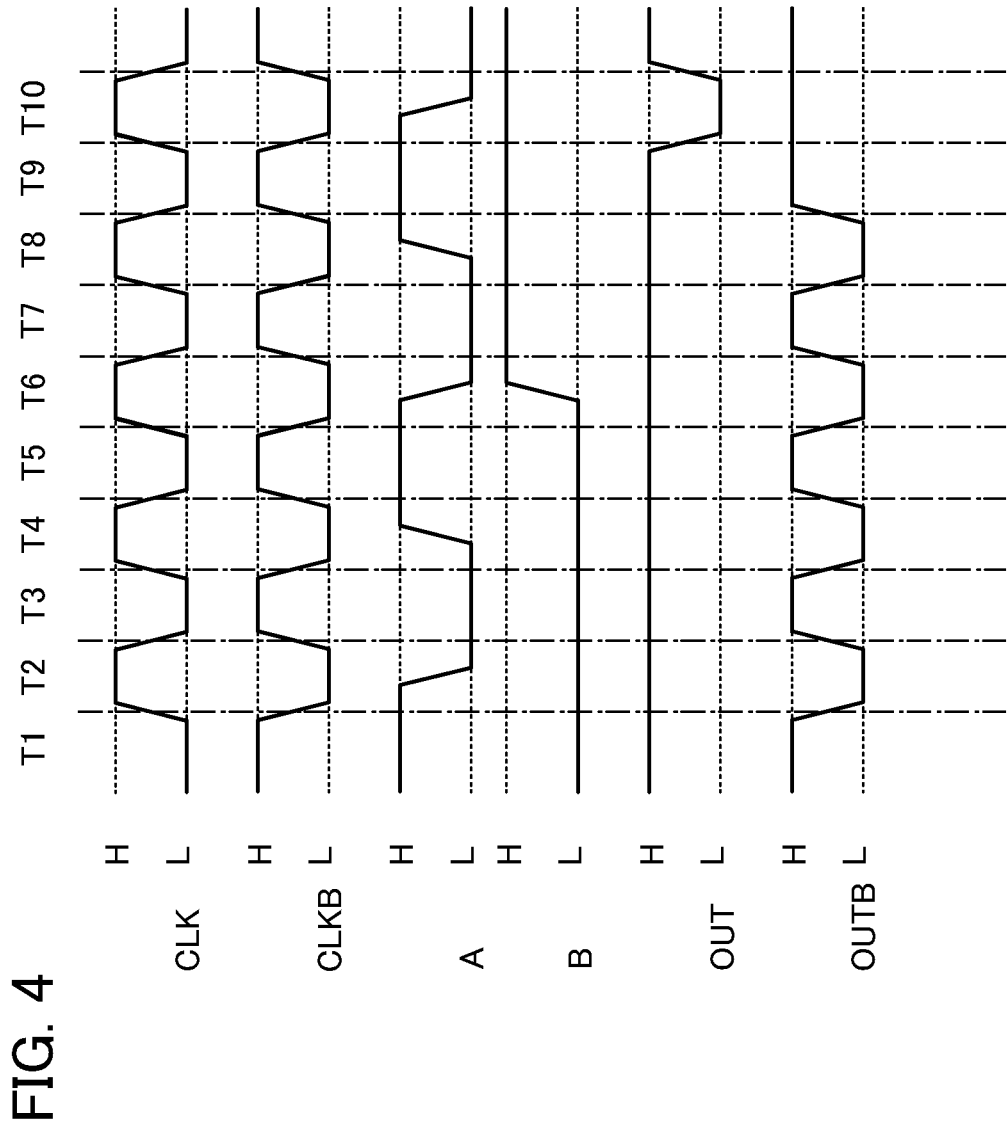
FIG. 4 is a timing chart of a NAND circuit according to Embodiment 1.
Figure 5:
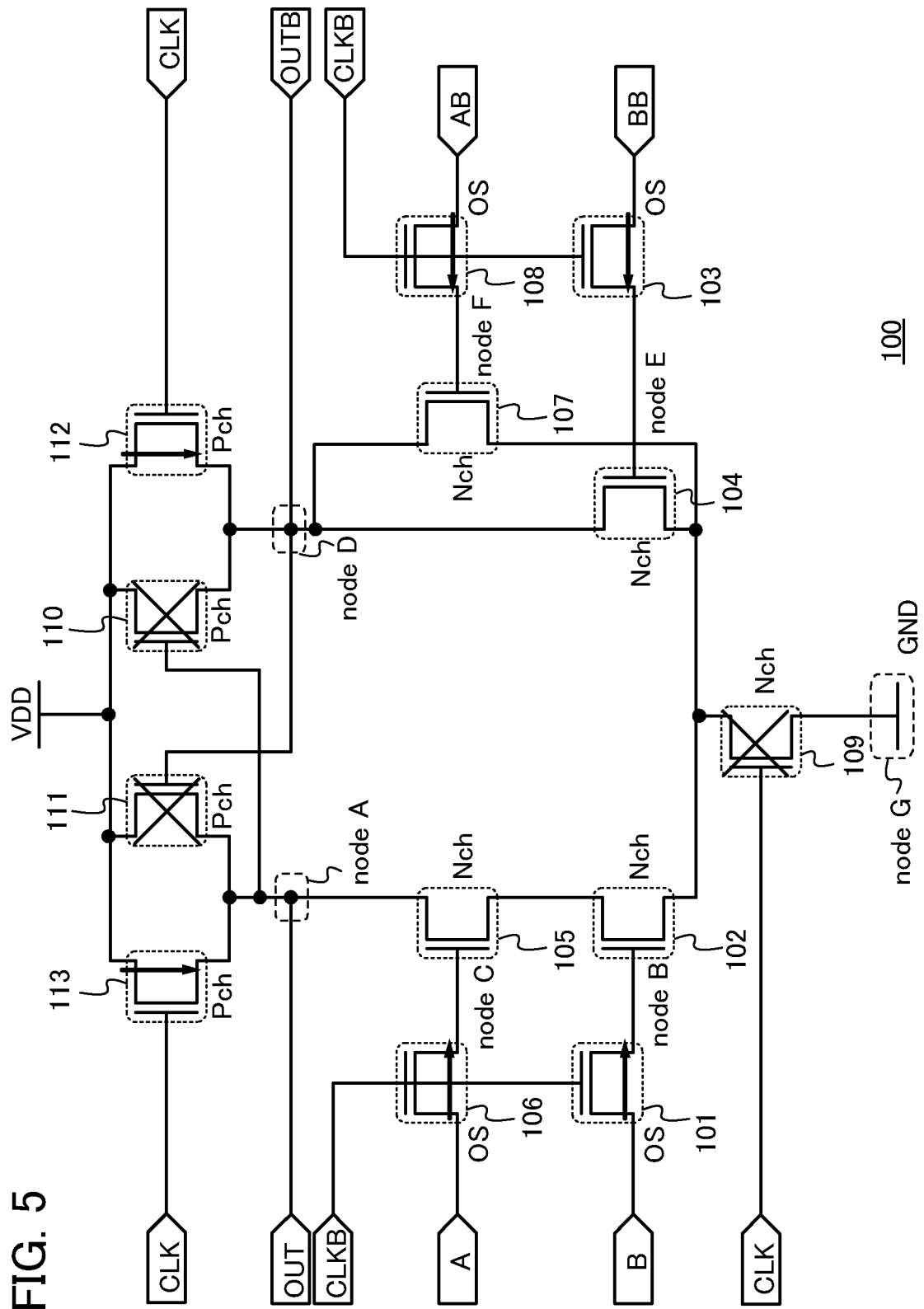
FIG. 5 illustrates operation of a NAND circuit according to Embodiment 1.
Figure 6:
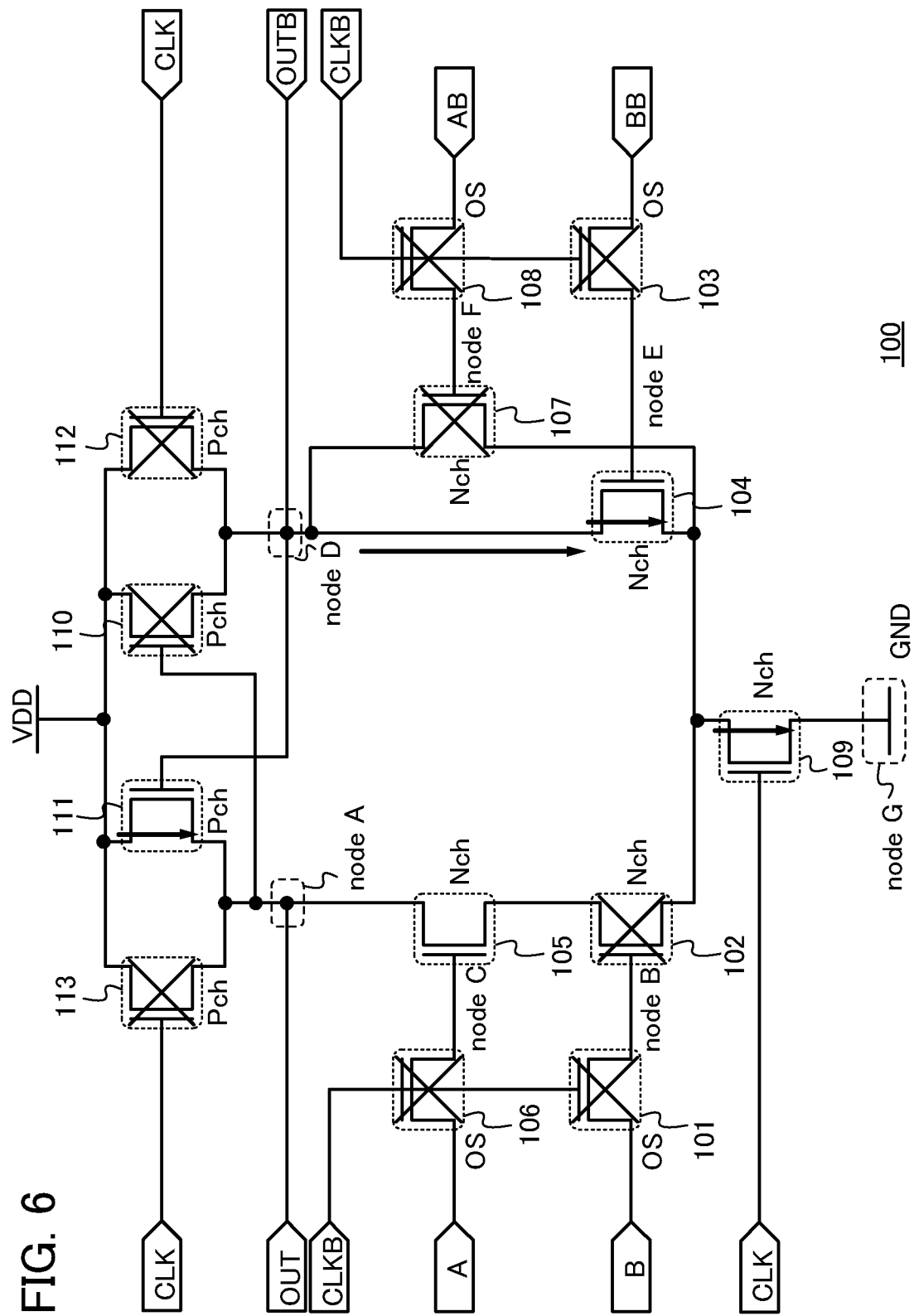
FIG. 6 illustrates operation of a NAND circuit according to Embodiment 1.
Figure 7:
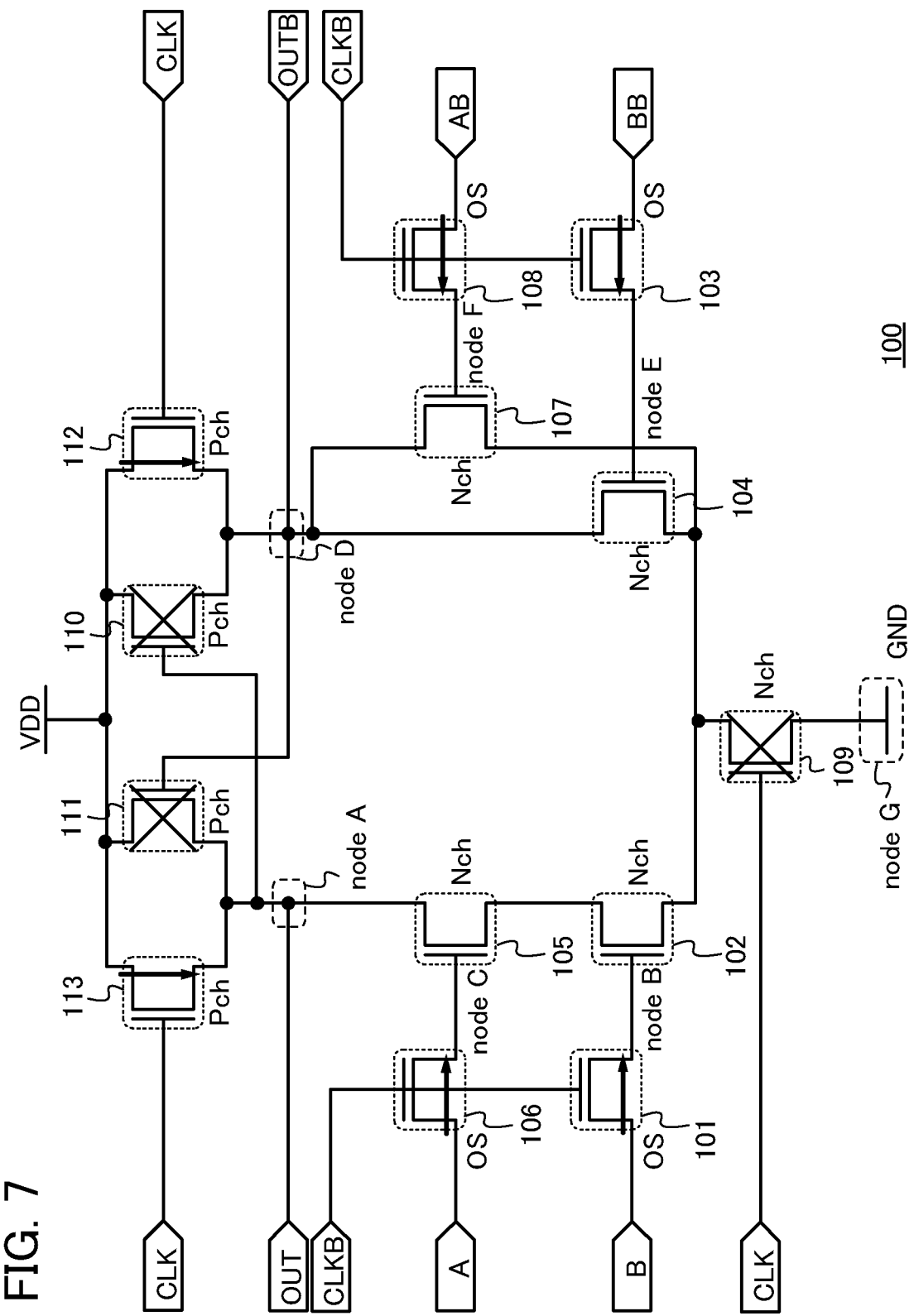
FIG. 7 illustrates operation of a NAND circuit according to Embodiment 1.
Figure 8:
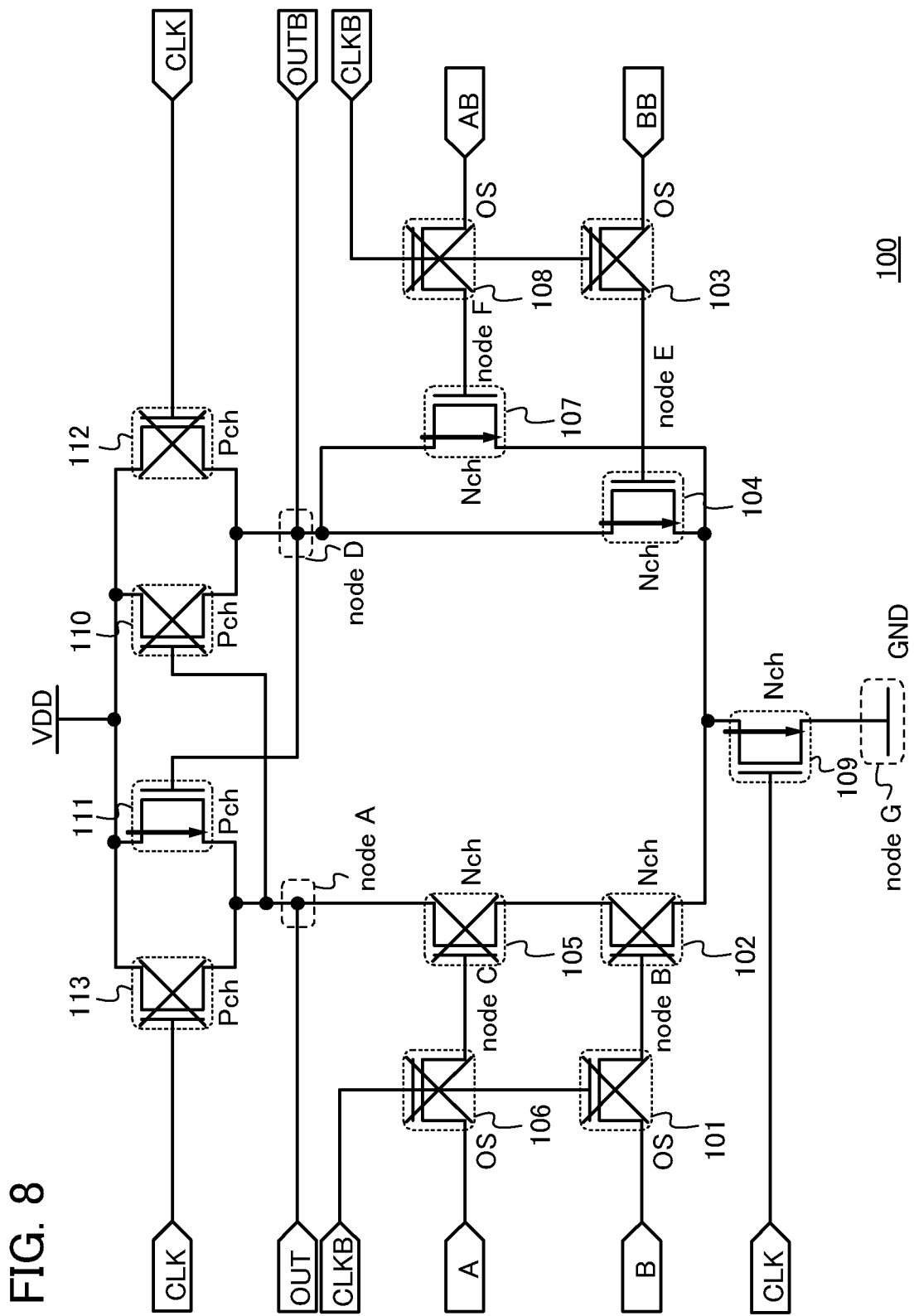
FIG. 8 illustrates operation of a NAND circuit according to Embodiment 1.

The operation of the NAND circuit 100 of this embodiment is described with reference to FIG. 4, FIG. 5, FIG. 6, FIG. 7, and FIG. 8. FIG. 4 shows a timing chart of the NAND circuit 100. In the timing chart in FIG. 4, a period T1, a period T2, a period T3, a period T4, a period T5, a period T6, a period T7, a period T8, a period T9, and a period T10 are separately illustrated. FIG. 5, FIG. 6, FIG. 7, and FIG. 8 show operation states of the NAND circuit 100 in the period T1, the period T2, the period T3, and the period T4, respectively.

The NAND circuit 100 is a clock synchronization circuit and functions as a NAND circuit when the same clock signal CLK is input to the 9th transistor 109, the 12th transistor 112, and the 13th transistor 113. Note that the output signal OUT is determined only in the period T2, the period T4, the period T6, the period T8, and the period T10, in which the 9th transistor 109 is on in synchronization with the clock signal CLK.

<Period T1 (see FIG. 5)>

First, as shown in the period T1 in FIG. 4, a case where the input signal A and the input signal B have the H potential (VDD) and L potential (VSS), respectively, is given. At this time, the clock signal CLK has the L potential (VSS), and thus the L potential (VSS) is applied to the gate of the 12th transistor 112 and the gate of the 13th transistor 113. Accordingly, the 12th (p-channel) transistor 112 and the 13th (p-channel) transistor 113 are turned on. At this time, the H potential (VDD) flows into the node A and the node D (precharge operation). The 12th transistor 112 and the 13th transistor 113 are provided to control whether the node A and the node D are charged with the H potential (VDD).

The signal CLKB whose phase is the inverse of that of the clock signal CLK has the H potential (VDD), and thus, the 1st transistor 101 and the 6th transistor 106 are turned on. Accordingly, the gate of the 2nd transistor 102 (the node B) is charged with the L potential (VSS) that is equivalent to that of the input signal B, and the gate of the 5th transistor 105 (the node C) is charged with the H potential (VDD) that is equivalent to that of the input signal A.

Further, since the signal CLKB whose phase is the inverse of that of the clock signal CLK has the H potential (VDD), the 3rd transistor 103 and the 8th transistor 108 are turned on. Accordingly, the gate of the 4th transistor 104 (the node E) is charged with the H potential (VDD) that is equivalent to that of the signal BB whose phase is the inverse of that of the input signal B, and the gate of the 7th transistor 107 (the node F) is charged with the L potential (VSS) that is equivalent to that of the signal AB whose phase is the inverse of that of the input signal A.

As described above, in the period T1, the node B, the node C, the node E, and the node F are charged with the potentials corresponding to the input signal A and the potentials corresponding to the input signal B, and the node A and the node D are charged with the H potential (VDD).

<Period T2 (see FIG. 6)>

Next, as shown in the period T2 in FIG. 4, the clock signal CLK has the H potential (VDD), and thus the H potential (VDD) is applied to the gate of the 12th transistor 112, the gate of the 13th transistor 113, and the gate of the 9th transistor 109. At this time, the 12th (p-channel) transistor 112 and the 13th (p-channel) transistor 113 are turned off. Since the 13th transistor 113 is turned off, the H potential (VDD) is not supplied to the node A. Therefore, the node A keeps the H potential (VDD). In addition, since the 12th transistor 112 is turned off, the H potential (VDD) is not supplied to the node D. Therefore, the node D keeps the H potential (VDD).

The 9th (n-channel) transistor 109 is turned on.

On the other hand, the signal CLKB whose phase is the inverse of that of the clock signal CLK has the L potential (VSS), and thus the 1st (n-channel) transistor 101 and the 6th (n-channel) transistor 106 are turned off. Since charge corresponding to the L potential (VSS) is accumulated in the node B, when the 1st transistor 101 is off, the charge corresponding to the L potential (VSS) is held in the node B (charge holding operation). Further, the 2nd transistor 102 is turned off in response to the potential of the node B. Since charge corresponding to the H potential (VDD) is accumulated in the node C, when the 6th transistor 106 is off, the charge corresponding to the H potential (VDD) is held in the node C (charge holding operation). Further, the 5th transistor 105 is turned on in response to the potential of the node C.

In a similar manner, since the signal CLKB whose phase is the inverse of that of the clock signal CLK has the L potential (VSS), the 3rd (n-channel) transistor 103 and the 8th (n-channel) transistor 108 are turned off. Since charge corresponding to the H potential (VDD) is accumulated in the node E, when the 3rd transistor 103 is off, the charge corresponding to the H potential (VDD) is held in the node E (charge holding operation). Further, the 4th transistor 104 is turned on in response to the potential of the node E. Since charge corresponding to the L potential (VSS) is accumulated in the node F, when the 8th transistor 108 is off, the charge corresponding to the L potential (VSS) is held in the node F (charge holding operation). Further, the 8th transistor 108 is turned off in response to the potential of the node F.

At this time, since the 4th transistor 104 and the 7th transistor 107 are electrically connected to each other in parallel, a current path from the node D to the node G is formed even when the 7th transistor 107 is off. Therefore, charge corresponding to the H potential (VDD), which is accumulated in the node D, is extracted to the reference potential (GND) of the node G through the on-state 4th transistor 104 and the on-state 9th transistor 109. That is, current flows from the node D to the node G. Since the 2nd transistor 102 and the 5th transistor 105 are electrically connected to each other in series, a current path from the node A to the node G is not formed.

Since current flows from the node D to the node G, the potential of the node D is gradually reduced from the H potential (VDD) to the L potential (VSS). As a result, the L potential (VSS) is applied to the gate of the 11th transistor 111, so that the 11th transistor (p-channel) 111 is turned on. At this time, the potential of the node A is determined, and the output signal OUT has the H potential (VDD).

The 10th transistor 110 and the 11th transistor 111 have functions of compensating the potentials of the node A and the node D. "Compensating the potentials of the node A and the node D" means that, for example, when the node D has the L potential (VSS), the 11th transistor 111 supplies the H potential (VDD) to the node A. For example, when the node A has the L potential (VSS), the 10th transistor 110 supplies the H potential (VDD) to the node D. That is, when one of the node A and the node D has the L potential (VSS), the H potential (VDD) is supplied to the other of the node A and the node D.

Note that the potential of the node A and the potential of the node D depend on the on state and the off state of the 9th transistor 109. In other words, the potential of the output signal OUT is determined only when the clock signal CLK has the H potential (VDD). Accordingly, the potential of the output signal OUT of the NAND circuit 100 is determined in the period T2, the period T4, the period T6, the period T8, and the period T10 in the timing chart of FIG. 4.

In this manner, in the period T2, the output signal OUT having the H potential (VDD) is determined in response to the input of the input signal A having the H potential (VDD) and the input of the input signal B having the L potential (VSS).

As described above, the 10th transistor 110 and the 11th transistor 111 each have a function of compensating a potential, and the 12th transistor 112 and the 13th transistor 113 each have charging function. Accordingly, these four transistors have a function as a comparator which continuously compares the potential of the node A with the potential of the node D and supplies the H potential (VDD) to the node opposite to the node having the L potential (VSS).

In addition, the 9th transistor 109 has discharging function. The potential of the node A or the potential of the node D is extracted to the reference potential (GND) of the node G through the on-state 9th transistor 109. As a result, only when the 9th transistor 109 is on (the clock signal CLK has the H potential (VDD)), the potential of the output signal OUT is determined. Therefore, the 9th transistor 109 also has a function of determining a definitive potential of the output signal OUT (a function of determining a potential).

<Period T3 (see FIG. 7)>

Next, as shown in the period T3 in FIG. 4, a case where the input signal A and the input signal B have the L potential (VSS) is given. At this time, the clock signal CLK has the L potential (VSS), and thus the L potential (VSS) is applied to the gate of the 12th transistor 112 and the gate of the 13th transistor 113. Accordingly, the 12th (p-channel) transistor 112 and the 13th (p-channel) transistor 113 are turned on. At this time, the H potential (VDD) flows into the node A and the node D (precharge operation).

The signal CLKB whose phase is the inverse of that of the clock signal CLK has the H potential (VDD), and thus, the 1st transistor 101 and the 6th transistor 106 are turned on. Accordingly, the gate of the 2nd transistor 102 (the node B) is charged with the L potential (VSS) that is equivalent to that of the input signal B, and the gate of the 5th transistor 105 (the node C) is charged with the L potential (VSS) that is equivalent to that of the input signal A.

Further, since the signal CLKB whose phase is the inverse of that of the clock signal CLK has the H potential (VDD), the 3rd transistor 103 and the 8th transistor 108 are turned on. Accordingly, the gate of the 4th transistor 104 (the node E) is charged with the H potential (VDD) that is equivalent to that of the signal BB whose phase is the inverse of that of the input signal B, and the gate of the 7th transistor 107 (the node F) is charged with the H potential (VDD) that is equivalent to that of the signal AB whose phase is the inverse of that of the input signal A.

As described above, in the period T3, the node B, the node C, the node E, and the node F are charged with the potentials corresponding to the input signal A and the potentials corresponding to the input signal B, and the node A and the node D are charged with the H potential (VDD).

<Period T4 (see FIG. 8)>

Next, as shown in the period T4 in FIG. 4, the clock signal CLK has the H potential (VDD), and thus the H potential (VDD) is applied to the gate of the 12th transistor 112, the gate of the 13th transistor 113, and the gate of the 9th transistor 109. At this time, the 12th (p-channel) transistor 112 and the 13th (p-channel) transistor 113 are turned off. Since the 13th transistor 113 is turned off, the H potential (VDD) is not supplied to the node A. Therefore, the node A keeps the H potential (VDD). In addition, since the 12th transistor 112 is turned off, the H potential (VDD) is not supplied to the node D. Therefore, the node D keeps the H potential (VDD).

The 9th (n-channel) transistor 109 is turned on.

On the other hand, the signal CLKB whose phase is the inverse of that of the clock signal CLK has the L potential (VSS), and thus the 1st (n-channel) transistor 101 and the 6th (n-channel) transistor 106 are turned off. Since charge corresponding to the L potential (VSS) is accumulated in the node B, when the 1st transistor 101 is off, the charge corresponding to the L potential (VSS) is held in the node B (charge holding operation). Further, the 2nd transistor 102 is turned off in response to the potential of the node B. Since charge corresponding to the L potential (VSS) is accumulated in the node C, when the 6th transistor 106 is off, the charge corresponding to the L potential (VSS) is held in the node C (charge holding operation). Further, the 5th transistor 105 is turned off in response to the potential of the node C.

In a similar manner, since the signal CLKB whose phase is the inverse of that of the clock signal CLK has the L potential (VSS), the 3rd (n-channel) transistor 103 and the 8th (n-channel) transistor 108 are turned off. Since charge corresponding to the H potential (VDD) is accumulated in the node E, when the 3rd transistor 103 is off, the charge corresponding to the H potential (VDD) is held in the node E (charge holding operation). Further, the 4th transistor 104 is turned on in response to the potential of the node E. Since charge corresponding to the H potential (VDD) is accumulated in the node F, when the 8th transistor 108 is off, the charge corresponding to the H potential (VDD) is held in the node F (charge holding operation). Further, the 8th transistor 108 is turned on in response to the potential of the node F.

At this time, since the 4th transistor 104 and the 7th transistor 107 are electrically connected to each other in parallel, a current path from the node D to the node G is formed. Therefore, charge corresponding to the H potential (VDD), which is accumulated in the node D, is extracted to the reference potential (GND) of the node G through the on-state 4th transistor 104 and the on-state 9th transistor 109. That is, current flows from the node D to the node G.

Since current flows from the node D to the node G, the potential of the node D is gradually reduced from the H potential (VDD) to the L potential (VSS). As a result, the L potential (VSS) is applied to the gate of the 11th transistor 111, so that the 11th (p-channel) transistor 111 is turned on. At this time, the potential of the node A is determined, and the output signal OUT has the H potential (VDD).

In this manner, in the period T4, the output signal OUT having the H potential (VDD) is determined in response to the input of the input signal A having the L potential (VSS) and the input of the input signal B having the L potential (VSS).

The 5th transistor 105 whose gate corresponds to the node C having a potential corresponding to the input signal A and the 2nd transistor 102 whose gate corresponds to the node B having a potential corresponding to the input signal B are electrically connected to each other in series. Therefore, when the L potential (VSS) is input as either of the input signals, a current path from the node A to the node G is not formed; the current path is formed only when the H potential (VDD) is input as both of the input signals. On the other hand, the 4th transistor 104 and the 7th transistor 107 are electrically connected to each other in parallel. Therefore, when the L potential (VSS) is input as either of the input signals, a current path from the node A to the node G is formed.

In other words, when the L potential (VSS) is input to either of the input signals, the potential of the node D is always the L potential (VSS). Since a potential which is opposite to the potential of the node D is supplied to the node A, the potential of the output signal OUT is always the H potential (VDD) at this time. When the H potential (VDD) is input as both of the input signals, the potential of the node A is always the L potential (VSS), and the potential of the output signal OUT is always the L potential (VSS) at this time. The NAND circuit is configured to operate in this manner.

Operations in the period T5 and the period T6 are similar to those in the period T1 and the period T2. Operations in the period T7 and the period T8 correspond to those in the period T1 and the period T2 in the case where the L potential (VSS) and the H potential (VDD) are input as the input signal A and the input signal B, respectively. Operations in the period T9 and the period T10 correspond to those in the period T3 and the period T4 in the case where the H potential (VDD) is input as the input signal A and the input signal B.

According to this embodiment, increase in the number of paths of leakage current in the NAND circuit can be suppressed. Accordingly, the power consumption of the NAND circuit can be reduced.

According to this embodiment, the NAND circuit can hold data even when power supply is stopped.

According to this embodiment, it is possible to stack the transistor including an oxide semiconductor and the transistor including a silicon semiconductor in the NAND circuit; therefore, the area of the circuit can be reduced.

This embodiment can be implemented in combination with any of the other embodiments in this specification as appropriate.

Embodiment 2

In this embodiment, another structure of a NAND circuit which has a data holding function and whose power consumption is reduced will be described with reference to FIG. 9, FIG. 10, FIG. 11, FIG. 12, FIG. 13, and FIG. 14.

<Structure of NAND Circuit 200>

Figure 9:
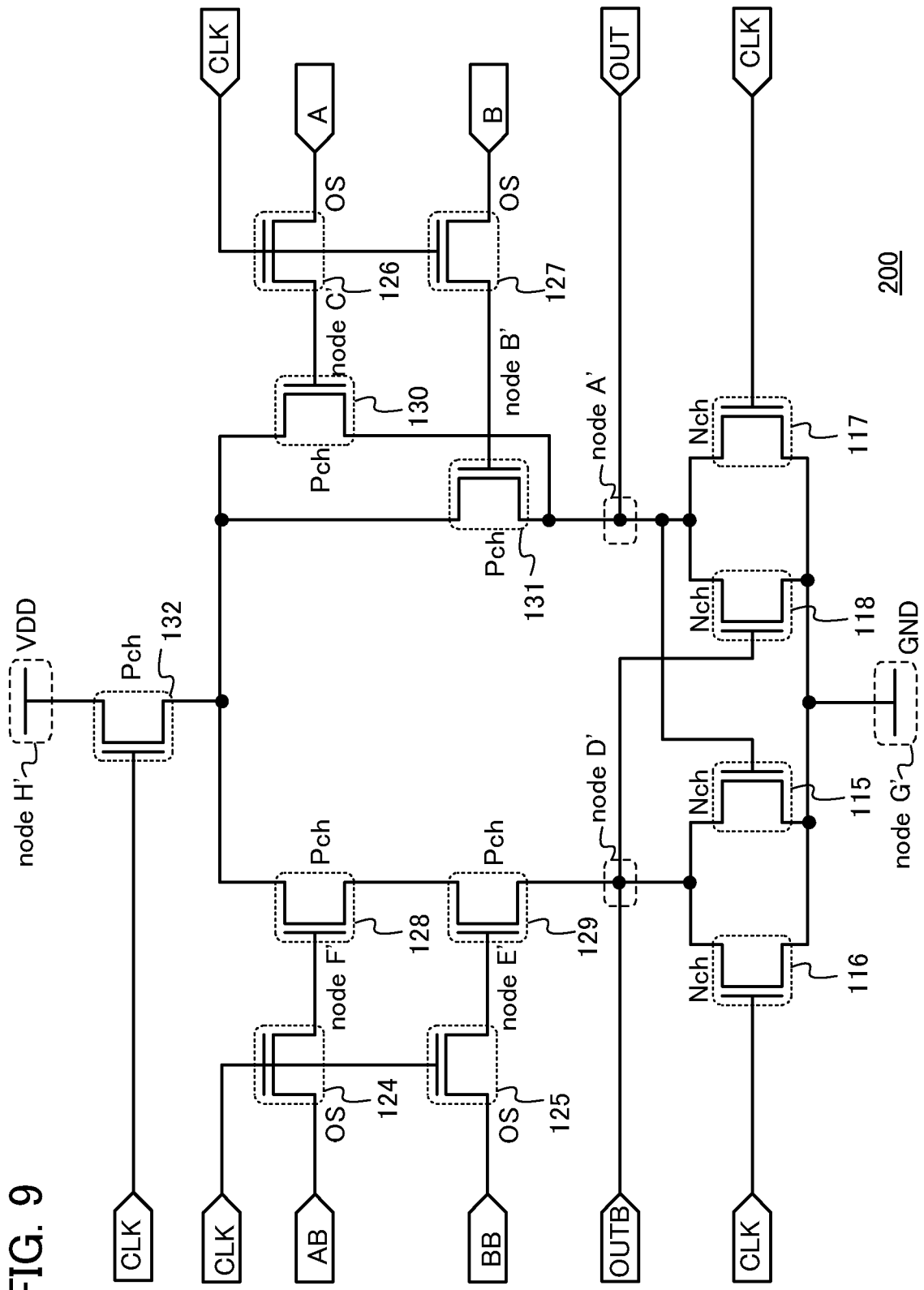
FIG. 9 illustrates operation of a NAND circuit according to Embodiment 2.

FIG. 9 is a circuit diagram of a NAND circuit of this embodiment. A NAND circuit 200 illustrated in FIG. 9 includes a 15th transistor 115, a 16th transistor 116, a 17th transistor 117, an 18th transistor 118, a 24th transistor 124, a 25th transistor 125, a 26th transistor 126, a 27th transistor 127, a 28th transistor 128, a 29th transistor 129, a 30th transistor 130, a 31st transistor 131, and a 32nd transistor 132.

P-channel transistors are used as the following five transistors: the 28th transistor 128, the 29th transistor 129, the 30th transistor 130, the 31st transistor 131, and the 32nd transistor 132. N-channel transistors are used as the following four transistors: the 15th transistor 115, the 16th transistor 116, the 17th transistor 117, and the 18th transistor 118.

Transistors in which channels are formed in oxide semiconductor layers are used as the following four transistors: the 24th transistor 124, the 25th transistor 125, the 26th transistor 126, and the 27th transistor 127. The transistor including an oxide semiconductor has an advantage of extremely small leakage current (also referred to as off-state current). Note that the transistor including an oxide semiconductor is an n-channel transistor.

Transistors in which channels are formed in silicon layers are used as the following nine transistors: the 15th transistor 115, the 16th transistor 116, the 17th transistor 117, the 18th transistor 118, the 28th transistor 128, the 29th transistor 129, the 30th transistor 130, the 31st transistor 131, and the 32nd transistor 132. The silicon layers may be each a single crystal silicon layer, a microcrystalline silicon layer, or an amorphous silicon layer.

Note that all or some of the four transistors, the 15th transistor 115, the 16th transistor 116, the 17th transistor 117, and the 18th transistor 118 may be replaced with transistors including an oxide semiconductor. However, a transistor including an oxide semiconductor has a slower operation speed than a transistor including a silicon semiconductor while having extremely small off-state current. Therefore, when these transistors are replaced with transistors including an oxide semiconductor, influence on the operation speed of the NAND circuit 200 needs to be taken into consideration.

An input signal A of two signals which are input to the NAND circuit 200 is input to one of a source and a drain of the 26th transistor 126. An input signal B is input to one of a source and a drain of the 27th transistor 127. A signal AB whose phase is the inverse of that of the input signal A is input to one of a source and a drain of the 24th transistor 124. A signal BB whose phase is the inverse of that of the input signal B is input to one of a source and a drain of the 25th transistor 125.

A gate of the 25th transistor 125 is electrically connected to a gate of the 24th transistor 124. The other of the source and the drain of the 25th transistor 125 is electrically connected to a gate of the 29th transistor 129. Note that a point where the other of the source and the drain of the 25th transistor 125 and the gate of the 29th transistor 129 are connected to each other is referred to as a node E'. One of a source and a drain of the 29th transistor 129 is electrically connected to one of a source and a drain of the 28th transistor 128, and the other thereof is electrically connected to a gate of the 18th transistor 118, one of a source and a drain of the 15th transistor 115, and one of a source and a drain of the 16th transistor 116. Note that a point where the other of the source and the drain of the 29th transistor 129, the gate of the 18th transistor 118, the one of the source and the drain of the 15th transistor 115, and the one of the source and the drain of the 16th transistor 116 are connected to each other is referred to as a node D'.

A clock signal CLK is input to a gate of the 24th transistor 124. The clock signal CLK is input to a gate of the 26th transistor 126. The clock signal CLK is input to a gate of the 32nd transistor 132.

A gate of the 27th transistor 127 is electrically connected to a gate of the 26th transistor 126. The other of the source and the drain of the 27th transistor 127 is electrically connected to a gate of the 31st transistor 131. Note that a point where the other of the source and the drain of the 27th transistor 127 and the gate of the 31st transistor 131 are connected to each other is referred to as a node B'.

One of a source and a drain of the 31st transistor 131 is electrically connected to one of a source and a drain of the 30th transistor 130, one of a source and a drain of the 32nd transistor 132, and the other of the source and the drain of the 28th transistor 128. The other of the source and the drain of the 31st transistor 131 is electrically connected to the other of the source and the drain of the 30th transistor 130, one of a source and a drain of the 17th transistor 117, one of a source and a drain of the 18th transistor 118, and a gate of the 15th transistor 115. Note that a point where the other of the source and the drain of the 31st transistor 131, the other of the source and the drain of the 30th transistor 130, the one of the source and the drain of the 17th transistor 117, the one of the source and the drain of the 18th transistor 118, and the gate of the 15th transistor 115 are connected to each other is referred to as a node A'.

A gate of the 30th transistor 130 is electrically connected to the other of the source and the drain of the 26th transistor 126. Note that a point where the gate of the 30th transistor 130 and the other of the source and the drain of the 26th transistor 126 are connected to each other is referred to as a node C'.

A gate of the 28th transistor 128 is electrically connected to the other of the source and the drain of the 24th transistor 124. Note that a point where the gate of the 28th transistor 128 and the other of the source and the drain of the 24th transistor 124 are connected to each other is referred to as a node F'.

The other of the source and the drain of the 15th transistor 115, the other of the source and the drain of the 16th transistor 116, the other of the source and the drain of the 17th transistor 117, and the other of the source and the drain of the 18th transistor 118 are electrically connected to each other, and they are electrically connected to a ground potential GND terminal. Note that a point where the other of the source and the drain of the 15th transistor 115, the other of the source and the drain of the 16th transistor 116, the other of the source and the drain of the 17th transistor 117, the other of the source and the drain of the 18th transistor 118, and the ground potential GND terminal are connected to each other is referred to as a node G'.

The other of the source and the drain of the 32nd transistor 132 is supplied with a power supply potential VDD. Note that a point where the other of the source and the drain of the 32nd transistor 132 and a power supply potential VDD terminal are connected to each other is referred to as a node H'. The clock signal CLK is input to a gate of the 16th transistor 116 and a gate of the 17th transistor 117.

The potential of the node A' is output as an output signal OUT of the NAND circuit 200. The potential of the node D' is output as a signal OUTB whose phase is the inverse of that of the output signal OUT of the NAND circuit 200.

In the NAND circuit 200 of this embodiment, when the gates of the transistors including an oxide semiconductor are closed, there is only one path of leakage current, which goes from the power supply potential VDD terminal to the ground potential GND terminal Consequently, the power consumption of the NAND circuit 200 can be reduced.

The NAND circuit 200 of this embodiment includes the four transistors including an oxide semiconductor and the nine transistors including a silicon semiconductor.

As described above, the leakage current of the transistor including an oxide semiconductor is extremely small. Therefore, even when supply of the power supply potential VDD to the NAND circuit 200 is stopped, charge accumulated between the gate of the 28th transistor 128 and the other of the source and the drain of the 24th transistor 124 that is the transistor including an oxide semiconductor (i.e., in the node F') is held, for example. Accordingly, in response to restart of the supply of the power supply potential VDD, the NAND circuit 200 can start its operation from the state before the stop of the supply of the power supply potential VDD.

In this manner, the NAND circuit 200 does not lose data even when the supply of the power supply potential VDD is stopped. In other words, the NAND circuit 200 of this embodiment is a nonvolatile memory circuit. Therefore, since data is not lost even when the supply of the power supply potential VDD is stopped, it is possible to stop the supply of the power supply potential VDD when the gates of the transistors including an oxide semiconductor are closed in the NAND circuit 200. Therefore, the power consumption of the nonvolatile NAND circuit 200 can be reduced.

Further, in the NAND circuit 200 of this embodiment, the transistor including an oxide semiconductor and the transistor including a silicon semiconductor can be stacked (which is described later). Therefore, it is possible to reduce the area of the NAND circuit 200.

<Operation of NAND Circuit 200>

Figure 10:
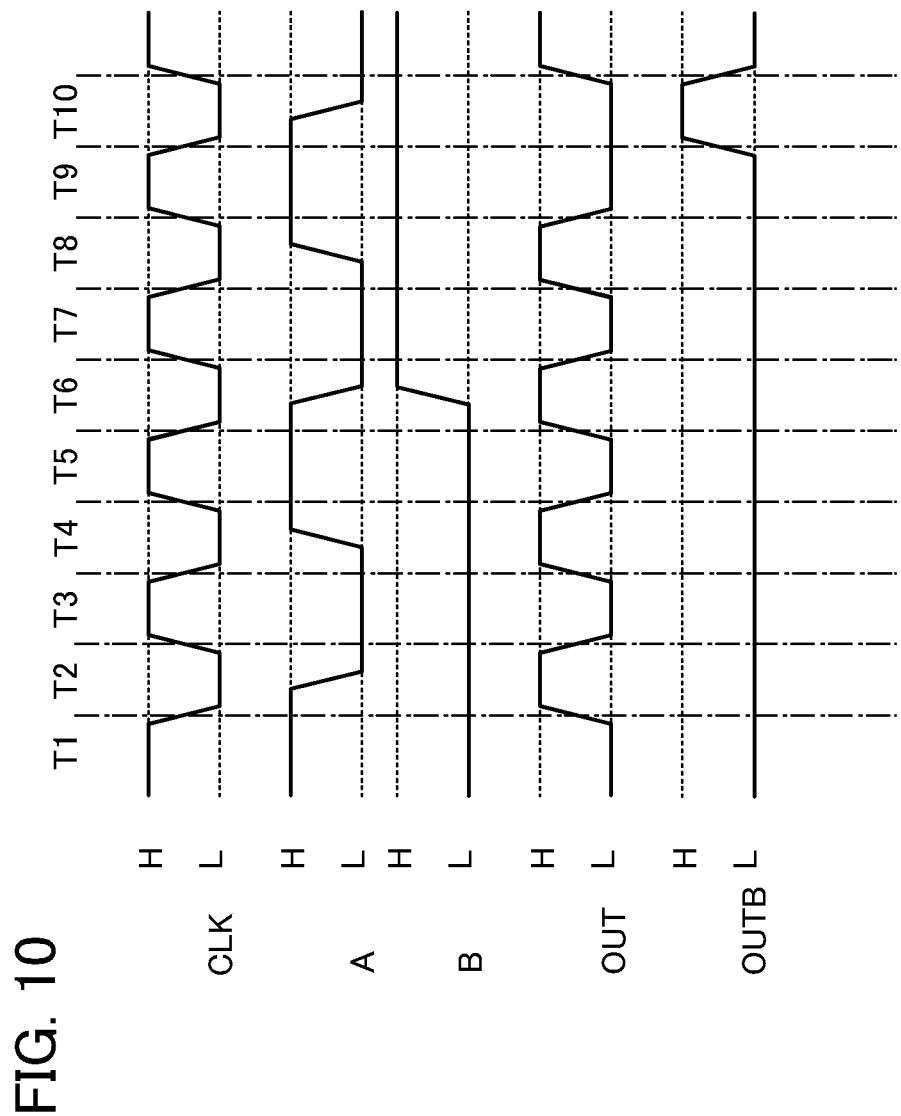
FIG. 10 is a timing chart of a NAND circuit according to Embodiment 2.
Figure 11:
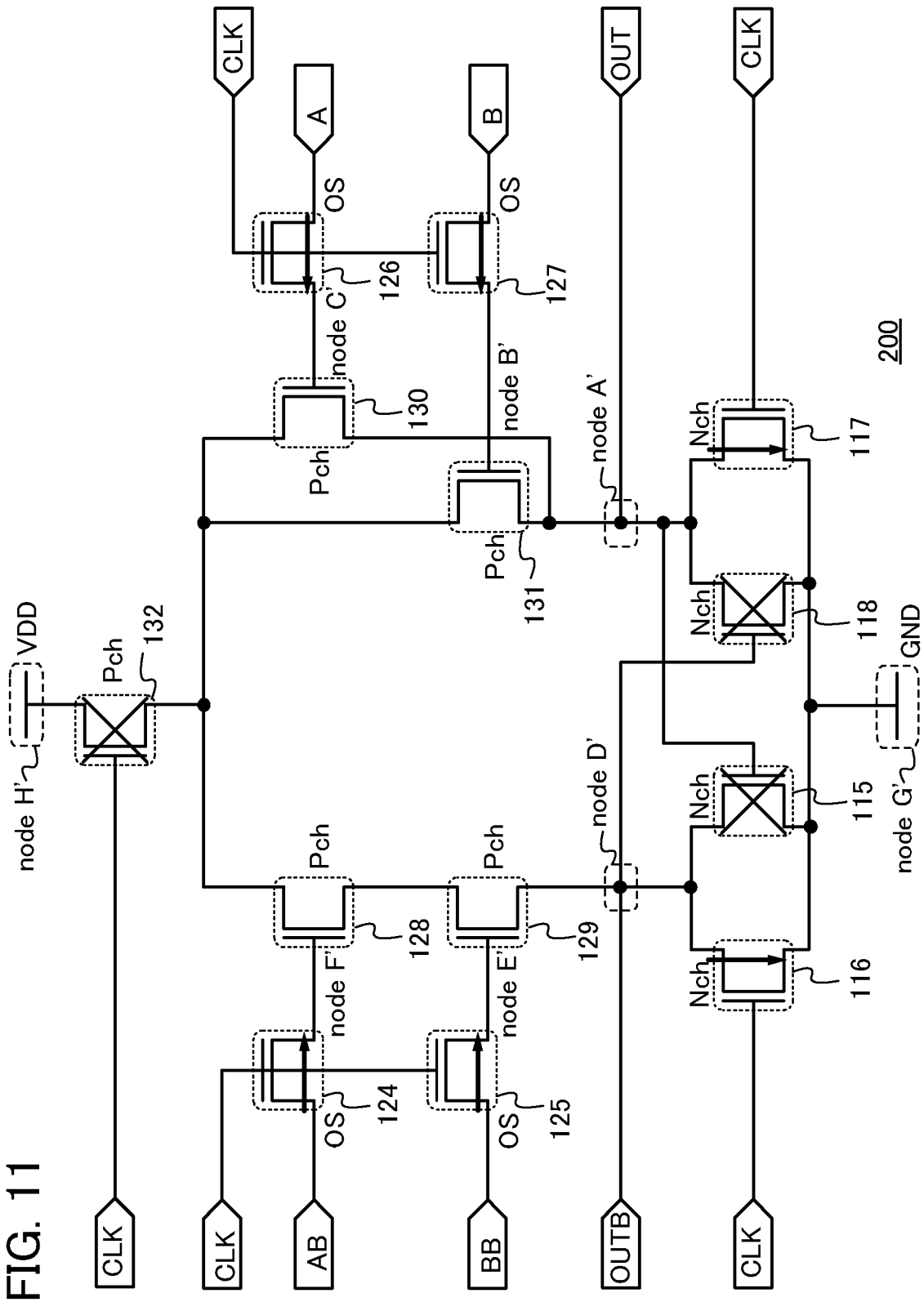
FIG. 11 illustrates operation of a NAND circuit according to Embodiment 2.
Figure 12:
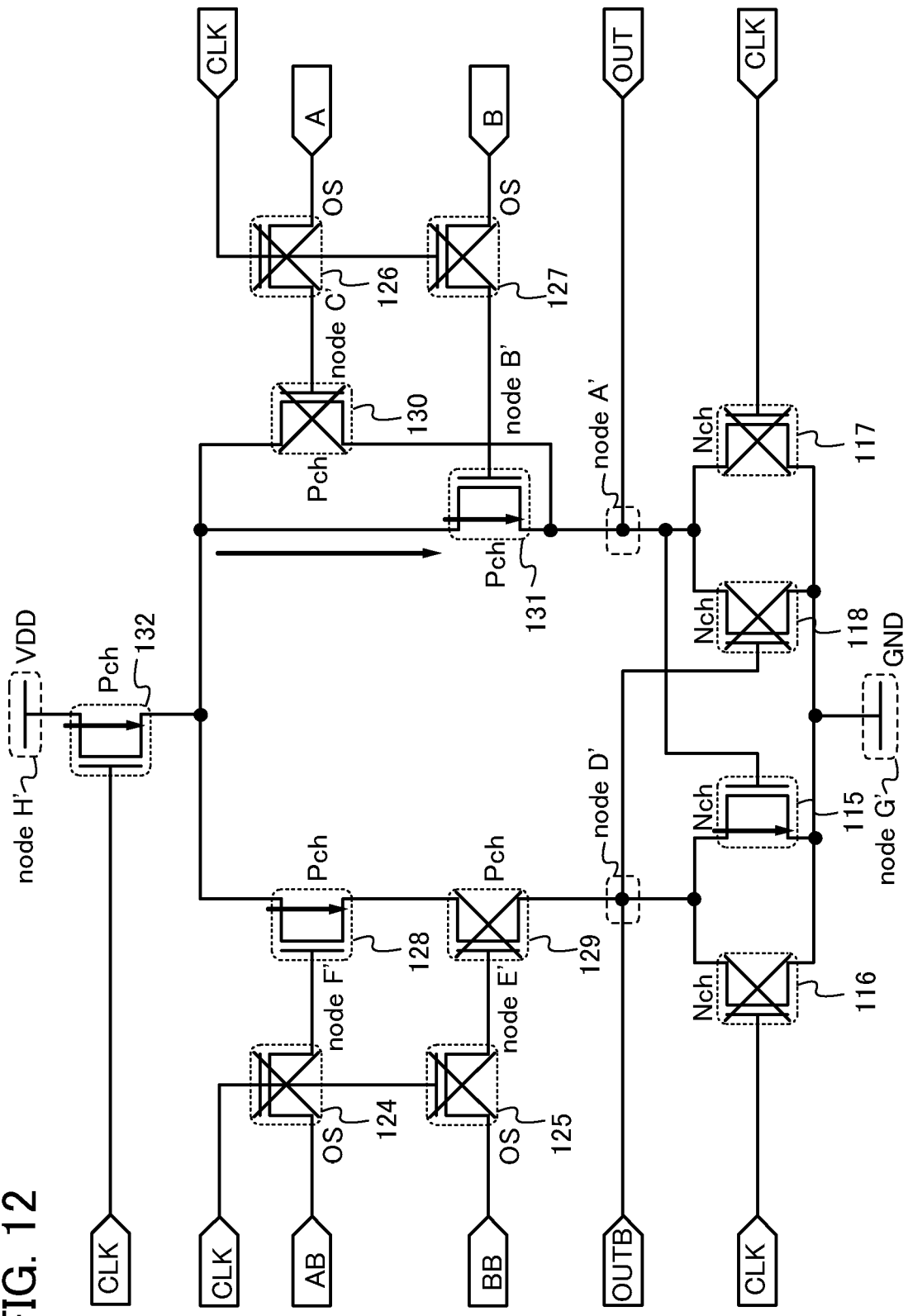
FIG. 12 illustrates operation of a NAND circuit according to Embodiment 2.
Figure 13:
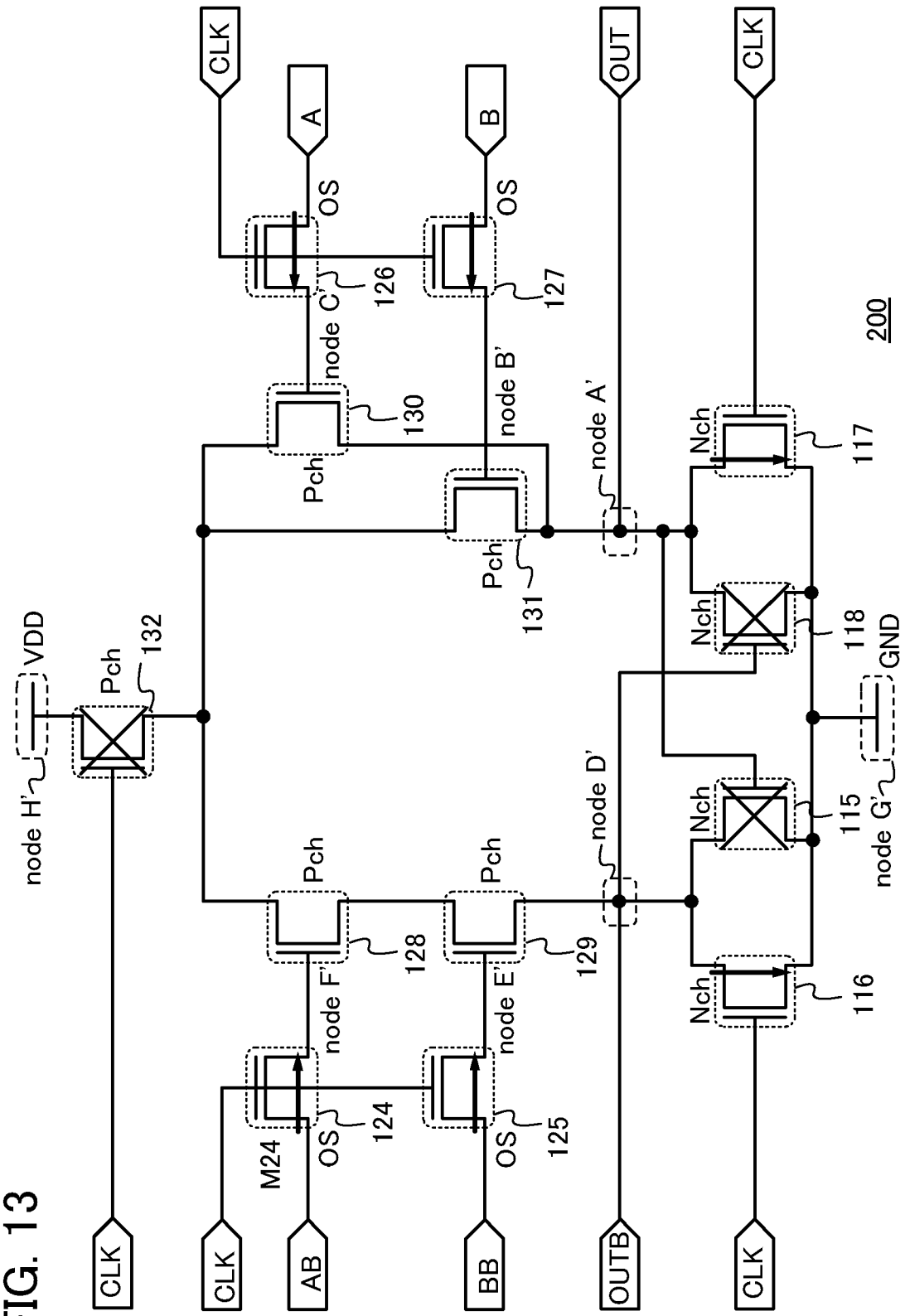
FIG. 13 illustrates operation of a NAND circuit according to Embodiment 2.
Figure 14:
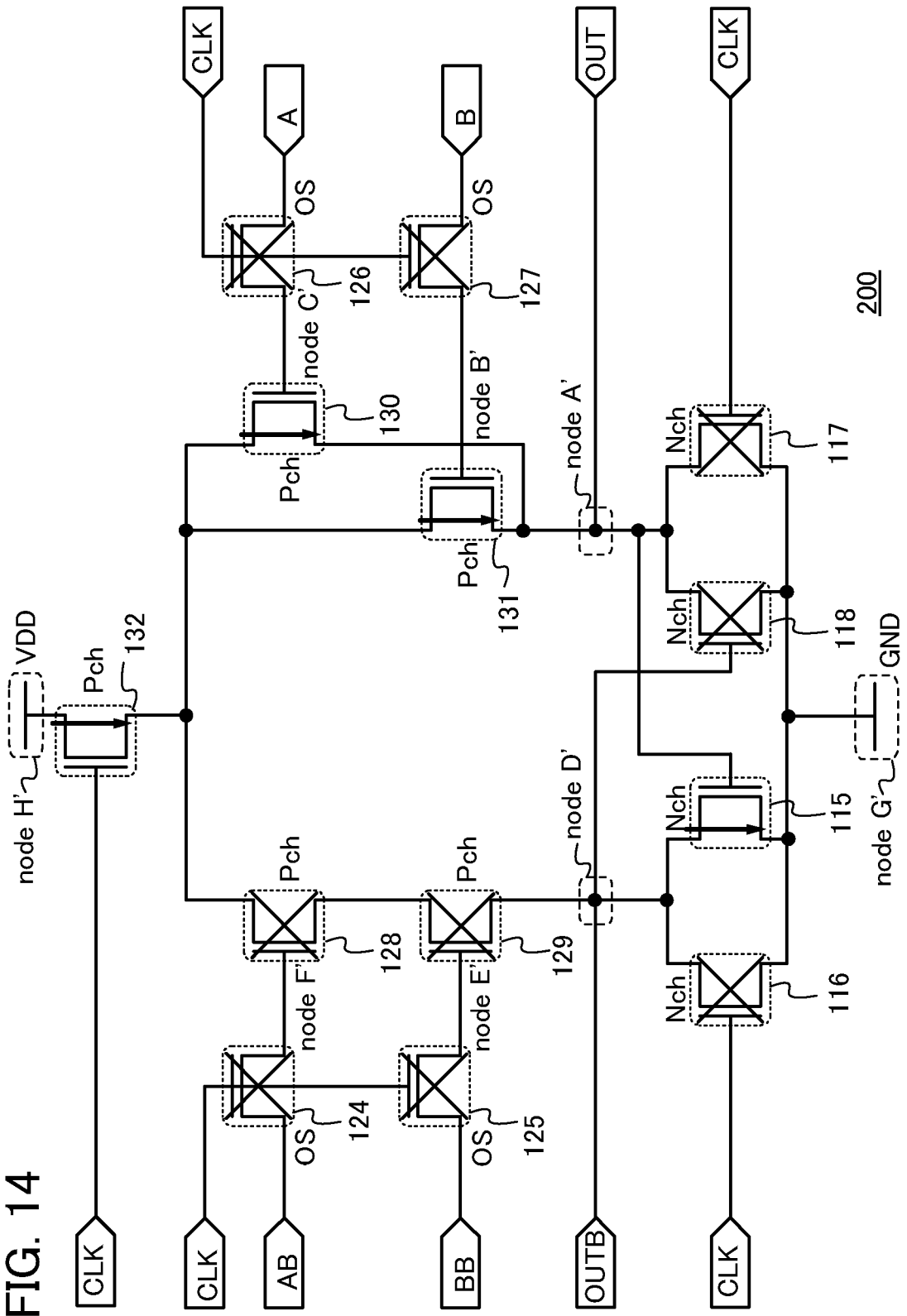
FIG. 14 illustrates operation of a NAND circuit according to Embodiment 2.

The operation of the NAND circuit 200 of this embodiment is described with reference to FIG. 10, FIG. 11, FIG. 12, FIG. 13, and FIG. 14. FIG. 10 shows a timing chart of the NAND circuit 200. In the timing chart in FIG. 10, a period T1, a period T2, a period T3, a period T4, a period T5, a period T6, a period T7, a period T8, a period T9, and a period T10 are separately illustrated. FIG. 11, FIG. 12, FIG. 13, and FIG. 14 show operation states of the NAND circuit 200 in the period T1, the period T2, the period T3, and the period T4, respectively.

The NAND circuit 200 is a clock synchronization circuit and functions as a NAND circuit when the same clock signal CLK is input to the 16th transistor 116, the 17th transistor 117, the 24th transistor 124, the 26th transistor 126, and the 32nd transistor 132. Note that the output signal OUT is determined only in the period T2, the period T4, the period T6, the period T8, and the period T10, in which the 32nd transistor 132 is on in synchronization with the clock signal CLK.

<Period T1 (see FIG. 11)>

First, as shown in the period T1 in FIG. 10, a case where the input signal A and the input signal B have the H potential (VDD) and L potential (VSS), respectively, is given. At this time, the clock signal CLK has the H potential (VDD), and thus the H potential (VDD) is applied to the gate of the 16th transistor 116 and the gate of the 17th transistor 117. Accordingly, the 16th (n-channel) transistor 116 and the 17th (n-channel) transistor 117 are turned on. At this time, the L potential (VSS) flows into the node D' because the potential of the node D' is extracted to the potential of the node G', and the L potential (VSS) flows into the node A' because the potential of the node A' is extracted to the potential of the node G' (discharging operation). The 16th transistor 116 and the 17th transistor 117 are provided to control whether the potentials of the node A' and the node D' are discharged to the L potential (VSS).

Since the clock signal CLK has the H potential (VDD), the 26th transistor 126 and the 27th transistor 127 are turned on. Accordingly, the gate of the 31st transistor 131 (the node B') is charged with the L potential (VSS) that is equivalent to that of the input signal B, and the gate of the 30th transistor 130

(the node C') is charged with the H potential (VDD) that is equivalent to that of the input signal A.

Further, since the clock signal CLK has the H potential (VDD), the 24th transistor 124 and the 25th transistor 125 are turned on. Accordingly, the gate of the 29th transistor 129 (the node E') is charged with the H potential (VDD) that is equivalent to that of the signal BB whose phase is the inverse of that of the input signal B, and the gate of the 28th transistor 128 (the node F') is charged with the L potential (VSS) that is equivalent to that of the signal AB whose phase is the inverse of that of the input signal A.

As described above, in the period T1, the node B', the node C', the node E', and the node F' are charged with the potentials corresponding to the input signal A and the potentials corresponding to the input signal B, and the node A' and the node D' are charged with the L potential (VSS).

<Period T2 (see FIG. 12)>

Next, as shown in the period T2 in FIG. 10, the clock signal CLK has the L potential (VSS), and thus the L potential (VSS) is applied to the gate of the 16th transistor 116, the gate of the 17th transistor 117, and the gate of the 32nd transistor 132. At this time, the 16th (n-channel) transistor 116 and the 17th (n-channel) transistor 117 are turned off. Since the 17th transistor 117 is turned off, the L potential (VSS) of the node G' is not extracted to the node A; thus, the node A' keeps the L potential (VSS). Further, since the 16th transistor 116 is turned off, the L potential (VSS) of the node G' is not extracted to the node D; thus, the node D' keeps the L potential (VSS).

The 32nd (p-channel) transistor 132 is turned on.

On the other hand, the signal CLK has the L potential (VSS), and thus the 26th (n-channel) transistor 126 and the 27th (n-channel) transistor 127 are turned off. Since charge corresponding to the L potential (VSS) is accumulated in the node B', when the 27th transistor 127 is off, the charge corresponding to the L potential (VSS) is held in the node B' (charge holding operation). Further, the 31st (p-channel) transistor 131 is turned on in response to the potential of the node B'. Since charge corresponding to the H potential (VDD) is accumulated in the node C', when the 26th transistor 126 is off, the charge corresponding to the H potential (VDD) is held in the node C' (charge holding operation). Further, the 30th (p-channel) transistor 130 is turned off in response to the potential of the node C'.

In a similar manner, since the clock signal CLK has the L potential (VSS), the 24th (n-channel) transistor 124 and the 25th (n-channel) transistor 125 are turned off. Since charge corresponding to the H potential (VDD) is accumulated in the node E', when the 25th transistor 125 is off, the charge corresponding to the H potential (VDD) is held in the node E' (charge holding operation). Further, the 29th (p-channel) transistor 129 is turned off in response to the potential of the node E'. Since charge corresponding to the L potential (VSS) is accumulated in the node F', when the 24th transistor 124 is off, the charge corresponding to the L potential (VSS) is held in the node F' (charge holding operation). Further, the 28th (p-channel) transistor 128 is turned on in response to the potential of the node F'.

At this time, since the 30th transistor 130 and the 31st transistor 131 are electrically connected to each other in parallel, a current path from the node H' to the node A' is formed. Therefore, current flows from the node H' to the node A' through the on-state 32nd transistor 132 and the on-state 30th transistor 130. That is, the power supply potential (VDD) of the node H' is supplied to the node A'. Since the 28th transistor 128 and the 29th transistor 129 are electrically connected to each other in series, a current path from the node H' to the node A' is not formed.

Since current flows from the node H' to the node A', the potential of the node A' is gradually increased from the L potential (VSS) to the H potential (VDD). At this time, the potential of the node A' is determined, and the output signal OUT has the H potential (VDD).

As a result, the H potential (VDD) is applied to the gate of the 15th transistor 115, so that the 15th transistor (n-channel) 115 is turned on. At this time, a current path from the node D' to the node G' through the 15th transistor 115 is formed. Therefore, since the potential of the node D' is extracted to the potential of the node G', the potential of the node D' becomes the L potential (VSS).

The 15th transistor 115 and the 18th transistor 118 have functions of compensating the potentials of the node A' and the node D'. "Compensating the potentials of the node A' and the node D'" means that, for example, in the case where the node A' has the H potential (VDD), the potential of the node D' is extracted to the L potential (VSS) of the node G' by the 15th transistor 115; for example, in the case where the node D' has the H potential (VDD), the potential of the node A' is extracted to the L potential (VSS) of the node G' by the 18th transistor 118. That is, when one of the node A' and the node D' has the H potential (VDD), the potential of the other of the node A' and the node D' is extracted to the L potential (VSS) of the node G'.

Note that the potential of the node A' and the potential of the node D' depend on the on state and the off state of the 32nd transistor 132. In other words, the potential of the output signal OUT is determined only when the clock signal CLK has the L potential (VSS). Accordingly, the potential of the output signal OUT of the NAND circuit 200 is determined in the period T2, the period T4, the period T6, the period T8, and the period T10 in the timing chart of FIG. 10.

In this manner, in the period T2, the output signal OUT having the H potential (VDD) is determined in response to the input of the input signal A having the H potential (VDD) and the input of the input signal B having the L potential (VSS).

As described above, the 15th transistor 115 and the 18th transistor 118 have functions of compensating the potentials, and the 16th transistor 116 and the 17th transistor 117 have discharging functions. Accordingly, these four transistors have a function as a comparator which continuously compares the potential of the node A' with the potential of the node D' and extracts the potential of the node that is the opposite to the node having the H potential (VDD) to the L potential (VSS) of the node G'.

In addition, the 32nd transistor 132 has charging function. The power supply potential (VDD) of the node H' is supplied to the node A' or the node D' through the on-state 32nd transistor 132. As a result, only when the 32nd transistor 132 is on (the clock signal CLK has the L potential (VSS)), the potential of the output signal OUT is determined. Therefore, the 32nd transistor 132 also has a function of determining a definitive potential of the output signal OUT (a function of determining a potential).

<Period T3 (see FIG. 13)>

First, as shown in the period T3 in FIG. 10, a case where the input signal A and the input signal B have the L potential (VSS) is given. At this time, the clock signal CLK has the H potential (VDD), and thus the H potential (VDD) is applied to the gate of the 16th transistor 116 and the gate of the 17th transistor 117. Accordingly, the 16th (n-channel) transistor 116 and the 17th (n-channel) transistor 117 are turned on. At this time, the L potential (VSS) flows into the node D' because the potential of the node D' is extracted to the potential of the node G', and the L potential (VSS) flows into the node A' because the potential of the node A' is extracted to the potential of the node G' (discharging operation).

The signal CLK has the H potential (VDD), and thus, the 26th transistor 126 and the 27th transistor 127 are turned on. Accordingly, the gate of the 31st transistor 131 (the node B') is charged with the L potential (VSS) that is equivalent to that of the input signal B, and the gate of the 30th transistor 130 (the node C') is charged with the L potential (VSS) that is equivalent to that of the input signal A.

Further, since the clock signal CLK has the H potential (VDD), the 24th transistor 124 and the 25th transistor 125 are turned on. Accordingly, the gate of the 29th transistor 129 (the node E') is charged with the H potential (VDD) that is equivalent to that of the signal BB whose phase is the inverse of that of the input signal B, and the gate of the 28th transistor 128 (the node F') is charged with the H potential (VDD) that is equivalent to that of the signal AB whose phase is the inverse of that of the input signal A.

As described above, in the period T3, the node B', the node C', the node E', and the node F' are charged with the potentials corresponding to the input signal A and the potentials corresponding to the input signal B, and the node A' and the node D' are charged with the L potential (VSS).

<Period T4 (see FIG. 14)>

Next, as shown in the period T4 in FIG. 10, the clock signal CLK has the L potential (VSS), and thus the L potential (VSS) is applied to the gate of the 16th transistor 116, the gate of the 17th transistor 117, and the gate of the 32nd transistor 132. At this time, the 16th (n-channel) transistor 116 and the 17th (n-channel) transistor 117 are turned off. Since the 17th transistor 117 is turned off, the L potential (VSS) of the node G' is not extracted to the node A; thus, the node A' keeps the L potential (VSS). Further, since the 16th transistor 116 is turned off, the L potential (VSS) of the node G' is not extracted to the node D; thus, the node D' keeps the L potential (VSS).

The 32nd (p-channel) transistor 132 is turned on.

On the other hand, the signal CLK has the L potential (VSS), and thus the 26th (n-channel) transistor 126 and the 27th (n-channel) transistor 127 are turned off. Since charge corresponding to the L potential (VSS) is accumulated in the node B', when the 27th transistor 127 is off, the charge corresponding to the L potential (VSS) is held in the node B' (charge holding operation). Further, the 31st (p-channel) transistor 131 is turned on in response to the potential of the node B'. Since charge corresponding to the L potential (VSS) is accumulated in the node C', when the 26th transistor 126 is off, the charge corresponding to the L potential (VSS) is held in the node C' (charge holding operation). Further, the 30th (p-channel) transistor 130 is turned on in response to the potential of the node C'.

In a similar manner, since the clock signal CLK has the L potential (VSS), the 24th (n-channel) transistor 124 and the 25th (n-channel) transistor 125 are turned off. Since charge corresponding to the H potential (VDD) is accumulated in the node E', when the 25th transistor 125 is off, the charge corresponding to the H potential (VDD) is held in the node E' (charge holding operation). Further, the 29th (p-channel) transistor 129 is turned off in response to the potential of the node E'. Since charge corresponding to the H potential (VDD) is accumulated in the node F', when the 24th transistor 124 is off, the charge corresponding to the H potential (VDD) is held in the node F' (charge holding operation). Further, the 28th (p-channel) transistor 128 is turned off in response to the potential of the node F'.

At this time, a current path from the node H' to the node A' is formed. Accordingly, current flows from the node H' to the node A' through the on-state 32nd transistor 132 and the on-sate 31st transistor 131 (or the on-state 32nd transistor 132 and the on-state 30th transistor 130). That is, the power supply potential (VDD) of the node H' is supplied to the node A'. Since the 28th transistor 128 and the 29th transistor 129 are each off, a current path from the node H' to the node D' is not formed.

Since current flows from the node H' to the node A', the potential of the node A' is gradually increased from the L potential (VSS) to the H potential (VDD). At this time, the potential of the node A' is determined, and the output signal OUT has the H potential (VDD).

As a result, the H potential (VDD) is applied to the gate of the 15th transistor 115, so that the 15th transistor (n-channel) 115 is turned on. At this time, a current path from the node D' to the node G' through the 15th transistor 115 is formed. Therefore, since the potential of the node D' is extracted to the potential of the node G', the potential of the node D' becomes the L potential (VSS).

In this manner, in the period T4, the output signal OUT having the H potential (VDD) is determined in response to the input of the input signal A having the L potential (VSS) and the input of the input signal B having the L potential (VSS).

The 30th transistor 130 whose gate corresponds to the node C' having a potential corresponding to the input signal A and the 31st transistor 131 whose gate corresponds to the node B' having a potential corresponding to the input signal B are electrically connected to each other in parallel. Therefore, when the L potential (VSS) is input as either of the input signals, a current path from the node H' to the node A' is formed; thus, the power supply potential (VDD) of the node H' is supplied to the node A'. On the other hand, the 28th transistor 128 and the 29th transistor 129 are electrically connected to each other in series. Therefore, when the L potential (VSS) is input as either of the input signals, a current path from the node H' to the node D' is not formed; the current path is formed only when the H potential (VDD) is input as both of the input signals.

In other words, when the L potential (VSS) is input to either of the input signals, the potential of the node A' is always the H potential (VDD). The potential of the output signal OUT is always the H potential (VDD) at this time. When the H potential (VDD) is input as both of the input signals, the potential of the node A' is always the L potential (VSS), and the potential of the output signal OUT is always the L potential (VSS) at this time. The NAND circuit is configured to operate in this manner.

Operations in the period T5 and the period T6 are similar to those in the period T1 and the period T2. Operations in the period T7 and the period T8 correspond to those in the period T1 and the period T2 in the case where the L potential (VSS) and the H potential (VDD) are input as the input signal A and the input signal B, respectively. Operations in the period T9 and the period T10 correspond to those in the period T3 and the period T4 in the case where the H potential (VDD) is input as the input signal A and the input signal B.

According to this embodiment, increase in the number of paths of leakage current in the NAND circuit can be suppressed. Accordingly, the power consumption of the NAND circuit can be reduced.

According to this embodiment, the NAND circuit can hold data even when power supply is stopped.

According to this embodiment, it is possible to stack the transistor including an oxide semiconductor and the transistor including a silicon semiconductor in the NAND circuit; therefore, the area of the circuit can be reduced.

This embodiment can be implemented in combination with any of the other embodiments in this specification as appropriate.

Embodiment 3

In this embodiment, another structure of a NAND circuit which has a data holding function and whose power consumption is reduced will be described with reference to FIG. 15 and FIG. 16.

Figure 15:
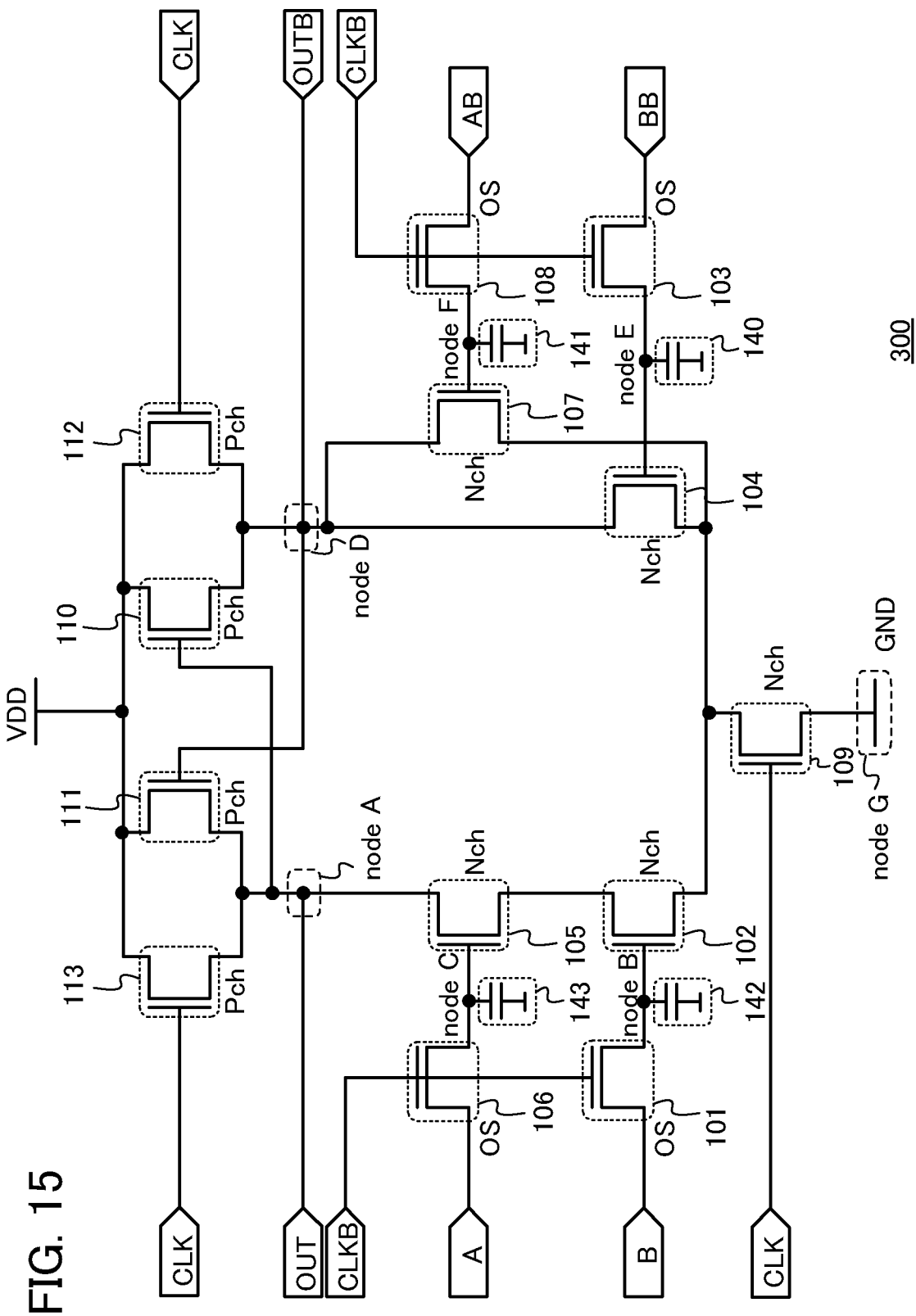
FIG. 15 illustrates a NAND circuit according to Embodiment 3.
Figure 16:
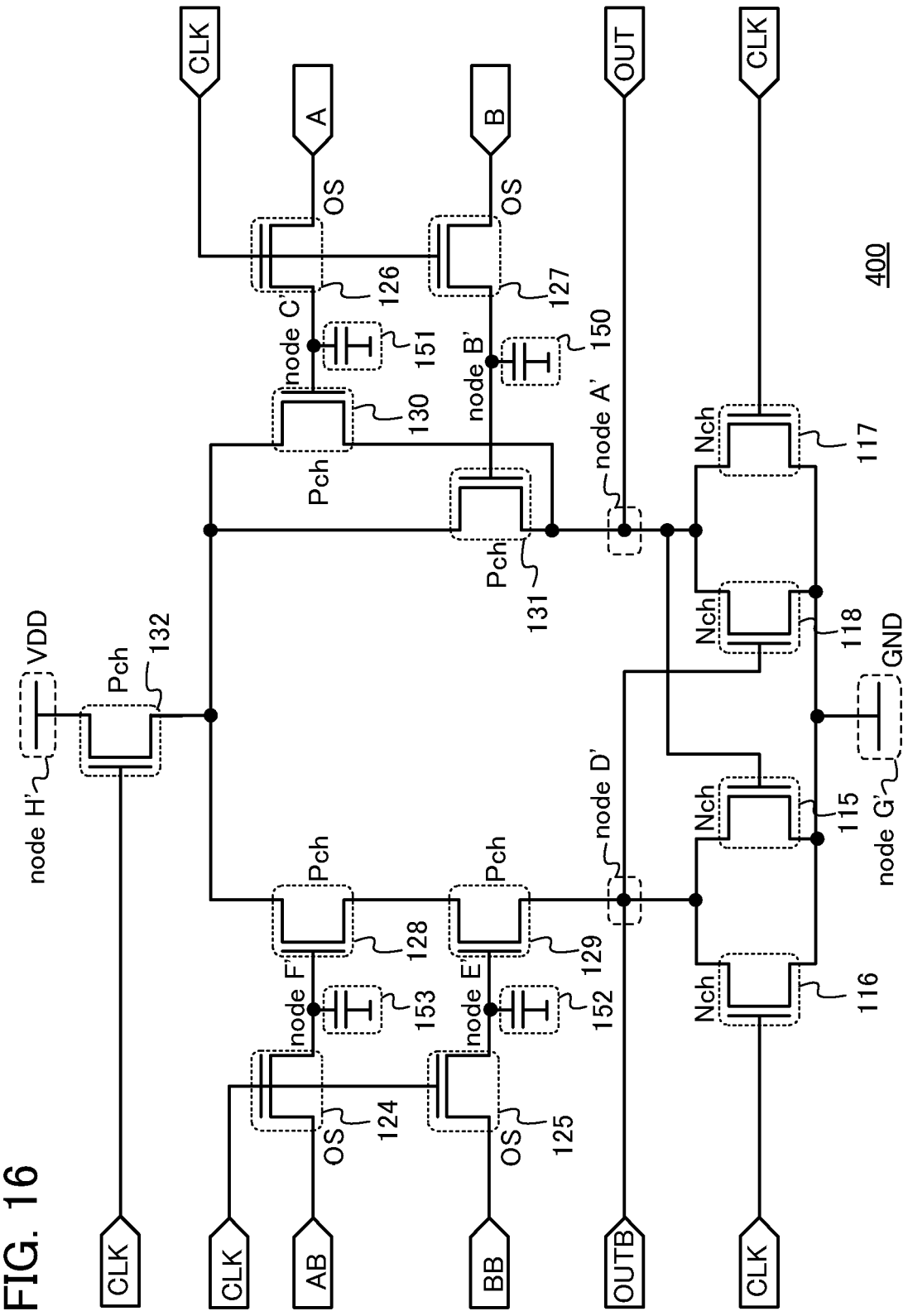
FIG. 16 illustrates a NAND circuit according to Embodiment 3.

FIG. 15 and FIG. 16 are each a circuit diagram of a NAND circuit of this embodiment. A NAND circuit 300 in FIG. 15 has a structure in which capacitors 140, 141, 142, and 143 are connected to the NAND circuit 100 in FIG. 1. Specifically, one terminal of the capacitor 142 is electrically connected to the node B, and the other terminal thereof is electrically connected to the ground potential GND terminal. One terminal of the capacitor 143 is electrically connected to the node C, and the other terminal thereof is electrically connected to the ground potential GND terminal. One terminal of the capacitor 140 is electrically connected to the node E, and the other terminal thereof is electrically connected to the ground potential GND terminal. One terminal of the capacitor 141 is electrically connected to the node F, and the other terminal thereof is electrically connected to the ground potential GND terminal. Structures other than the capacitors 140, 141, 142, and 143 are the same as those in the NAND circuit 100.

A NAND circuit 400 in FIG. 16 has a structure in which capacitors 150, 151, 152, and 153 are connected to the NAND circuit 200 in FIG. 9. Specifically, one terminal of the capacitor 150 is electrically connected to the node B', and the other terminal thereof is electrically connected to the ground potential GND terminal. One terminal of the capacitor 151 is electrically connected to the node C', and the other terminal thereof is electrically connected to the ground potential GND terminal. One terminal of the capacitor 152 is electrically connected to the node E', and the other terminal thereof is electrically connected to the ground potential GND terminal. One terminal of the capacitor 153 is electrically connected to the node F', and the other terminal thereof is electrically connected to the ground potential GND terminal. Structures other than the capacitors 150, 151, 152, and 153 are the same as those in the NAND circuit 200.

The capacitor 142 is connected to the node B (the capacitor 150 is connected to the node B'), the capacitor 143 is connected to the node C (the capacitor 151 is connected to the node C'), the capacitor 140 is connected to the node E (the capacitor 152 is connected to the node E'), and the capacitor 141 is connected to the node F (the capacitor 153 is connected to the node F'). With such a structure, data holding time can be longer. The data holding time can be adjusted by changing the capacitance value of each of the capacitor 140 (the capacitor 150), the capacitor 141 (the capacitor 151), the capacitor 142 (the capacitor 152), and the capacitor 143 (the capacitor 153). In order to lengthen the data holding time, the capacitance value of each of the capacitors is increased.

Since the capacitor 142 is connected to the node B (the capacitor 150 is connected to the node B'), the capacitor 143 is connected to the node C (the capacitor 151 is connected to the node C'), the capacitor 140 is connected to the node E (the capacitor 152 is connected to the node E'), and the capacitor 141 is connected to the node F (the capacitor 153 is connected to the node F'), an adverse effect due to a load such as parasitic capacitance or the like in the NAND circuit can be reduced. Consequently, stability of the operation of the NAND circuit can be improved.

Since the operation of the NAND circuit 300 is similar to that of the NAND circuit 100, Embodiment 1 can be referred to. Further, since the operation of the NAND circuit 400 is similar to that of the NAND circuit 200, Embodiment 2 can be referred to.

This embodiment can be implemented in combination with any of the other embodiments in this specification as appropriate.

Embodiment 4

In this embodiment, a NOR circuit which has a data holding function and whose power consumption is reduced will be described with reference to FIG. 17, FIG. 18, FIG. 19, FIG. 20, FIG. 21, and FIG. 22.

<Structure of NOR Circuit 500>

Figure 17:
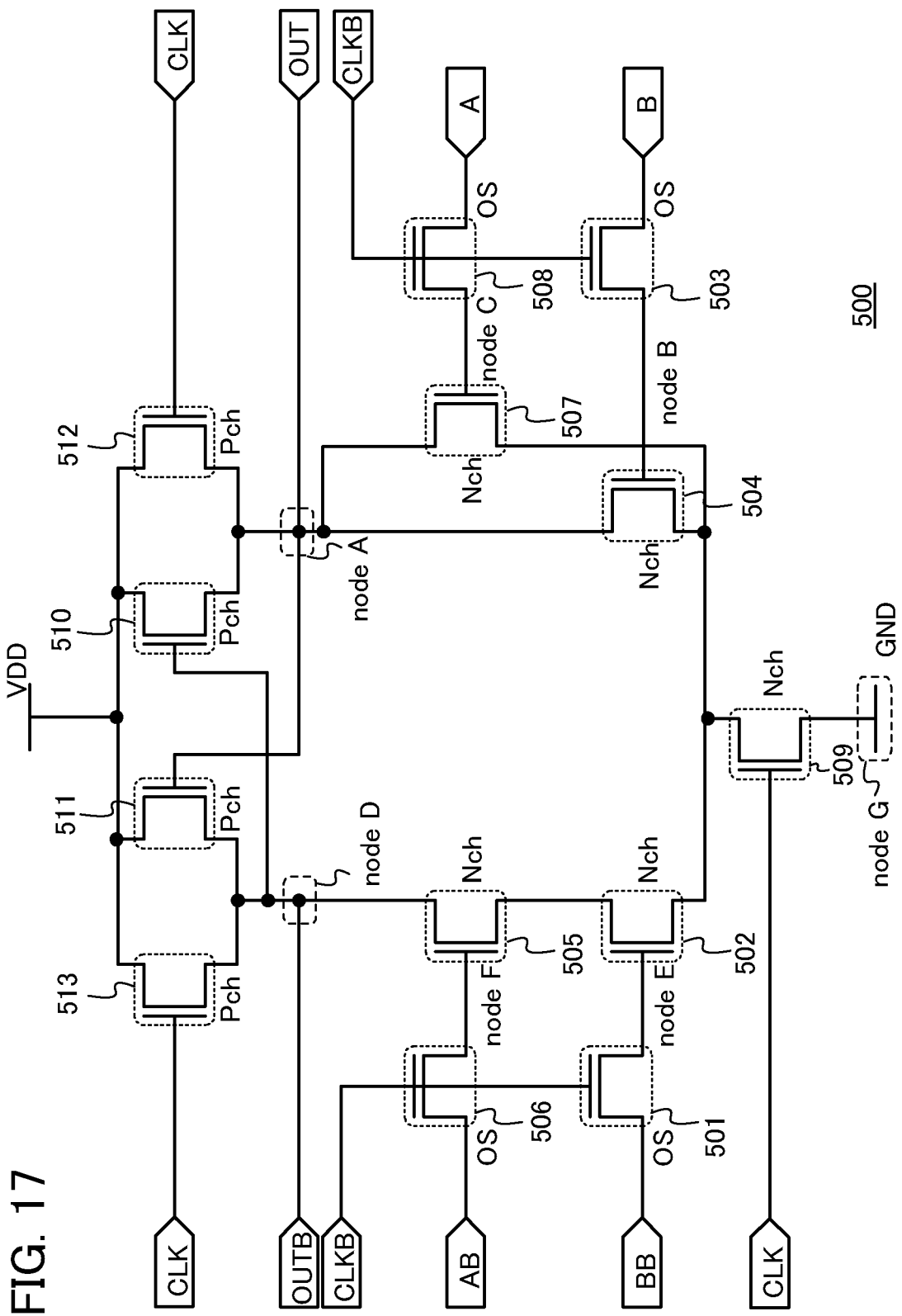
FIG. 17 illustrates a NOR circuit according to Embodiment 4.

FIG. 17 is a circuit diagram of a NOR circuit of this embodiment. A NOR circuit 500 illustrated in FIG. 17 includes a 1st transistor 501, a 2nd transistor 502, a 3rd transistor 503, a 4th transistor 504, a 5th transistor 505, a 6th transistor 506, a 7th transistor 507, an 8th transistor 508, a 9th transistor 509, a 10th transistor 510, an 11th transistor 511, a 12th transistor 512, and a 13th transistor 513.

N-channel transistors are used as the following five transistors: the 2nd transistor 502, the 4th transistor 504, the 5th transistor 505, the 7th transistor 507, and the 9th transistor 509. P-channel transistors are used as the following four transistors: the 10th transistor 510, the 11th transistor 511, the 12th transistor 512, and the 13th transistor 513.

Transistors in which channels are formed in oxide semiconductor layers are used as the following four transistors: the 1st transistor 501, the 3rd transistor 503, the 6th transistor 506, and the 8th transistor 508. The transistor including an oxide semiconductor has an advantage of extremely small leakage current (also referred to as off-state current). Note that the transistor including an oxide semiconductor is an n-channel transistor.

Transistors in which channels are formed in silicon layers are used as the following nine transistors: the 2nd transistor 502, the 4th transistor 504, the 5th transistor 505, the 7th transistor 507, the 9th transistor 509, the 10th transistor 510, the 11th transistor 511, the 12th transistor 512, and the 13th transistor 513. The silicon layers may be each a single crystal silicon layer, a microcrystalline silicon layer, or an amorphous silicon layer.

Note that all or some of the five transistors, the 2nd transistor 502, the 4th transistor 504, the 5th transistor 505, the 7th transistor 507, and the 9th transistor 509, may be replaced with transistors including an oxide semiconductor. However, a transistor including an oxide semiconductor has a slower operation speed than a transistor including a silicon semiconductor while having extremely small off-state current. Therefore, when these transistors are replaced with transistors including an oxide semiconductor, influence on the operation speed of the NOR circuit 500 needs to be taken into consideration.

An input signal A of two signals which are input to the NOR circuit 500 is input to one of a source and a drain of the 8th transistor 508. An input signal B is input to one of a source and a drain of the 3rd transistor 503. A signal AB whose phase is the inverse of that of the input signal A is input to one of a source and a drain of the 6th transistor 506. A signal BB whose phase is the inverse of that of the input signal B is input to one of a source and a drain of the 1st transistor 501.

A gate of the 1st transistor 501 is electrically connected to a gate of the 6th transistor 506. The other of the source and the drain of the 1st transistor 501 is electrically connected to a gate of the 2nd transistor 502. Note that a point where the other of the source and the drain of the 1st transistor 501 and the gate of the 2nd transistor 502 are connected to each other is referred to as a node E. One of a source and a drain of the 2nd transistor 502 is electrically connected to one of a source and a drain of the 5th transistor 505, and the other thereof is electrically connected to one of a source and a drain of the 9th transistor 509, one of a source and a drain of the 4th transistor 504, and one of a source and a drain of the 7th transistor 507.

A gate of the 3rd transistor 503 is electrically connected to a gate of the 8th transistor 508. The other of the source and the drain of the 3rd transistor 503 is electrically connected to a gate of the 4th transistor 504. Note that a point where the other of the source and the drain of the 3rd transistor 503 and the gate of the 4th transistor 504 are connected to each other is referred to as a node B. The other of the source and the drain of the 4th transistor 504 is electrically connected to the other of the source and the drain of the 7th transistor 507, one of a source and a drain of the 10th transistor 510, one of a source and a drain of the 12th transistor 512, and a gate of the 11th transistor 511. Note that a point where the one of the source and the drain of the 4th transistor 504, the one of the source and the drain of the 7th transistor 507, the one of the source and the drain of the 10th transistor 510, the one of the source and the drain of the 12th transistor 512, and the gate of the 11th transistor 511 are connected to each other is referred to as a node A.

A gate of the 5th transistor 505 is electrically connected to the other of the source and the drain of the 6th transistor 506. Note that a point where the gate of the 5th transistor 505 and the other of the source and the drain of the 6th transistor 506 are connected to each other is referred to as a node F. The other of the source and the drain of the 5th transistor 505 is electrically connected to a gate of the 10th transistor 510, one of a source and a drain of the 11th transistor 511, and one of a source and a drain of the 13th transistor 513. Note that a point where the other of the source and the drain of the 5th transistor 505, the gate of the 10th transistor 510, the one of the source and the drain of the 11th transistor 511, and the one of the source and the drain of the 13th transistor 513 are connected to each other is referred to as a node D.

A signal CLKB whose phase is the inverse of that of a clock signal CLK is input to the gate of the 6th transistor 506. A gate of the 7th transistor 507 is electrically connected to the other of the source and the drain of the 8th transistor 508. Note that a point where the gate of the 7th transistor 507 and the other of the source and the drain of the 8th transistor 508 are connected to each other is referred to as a node C. The clock signal CLKB whose phase is the inverse of that of the clock signal CLK is input to the gate of the 8th transistor 508. The clock signal CLK is input to a gate of the 9th transistor 509, and the other of the source and the drain of the 9th transistor 509 is electrically connected to a ground potential GND terminal. Note that a point where the other of the source and the drain of the 9th transistor 509 and the ground potential GND terminal are connected to each other is referred to as a node G.

The other of the source and the drain of the 10th transistor 510, the other of the source and the drain of the 11th transistor 511, the other of the source and the drain of the 12th transistor 512, and the other of the source and the drain of the 13th transistor 513 are electrically connected to each other, and a power supply potential VDD is supplied to a node where they are connected to each other. The clock signal CLK is input to a gate of the 12th transistor 512, and the clock signal CLK is input to a gate of the 13th transistor 513.

The potential of the node A is output as an output signal OUT of the NOR circuit 500. The potential of the node D is output as a signal OUTB whose phase is the inverse of that of the output signal OUT of the NOR circuit 500.

In the NOR circuit 500 of this embodiment, when the gate of the transistor including an oxide semiconductor is closed, the number of paths of leakage current from the power supply potential GND terminal to the power supply potential VDD terminal is one. Therefore, power consumption of the NOR circuit 500 of this embodiment can be suppressed.

The NOR circuit 500 of this embodiment includes the four transistors including an oxide semiconductor and the nine transistors including a silicon semiconductor.

As described above, the leakage current of the transistor including an oxide semiconductor is extremely small. Therefore, even when supply of the power supply potential VDD to the NOR circuit 500 is stopped, charge accumulated between the gate of the 2nd transistor 502 and the other of the source and the drain of the 1st transistor 501 that is the transistor including an oxide semiconductor (i.e., in the node E) is held, for example. Accordingly, in response to restart of the supply of the power supply potential VDD, the NOR circuit 500 can start its operation from the state before the stop of the supply of the power supply potential VDD.

In this manner, the NOR circuit 500 does not lose data even when the supply of the power supply potential VDD is stopped. In other words, the NOR circuit 500 of this embodiment is a nonvolatile memory circuit. Therefore, since data is not lost even when the supply of the power supply potential VDD is stopped, it is possible to stop the supply of the power supply potential VDD when the gates of the transistors including an oxide semiconductor are closed in the NOR circuit 500. Therefore, the power consumption of the nonvolatile NOR circuit 500 can be reduced.

Further, in the NOR circuit 500 of this embodiment, the transistor including an oxide semiconductor and the transistor including a silicon semiconductor can be stacked (which is described later). Therefore, it is possible to reduce the area of the NOR circuit 500.

<Operation of NOR Circuit 500>

Figure 18:
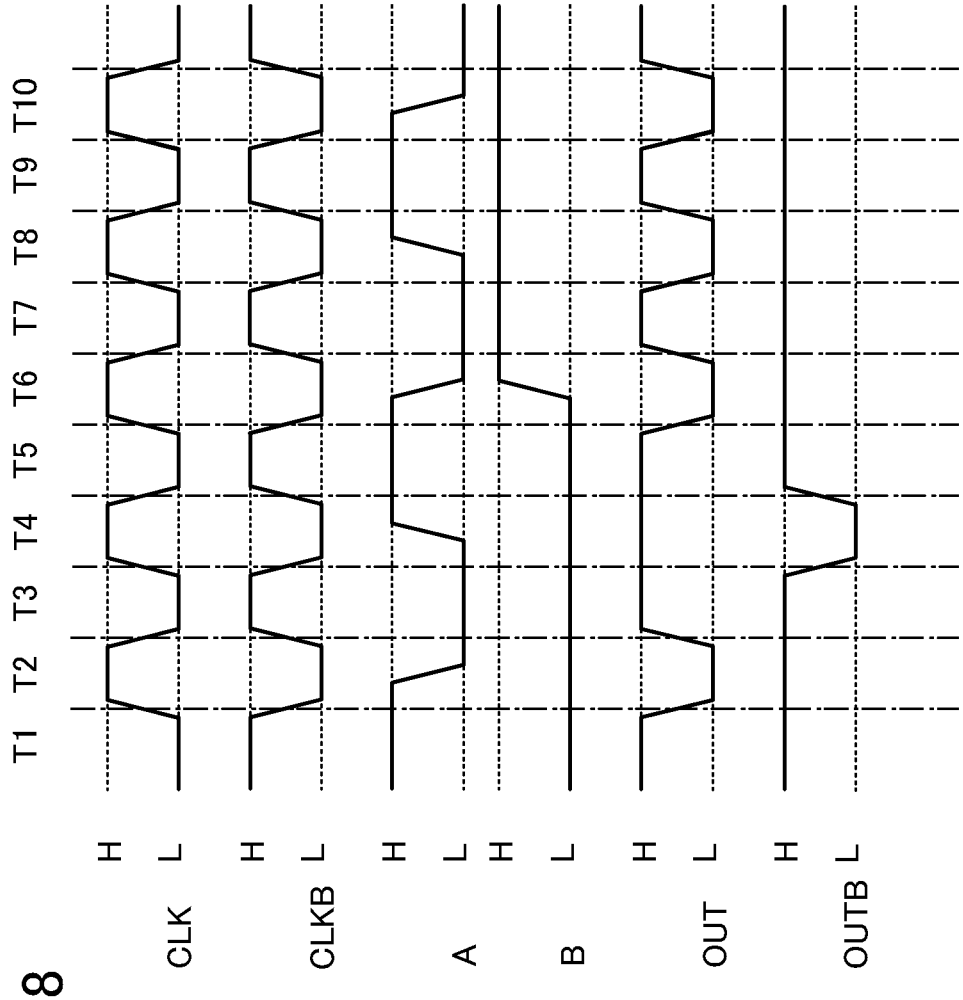
FIG. 18 is a timing chart of a NOR circuit according to Embodiment 4.
Figure 19:
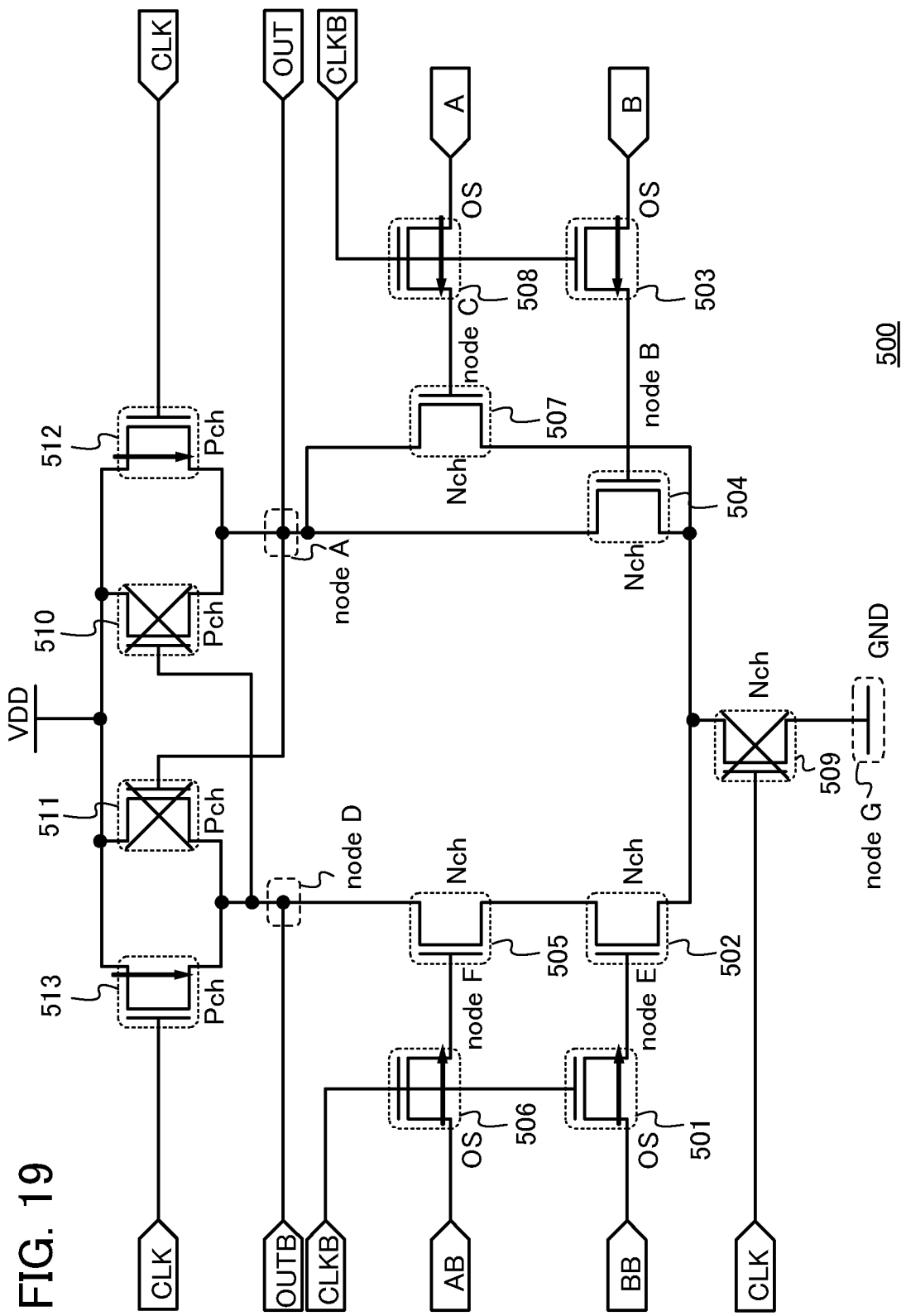
FIG. 19 illustrates operation of a NOR circuit according to Embodiment 4.
Figure 20:
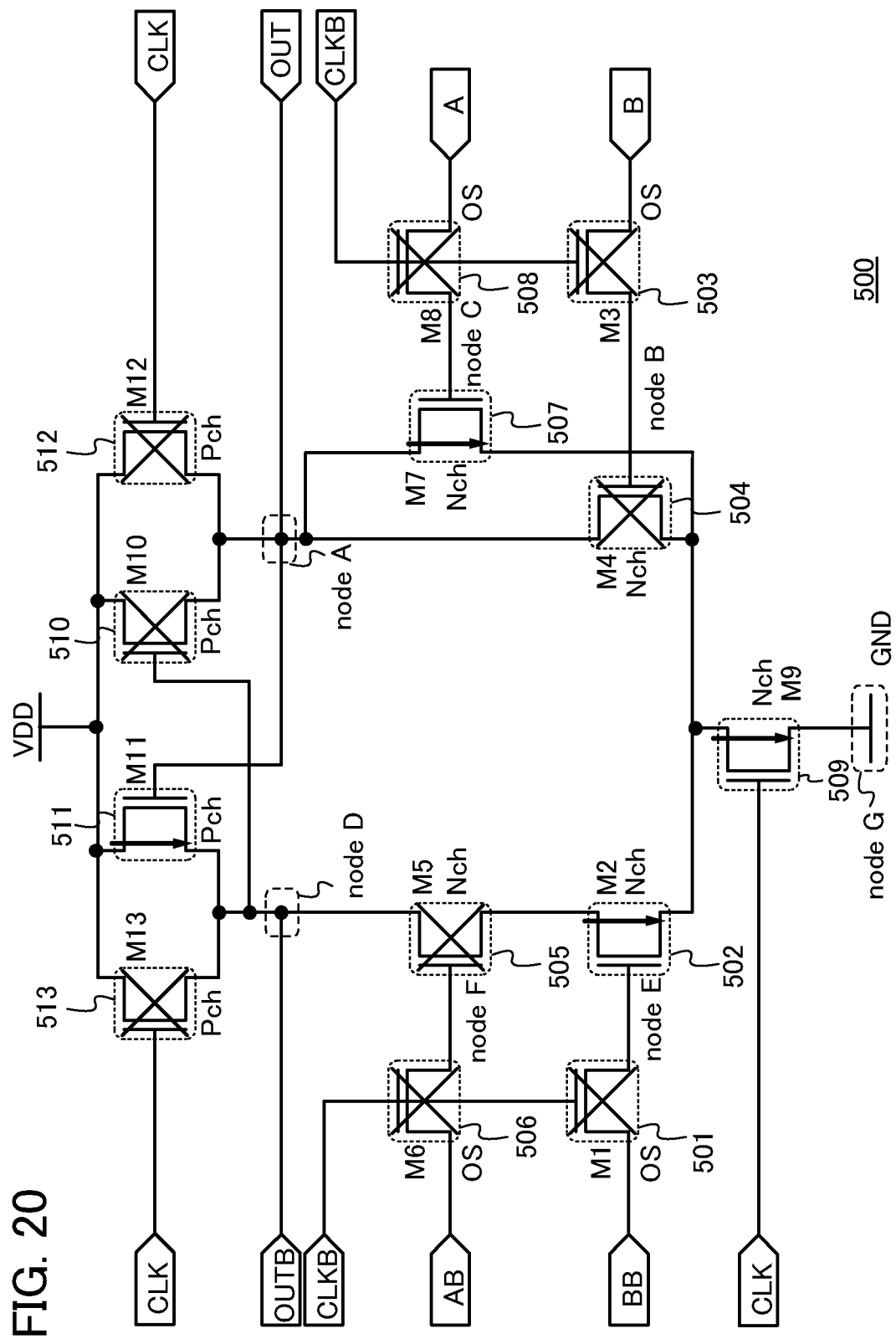
FIG. 20 illustrates operation of a NOR circuit according to Embodiment 4.
Figure 21:
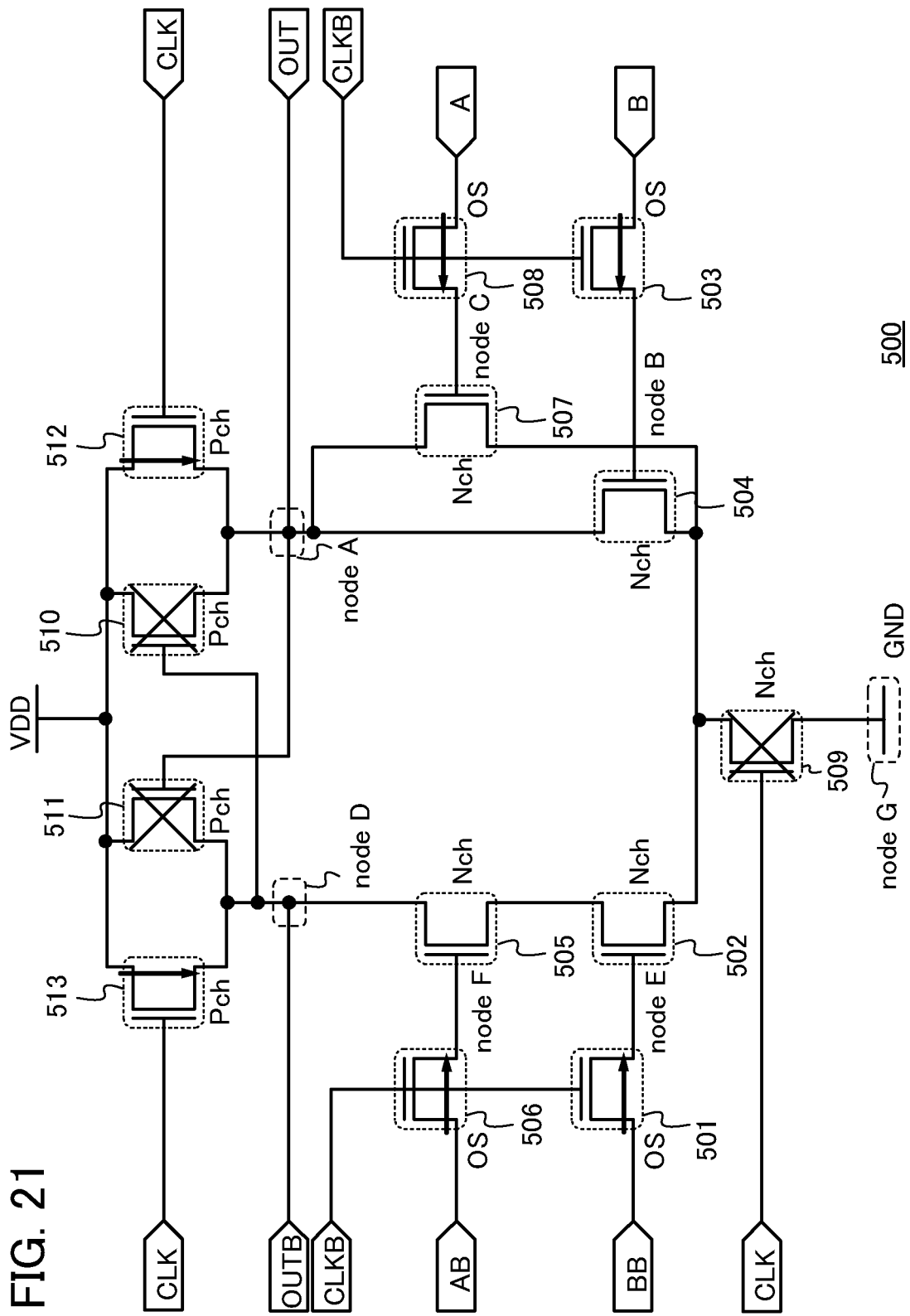
FIG. 21 illustrates operation of a NOR circuit according to Embodiment 4.
Figure 22:
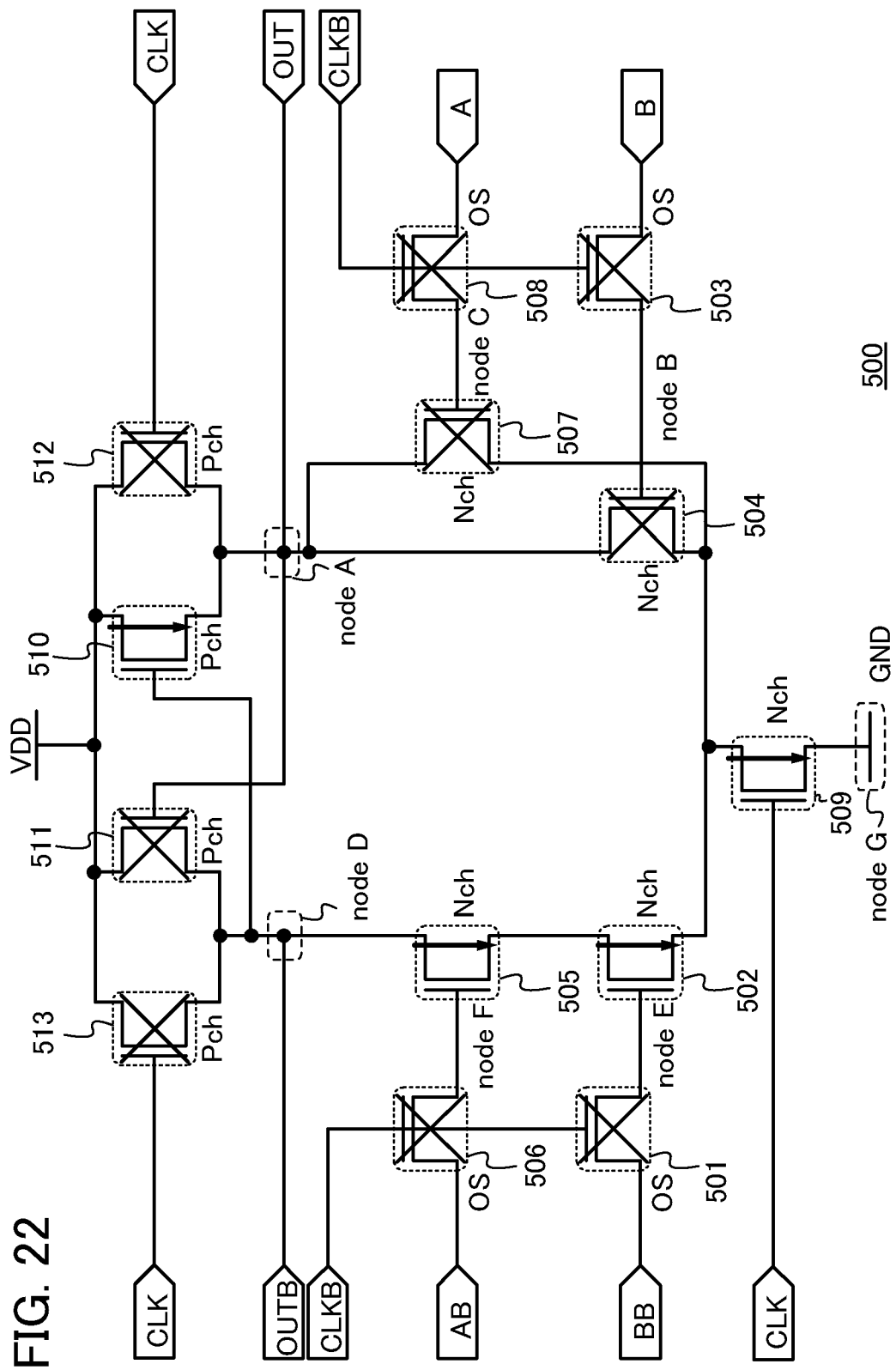
FIG. 22 illustrates operation of a NOR circuit according to Embodiment 4.

The operation of the NOR circuit 500 of this embodiment is described with reference to FIG. 18, FIG. 19, FIG. 20, FIG. 21, and FIG. 22. FIG. 18 shows a timing chart of the NOR circuit 500. In the timing chart in FIG. 18, a period T1, a period T2, a period T3, a period T4, a period T5, a period T6, a period T7, a period T8, a period T9, and a period T10 are separately illustrated. FIG. 19, FIG. 20, FIG. 21, and FIG. 22 show operation states of the NOR circuit 500 in the period T1, the period T2, the period T3, and the period T4, respectively.

The NOR circuit 500 is a clock synchronization circuit and functions as a NOR circuit when the same clock signal CLK is input to the 9th transistor 509, the 12th transistor 512, and the 13th transistor 513. Note that the output signal OUT is determined only in the period T2, the period T4, the period T6, the period T8, and the period T10, in which the 9th transistor 509 is on in synchronization with the clock signal CLK.

<Period T1 (see FIG. 19)>

First, as shown in the period T1 in FIG. 18, a case where the input signal A and the input signal B have the H potential (VDD) and L potential (VSS), respectively, is given. At this time, the clock signal CLK has the L potential (VSS), and thus the L potential (VSS) is applied to the gate of the 12th transistor 512 and the gate of the 13th transistor 513. Accordingly, the 12th (p-channel) transistor 512 and the 13th (p-channel)

transistor 513 are turned on. At this time, the H potential (VDD) flows into the node A and the node D (precharge operation). The 12th transistor 512 and the 13th transistor 513 are provided to control whether the node A and the node D are charged with the H potential (VDD).

The signal CLKB whose phase is the inverse of that of the clock signal CLK has the H potential (VDD), and thus, the 3rd transistor 503 and the 8th transistor 508 are turned on. Accordingly, the gate of the 4th transistor 504 (the node B) is charged with the L potential (VSS) that is equivalent to that of the input signal B, and the gate of the 7th transistor 507 (the node C) is charged with the H potential (VDD) that is equivalent to that of the input signal A.

Further, since the signal CLKB whose phase is the inverse of that of the clock signal CLK has the H potential (VDD), the 1st transistor 501 and the 6th transistor 506 are turned on. Accordingly, the gate of the 2nd transistor 502 (the node E) is charged with the H potential (VDD) that is equivalent to that of the signal BB whose phase is the inverse of that of the input signal B, and the gate of the 5th transistor 505 (the node F) is charged with the L potential (VSS) that is equivalent to that of the signal AB whose phase is the inverse of that of the input signal A.

As described above, in the period T1, the node B, the node C, the node E, and the node F are charged with the potentials corresponding to the input signal A and the potentials corresponding to the input signal B, and the node A and the node D are charged with the H potential (VDD).

<Period T2 (see FIG. 20)>

Next, as shown in the period T2 in FIG. 18, the clock signal CLK has the H potential (VDD), and thus the H potential (VDD) is applied to the gate of the 12th transistor 512, the gate of the 13th transistor 513, and the gate of the 9th transistor 509. At this time, the 12th (p-channel) transistor 512 and the 13th (p-channel) transistor 513 are turned off. Since the 12th transistor 512 is turned off, the H potential (VDD) is not supplied to the node A. Therefore, the node A keeps the H potential (VDD). In addition, since the 13th transistor 513 is turned off, the H potential (VDD) is not supplied to the node D. Therefore, the node D keeps the H potential (VDD).

The 9th (n-channel) transistor 509 is turned on.

On the other hand, the signal CLKB whose phase is the inverse of that of the clock signal CLK has the L potential (VSS), and thus the 3rd (n-channel) transistor 503 and the 8th (n-channel) transistor 508 are turned off. Since charge corresponding to the L potential (VSS) is accumulated in the node B, when the 3rd transistor 503 is off, the charge corresponding to the L potential (VSS) is held in the node B (charge holding operation). Further, the 4th transistor 504 is turned off in response to the potential of the node B. Since charge corresponding to the H potential (VDD) is accumulated in the node C, when the 8th transistor 508 is off, the charge corresponding to the H potential (VDD) is held in the node C (charge holding operation). Further, the 7th transistor 507 is turned on in response to the potential of the node C.

In a similar manner, since the signal CLKB whose phase is the inverse of that of the clock signal CLK has the L potential (VSS), the 1st (n-channel) transistor 501 and the 6th (n-channel) transistor 506 are turned off. Since charge corresponding to the H potential (VDD) is accumulated in the node E, when the 1st transistor 501 is off, the charge corresponding to the H potential (VDD) is held in the node E (charge holding operation). Further, the 2nd transistor 502 is turned on in response to the potential of the node E. Since charge corresponding to the L potential (VSS) is accumulated in the node F, when the 6th transistor 506 is off, the charge corresponding to the L potential (VSS) is held in the node F (charge holding operation). Further, the 5th transistor 505 is turned off in response to the potential of the node F.

At this time, since the 4th transistor 504 and the 7th transistor 507 are electrically connected to each other in parallel, a current path from the node A to the node G is formed. Therefore, charge corresponding to the H potential (VDD), which is accumulated in the node A, is extracted to the reference potential (GND) of the node G through the on-state 7th transistor 507 and the on-state 9th transistor 509. That is, current flows from the node A to the node G Since the 2nd transistor 502 and the 5th transistor 505 are electrically connected to each other in series, a current path from the node D to the node G is not formed. At this time, the potential of the node A is determined, and the output signal OUT has the L potential (VSS).

Since current flows from the node A to the node G, the potential of the node A is gradually reduced from the H potential (VDD) to the L potential (VSS). As a result, the L potential (VSS) is applied to the gate of the 11th transistor 511, so that the 11th transistor (p-channel) 511 is turned on. The H potential (VDD) is supplied to the node D through the on-state 11th transistor 511.

The 10th transistor 510 and the 11th transistor 511 have functions of compensating the potentials of the node A and the node D. "Compensating the potentials of the node A and the node D" means that, for example, when the node A has the L potential (VSS), the 11th transistor 511 supplies the H potential (VDD) to the node D. For example, when the node D has the L potential (VSS), the 10th transistor 110 supplies the H potential (VDD) to the node A. That is, when one of the node A and the node D has the L potential (VSS), the H potential (VDD) is supplied to the other of the node A and the node D.

Note that the potential of the node A and the potential of the node D depend on the on state and the off state of the 9th transistor 509. In other words, the potential of the output signal OUT is determined only when the clock signal CLK has the H potential (VDD). Accordingly, the potential of the output signal OUT of the NOR circuit 500 is determined in the period T2, the period T4, the period T6, the period T8, and the period T10 in the timing chart of FIG. 18.

In this manner, in the period T2, the output signal OUT having the L potential (VSS) is determined in response to the input of the input signal A having the H potential (VDD) and the input of the input signal B having the L potential (VSS).

As described above, the 10th transistor 510 and the 11th transistor 511 each have a function of compensating a potential, and the 12th transistor 512 and the 13th transistor 513 each have charging function. Accordingly, these four transistors have a function as a comparator which continuously compares the potential of the node A with the potential of the node D and supplies the H potential (VDD) to the node opposite to the node having the L potential (VSS).

In addition, the 9th transistor 509 has discharging function. The potential of the node A or the potential of the node D is extracted to the reference potential (GND) of the node G through the on-state 9th transistor 509. As a result, only when the 9th transistor 509 is on (the clock signal CLK has the H potential (VDD)), the potential of the output signal OUT is determined. Therefore, the 9th transistor 509 also has a function of determining a definitive potential of the output signal OUT (a function of determining a potential).

<Period T3 (see FIG. 21)>

Next, as shown in the period T3 in FIG. 18, a case where the input signal A and the input signal B have the L potential (VSS) is given. At this time, the clock signal CLK has the L potential (VSS), and thus the L potential (VSS) is applied to the gate of the 12th transistor 512 and the gate of the 13th transistor 513. Accordingly, the 12th (p-channel) transistor 512 and the 13th (p-channel) transistor 513 are turned on. At this time, the H potential (VDD) flows into the node A and the node D (precharge operation).

The signal CLKB whose phase is the inverse of that of the clock signal CLK has the H potential (VDD), and thus, the 3rd transistor 503 and the 8th transistor 508 are turned on. Accordingly, the gate of the 4th transistor 504 (the node B) is charged with the L potential (VSS) that is equivalent to that of the input signal B, and the gate of the 7th transistor 507 (the node C) is charged with the L potential (VSS) that is equivalent to that of the input signal A.

Further, since the signal CLKB whose phase is the inverse of that of the clock signal CLK has the H potential (VDD), the 1st transistor 501 and the 6th transistor 506 are turned on. Accordingly, the gate of the 2nd transistor 502 (the node E) is charged with the H potential (VDD) that is equivalent to that of the signal BB whose phase is the inverse of that of the input signal B, and the gate of the 5th transistor 505 (the node F) is charged with the H potential (VDD) that is equivalent to that of the signal AB whose phase is the inverse of that of the input signal A.

As described above, in the period T3, the node B, the node C, the node E, and the node F are charged with the potentials corresponding to the input signal A and the potentials corresponding to the input signal B, and the node A and the node D are charged with the H potential (VDD).

<Period T4 (see FIG. 22)>

Next, as shown in the period T4 in FIG. 18, the clock signal CLK has the H potential (VDD), and thus the H potential (VDD) is applied to the gate of the 12th transistor 512, the gate of the 13th transistor 513, and the gate of the 9th transistor 509. At this time, the 12th (p-channel) transistor 512 and the 13th (p-channel) transistor 513 are turned off. Since the 12th transistor 512 is turned off, the H potential (VDD) is not supplied to the node A. Therefore, the node A keeps the H potential (VDD). In addition, since the 13th transistor 513 is turned off, the H potential (VDD) is not supplied to the node D. Therefore, the node D keeps the H potential (VDD).

The 9th (n-channel) transistor 509 is turned on.

On the other hand, the signal CLKB whose phase is the inverse of that of the clock signal CLK has the L potential (VSS), and thus the 3rd (n-channel) transistor 503 and the 8th (n-channel) transistor 508 are turned off. Since charge corresponding to the L potential (VSS) is accumulated in the node B, when the 3rd transistor 503 is off, the charge corresponding to the L potential (VSS) is held in the node B (charge holding operation). Further, the 4th transistor 504 is turned off in response to the potential of the node B. Since charge corresponding to the L potential (VSS) is accumulated in the node C, when the 8th transistor 508 is off, the charge corresponding to the L potential (VSS) is held in the node C (charge holding operation). Further, the 7th transistor 507 is turned off in response to the potential of the node C.

In a similar manner, since the signal CLKB whose phase is the inverse of that of the clock signal CLK has the L potential (VSS), the 1st (n-channel) transistor 501 and the 6th (n-channel) transistor 506 are turned off. Since charge corresponding to the H potential (VDD) is accumulated in the node E, when the 1st transistor 501 is off, the charge corresponding to the H potential (VDD) is held in the node E (charge holding operation). Further, the 2nd transistor 502 is turned on in response to the potential of the node E. Since charge corresponding to the H potential (VDD) is accumulated in the node F, when the 6th transistor 506 is off, the charge corresponding to the H potential (VDD) is held in the node F (charge holding operation). Further, the 5th transistor 505 is turned on in response to the potential of the node F.

Since the 2nd transistor 502 and the 5th transistor 505 are electrically connected to each other in series, a current path from the node D to the node G is formed when the 2nd transistor 502 and the 5th transistor 505 are on. That is, current flows from the node D to the node G. Therefore, charge corresponding to the H potential (VDD), which is accumulated in the node D, is extracted to the reference potential (GND) of the node G through the on-state 5th transistor 505, the on-state 2nd transistor 502, and the on-state 9th transistor 509. On the other hand, since the 4th transistor 504 and the 7th transistor 507 are electrically connected to each other in parallel, a current path from the node A to the node G is not formed.

Since current flows from the node D to the node G, the potential of the node A is gradually reduced from the H potential (VDD) to the L potential (VSS). At this time, the potential of the node D is determined, and the output signal OUTB whose phase is the inverse of that of the output signal OUT has the L potential (VSS). As a result, the L potential (VSS) is applied to the gate of the 10th transistor 510, so that the 10th transistor (p-channel) 510 is turned on. The H potential (VDD) is supplied to the node A through the on-state 10th transistor 510. At this time, the potential of the node A is determined, and the output signal OUT has the H potential (VDD).

The 10th transistor 510 and the 11th transistor 511 have functions of compensating the potentials of the node A and the node D. "Compensating the potentials of the node A and the node D" means that, for example, when the node A has the L potential (VSS), the 11th transistor 511 supplies the H potential (VDD) to the node D. For example, when the node D has the L potential (VSS), the 10th transistor 510 supplies the H potential (VDD) to the node A. That is, when one of the node A and the node D has the L potential (VSS), the H potential (VDD) is supplied to the other of the node A and the node D.

Note that the potential of the node A and the potential of the node D depend on the on state and the off state of the 9th transistor 509. In other words, the potential of the output signal OUT is determined only when the clock signal CLK has the H potential (VDD). Accordingly, the potential of the output signal OUT of the NOR circuit 500 is determined in the period T2, the period T4, the period T6, the period T8, and the period T10 in the timing chart of FIG. 18.

In this manner, in the period T4, the output signal OUT having the H potential (VDD) is determined in response to the input of the input signal A having the L potential (VSS) and the input of the input signal B having the L potential (VSS).

The 7th transistor 507 whose gate corresponds to the node C having a potential corresponding to the input signal A and the 4th transistor 504 whose gate corresponds to the node B having a potential corresponding to the input signal B are electrically connected to each other in parallel. Therefore, when the H potential (VDD) is input as either of the input signals, a current path from the node A to the node G is always formed. On the other hand, since the 2nd transistor 502 and the 5th transistor 505 are electrically connected to each other in series, a current path from the node D to the node G is not formed when the H potential (VDD) is input as either of the input signals; the current path is formed only when the L potential (VSS) is input as both of the input signals.

In other words, when the H potential (VDD) is input to either of the input signals, the potential of the node A is always the L potential (VSS). Therefore, at this time, the potential of the output signal OUT is always the L potential (VSS). When the L potential (VSS) is input as both of the input signals, the potential of the node D is always the L potential (VSS). Since a potential which is opposite to the potential of the node D is supplied to the node A, the potential of the output signal OUT is always the H potential (VDD) at this time. The NOR circuit is configured to operate in this manner.

Operations in the period T5 and the period T6 are similar to those in the period T1 and the period T2. Operations in the period T7 and the period T8 correspond to those in the period T1 and the period T2 in the case where the L potential (VSS) and the H potential (VDD) are input as the input signal A and the input signal B, respectively. Operations in the period T9 and the period T10 correspond to those in the period T3 and the period T4 in the case where the H potential (VDD) is input as the input signal A and the input signal B.

According to this embodiment, increase in the number of paths of leakage current in the NOR circuit can be suppressed. Accordingly, the power consumption of the NOR circuit can be reduced.

According to this embodiment, the NOR circuit can hold data even when power supply is stopped.

According to this embodiment, it is possible to stack the transistor including an oxide semiconductor and the transistor including a silicon semiconductor in the NOR circuit; therefore, the area of the circuit can be reduced.

This embodiment can be implemented in combination with any of the other embodiments in this specification as appropriate.

Embodiment 5

In this embodiment, another structure of a NOR circuit which has a data holding function and whose power consumption is reduced will be described with reference to FIG. 23, FIG. 24, FIG. 25, FIG. 26, FIG. 27, and FIG. 28.

<Structure of NOR Circuit 600>

Figure 23:
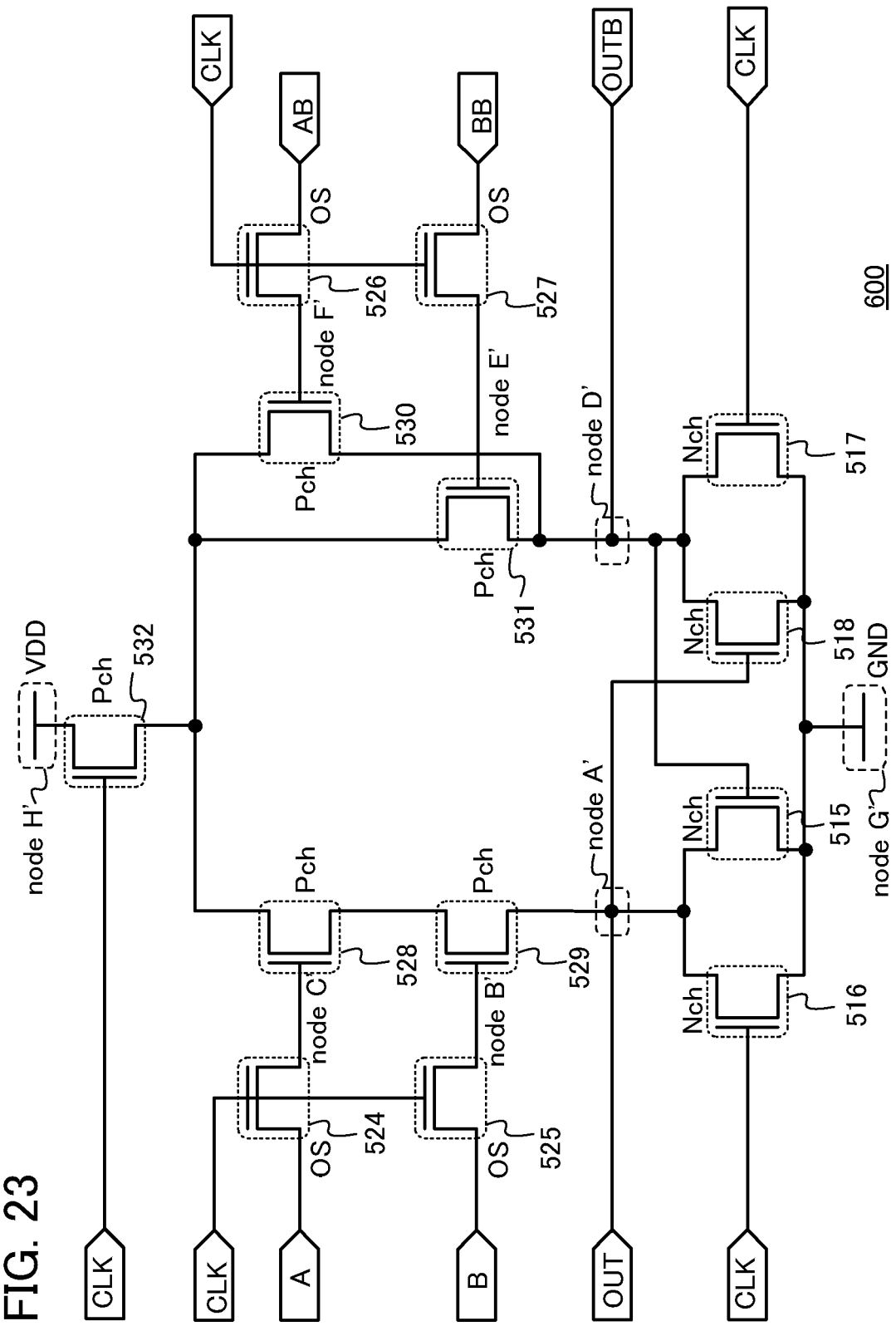
FIG. 23 illustrates a NOR circuit according to Embodiment 5.

FIG. 23 is a circuit diagram of a NOR circuit of this embodiment. A NOR circuit 600 illustrated in FIG. 23 includes a 15th transistor 515, a 16th transistor 516, a 17th transistor 517, an 18th transistor 518, a 24th transistor 524, a 25th transistor 525, a 26th transistor 526, a 27th transistor 527, a 28th transistor 528, a 29th transistor 529, a 30th transistor 530, a 31st transistor 531, and a 32nd transistor 532.

P-channel transistors are used as the following five transistors: the 28th transistor 528, the 29th transistor 529, the 30th transistor 530, the 31st transistor 531, and the 32nd transistor 532. N-channel transistors are used as the following four transistors: the 15th transistor 515, the 16th transistor 516, the 17th transistor 517, and the 18th transistor 518.

Transistors in which channels are formed in oxide semiconductor layers are used as the following four transistors: the 24th transistor 524, the 25th transistor 525, the 26th transistor 526, and the 27th transistor 527. The transistor including an oxide semiconductor has an advantage of extremely small leakage current (also referred to as off-state current). Note that the transistor including an oxide semiconductor is an n-channel transistor.

Transistors in which channels are formed in silicon layers are used as the following nine transistors: the 15th transistor 515, the 16th transistor 516, the 17th transistor 517, the 18th transistor 518, the 28th transistor 528, the 29th transistor 529, the 30th transistor 530, the 31st transistor 531, and the 32nd transistor 532. The silicon layers may be each a single crystal silicon layer, a microcrystalline silicon layer, or an amorphous silicon layer.

Note that all or some of the four transistors, the 15th transistor 515, the 16th transistor 516, the 17th transistor 517, and the 18th transistor 518 may be replaced with transistors including an oxide semiconductor. However, a transistor including an oxide semiconductor has a slower operation speed than a transistor including a silicon semiconductor while having extremely small off-state current. Therefore, when these transistors are replaced with transistors including an oxide semiconductor, influence on the operation speed of the NOR circuit 600 needs to be taken into consideration.

An input signal A of two signals which are input to the NOR circuit 600 is input to one of a source and a drain of the 24th transistor 524. An input signal B is input to one of a source and a drain of the 25th transistor 525. A signal AB whose phase is the inverse of that of the input signal A is input to one of a source and a drain of the 26th transistor 526. A signal BB whose phase is the inverse of that of the input signal B is input to one of a source and a drain of the 24th transistor 524.

A gate of the 25th transistor 525 is electrically connected to a gate of the 24th transistor 524. The other of the source and the drain of the 25th transistor 525 is electrically connected to a gate of the 29th transistor 529. Note that a point where the other of the source and the drain of the 25th transistor 525 and the gate of the 29th transistor 529 are connected to each other is referred to as a node B'. One of a source and a drain of the 29th transistor 529 is electrically connected to one of a source and a drain of the 28th transistor 528, and the other thereof is electrically connected to a gate of the 18th transistor 518, one of a source and a drain of the 15th transistor 515, and one of a source and a drain of the 16th transistor 516. Note that a point where the other of the source and the drain of the 29th transistor 529, the gate of the 18th transistor 518, the one of the source and the drain of the 15th transistor 515, and the one of the source and the drain of the 16th transistor 516 are connected to each other is referred to as a node A'.

A clock signal CLK is input to a gate of the 24th transistor 524. The clock signal CLK is input to a gate of the 26th transistor 526. The clock signal CLK is input to a gate of the 32nd transistor 532.

A gate of the 27th transistor 527 is electrically connected to a gate of the 26th transistor 526. The other of the source and the drain of the 27th transistor 527 is electrically connected to a gate of the 31st transistor 531. Note that a point where the other of the source and the drain of the 27th transistor 527 and the gate of the 31st transistor 531 are connected to each other is referred to as a node E'.

One of a source and a drain of the 31st transistor 531 is electrically connected to one of a source and a drain of the 30th transistor 530, one of a source and a drain of the 32nd transistor 532, and the other of the source and the drain of the 28th transistor 528. The other of the source and the drain of the 31st transistor 531 is electrically connected to the other of the source and the drain of the 30th transistor 530, one of a source and a drain of the 17th transistor 517, one of a source and a drain of the 18th transistor 518, and a gate of the 15th transistor 515. Note that a point where the other of the source and the drain of the 31st transistor 531, the other of the source and the drain of the 30th transistor 530, the one of the source and the drain of the 17th transistor 517, the one of the source and the drain of the 18th transistor 518, and the gate of the 15th transistor 515 are connected to each other is referred to as a node D'.

A gate of the 30th transistor 530 is electrically connected to the other of the source and the drain of the 26th transistor 526. Note that a point where the gate of the 30th transistor 530 and the other of the source and the drain of the 26th transistor 526 are connected to each other is referred to as a node F'.

A gate of the 28th transistor 528 is electrically connected to the other of the source and the drain of the 24th transistor 524. Note that a point where the gate of the 28th transistor 528 and the other of the source and the drain of the 24th transistor 524 are connected to each other is referred to as a node C'.

The other of the source and the drain of the 15th transistor 515, the other of the source and the drain of the 16th transistor 516, the other of the source and the drain of the 17th transistor 517, and the other of the source and the drain of the 18th transistor 518 are electrically connected to each other, and they are electrically connected to a ground potential GND terminal. Note that a point where the other of the source and the drain of the 15th transistor 515, the other of the source and the drain of the 16th transistor 516, the other of the source and the drain of the 17th transistor 517, the other of the source and the drain of the 18th transistor 518, and the ground potential GND terminal are connected to each other is referred to as a node G'.

The other of the source and the drain of the 32nd transistor 532 is supplied with a power supply potential VDD. Note that a point where the other of the source and the drain of the 32nd transistor 532 and a power supply potential VDD terminal are connected to each other is referred to as a node H'. The clock signal CLK is input to a gate of the 16th transistor 516 and a gate of the 17th transistor 517.

The potential of the node A' is output as an output signal OUT of the NOR circuit 600. The potential of the node D' is output as a signal OUTB whose phase is the inverse of that of the output signal OUT of the NOR circuit 600.

In the NOR circuit 600 of this embodiment, when the gates of the transistors including an oxide semiconductor are closed, there is only one path of leakage current, which goes from the power supply potential VDD terminal to the ground potential GND terminal Consequently, the power consumption of the NOR circuit 600 can be reduced.

The NOR circuit 600 of this embodiment includes the four transistors including an oxide semiconductor and the nine transistors including a silicon semiconductor.

As described above, the leakage current of the transistor including an oxide semiconductor is extremely small. Therefore, even when supply of the power supply potential VDD to the NOR circuit 600 is stopped, charge accumulated between the gate of the 28th transistor 528 and the other of the source and the drain of the 24th transistor 524 that is the transistor including an oxide semiconductor (i.e., in the node C') is held, for example. Accordingly, in response to restart of the supply of the power supply potential VDD, the NOR circuit 600 can start its operation from the state before the stop of the supply of the power supply potential VDD.

In this manner, the NOR circuit 600 does not lose data even when the supply of the power supply potential VDD is stopped. In other words, the NOR circuit 600 of this embodiment is a nonvolatile memory circuit. Since data is not lost even when the supply of the power supply potential VDD is stopped, it is possible to stop the supply of the power supply potential VDD when the gates of the transistors including an oxide semiconductor are closed in the NOR circuit 600. Therefore, the power consumption of the nonvolatile NOR circuit 600 can be reduced.

Further, in the NOR circuit 600 of this embodiment, the transistor including an oxide semiconductor and the transistor including a silicon semiconductor can be stacked (which is described later). Therefore, it is possible to reduce the area of the NOR circuit 600.

<Operation of NOR Circuit 600>

Figure 24:
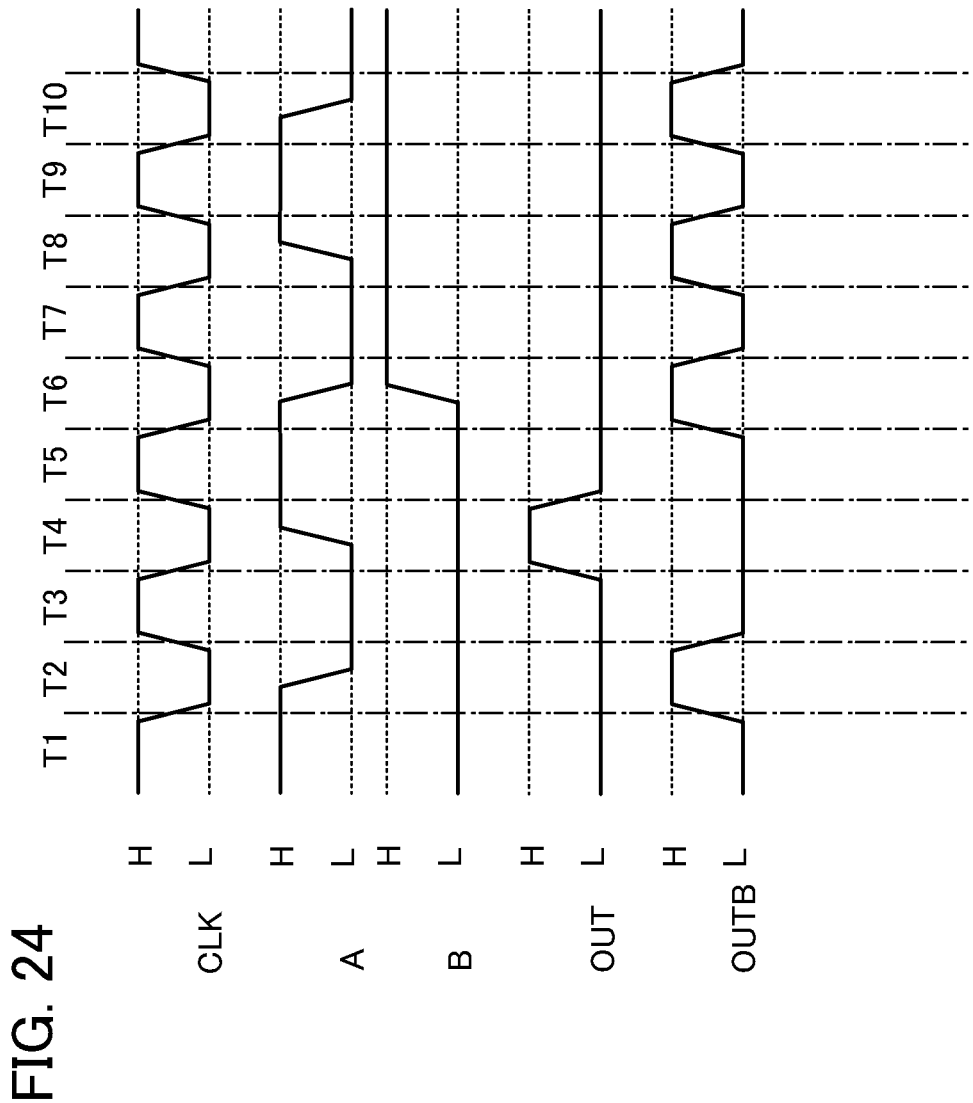
FIG. 24 is a timing chart of a NOR circuit according to Embodiment 5.
Figure 25:
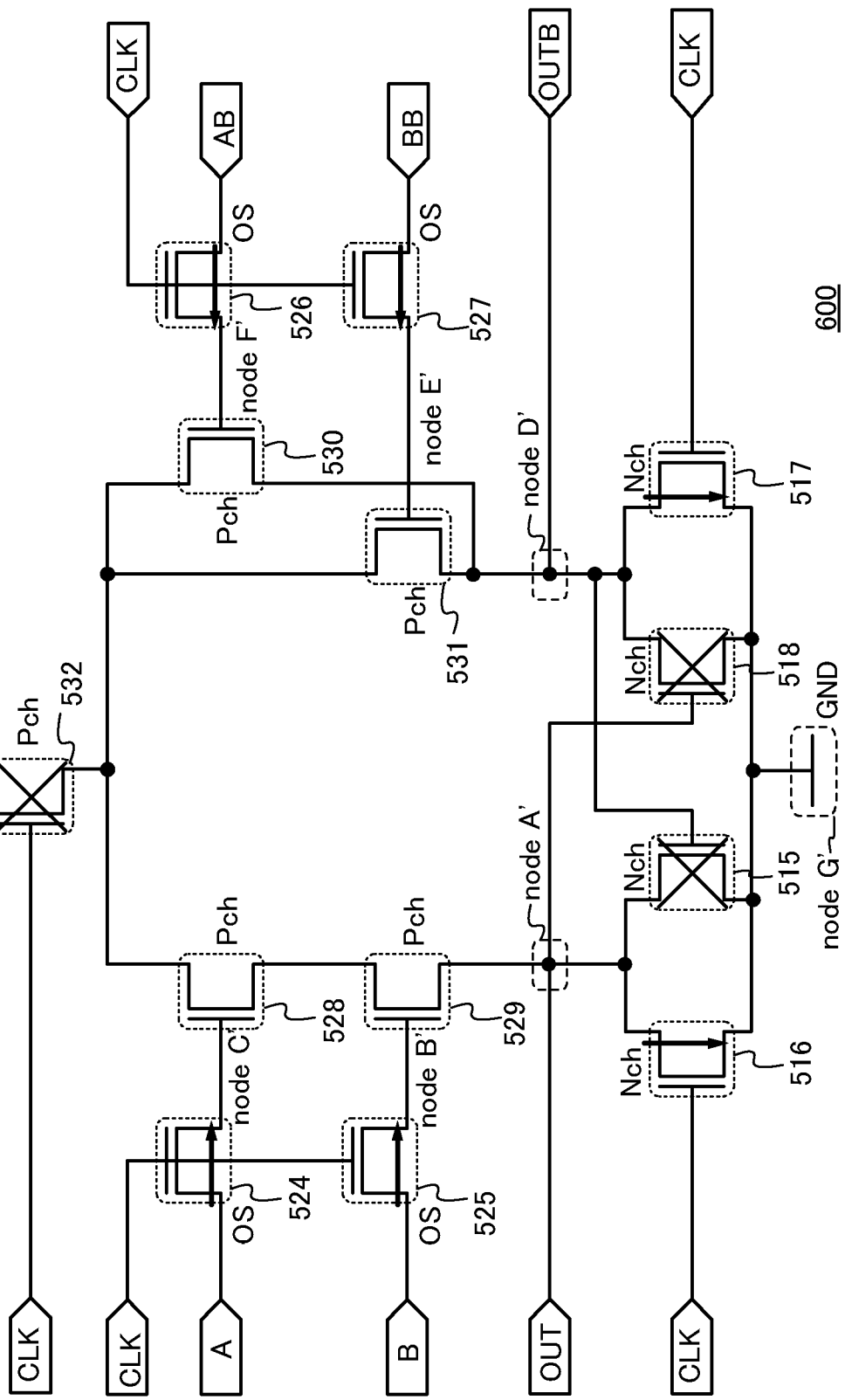
FIG. 25 illustrates operation of a NOR circuit according to Embodiment 5.
Figure 26:
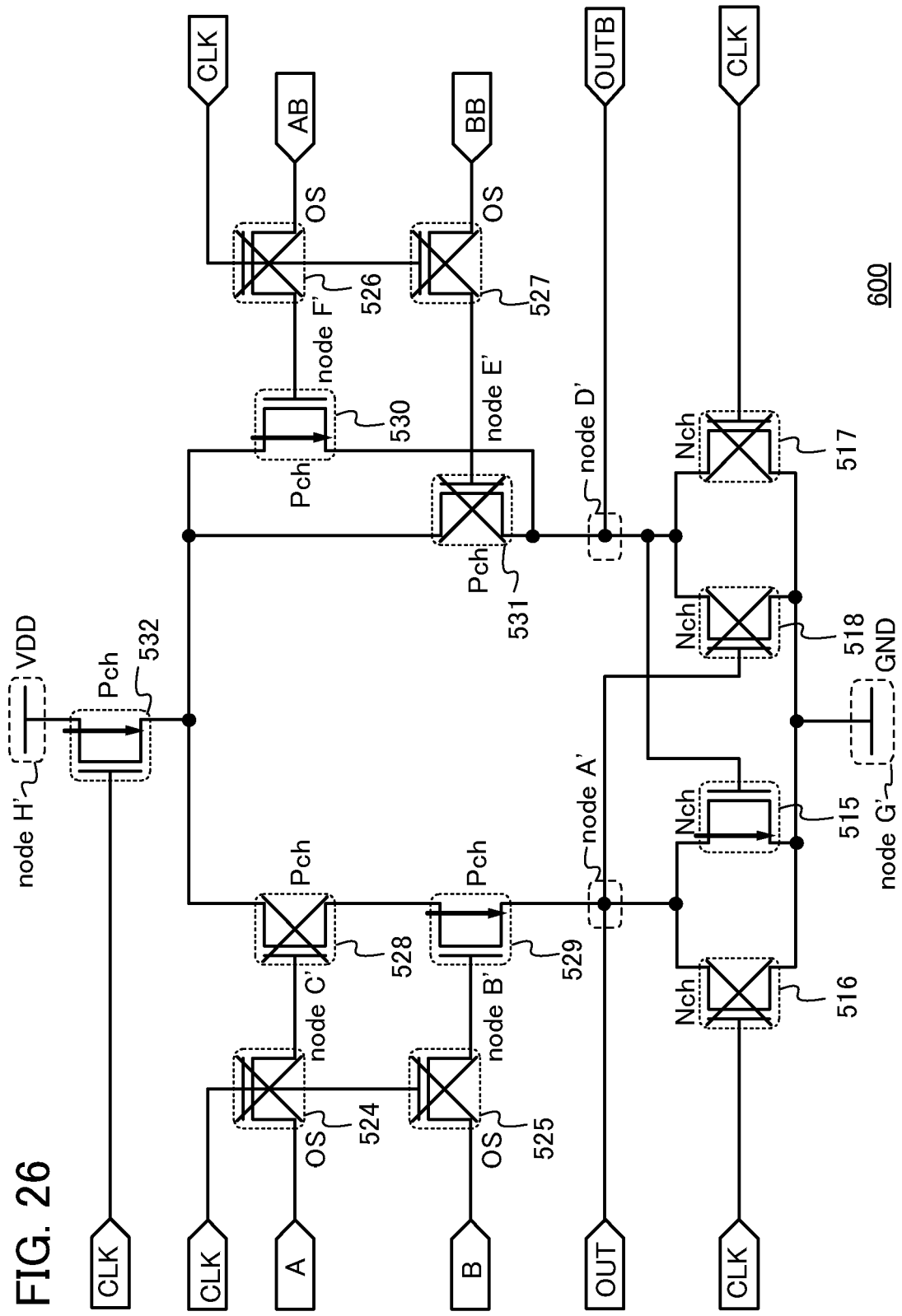
FIG. 26 illustrates operation of a NOR circuit according to Embodiment 5.
Figure 27:
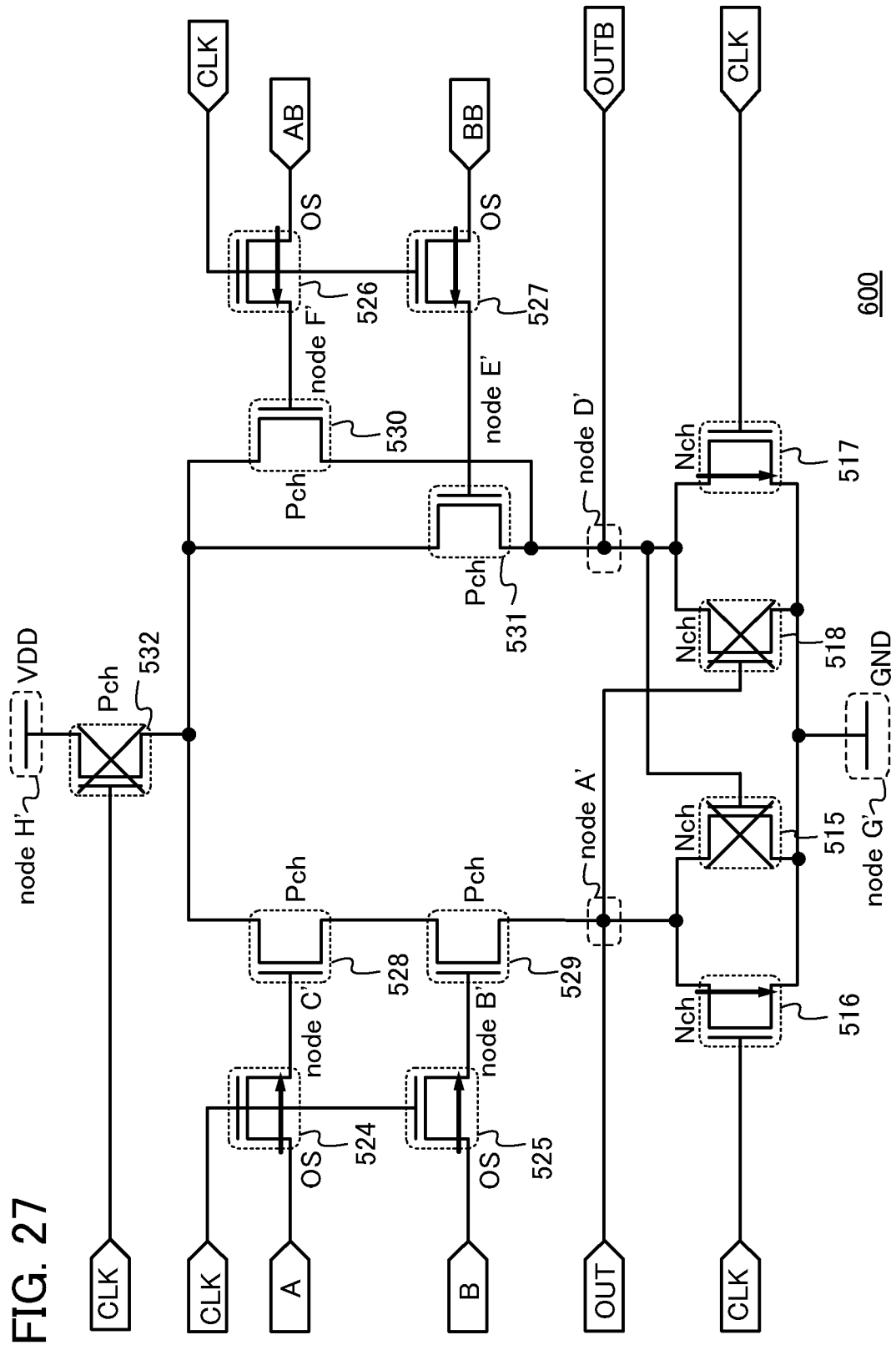
FIG. 27 illustrates operation of a NOR circuit according to Embodiment 5.
Figure 28:
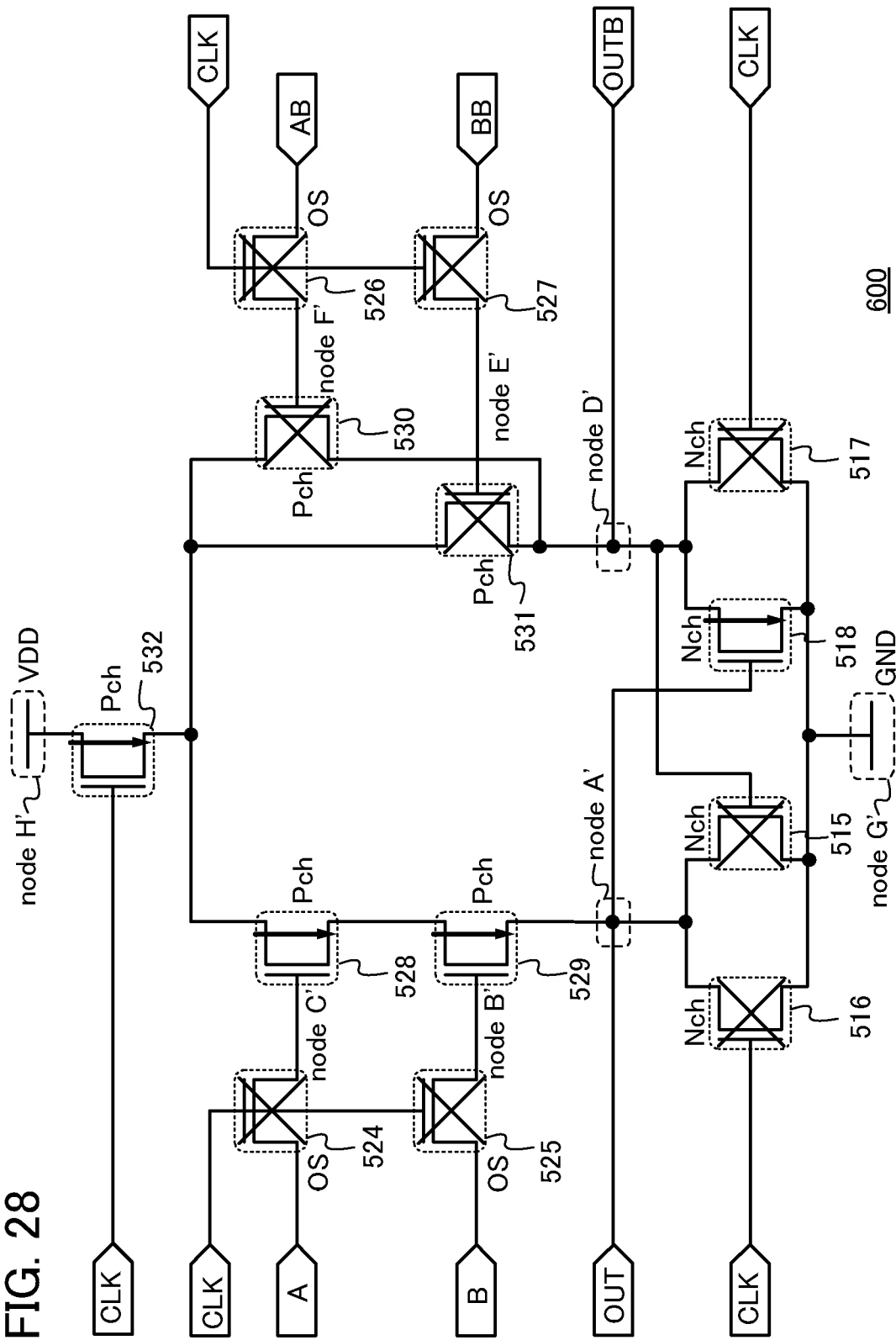
FIG. 28 illustrates operation of a NOR circuit according to Embodiment 5.

The operation of the NOR circuit 600 of this embodiment is described with reference to FIG. 24, FIG. 25, FIG. 26, FIG. 27, and FIG. 28. FIG. 24 shows a timing chart of the NOR circuit 600. In the timing chart in FIG. 24, a period T1, a period T2, a period T3, a period T4, a period T5, a period T6, a period T7, a period T8, a period T9, and a period T10 are separately illustrated. FIG. 25, FIG. 26, FIG. 27, and FIG. 28 show operation states of the NOR circuit 600 in the period T1, the period T2, the period T3, and the period T4, respectively.

The NOR circuit 600 is a clock synchronization circuit and functions as a NOR circuit when the same clock signal CLK is input to the 16th transistor 516, the 17th transistor 517, the 24th transistor 524, the 26th transistor 526, and the 32nd transistor 532. Note that the output signal OUT is determined only in the period T2, the period T4, the period T6, the period T8, and the period T10, in which the 32nd transistor 532 is on in synchronization with the clock signal CLK.

<Period T1 (see FIG. 25)>

First, as shown in the period T1 in FIG. 24, a case where the input signal A and the input signal B have the H potential (VDD) and L potential (VSS), respectively, is given. At this time, the clock signal CLK has the L potential (VSS), and thus the H potential (VDD) is applied to the gate of the 16th transistor 516 and the gate of the 17th transistor 517. Accordingly, the 16th (n-channel) transistor 516 and the 17th (n-channel) transistor 517 are turned on. At this time, the L potential (VSS) flows into the node D' because the potential of the node D' is extracted to the potential of the node G', and the L potential (VSS) flows into the node A' because the potential of the node A' is extracted to the potential of the node G' (discharging operation). The 16th transistor 516 and the 17th transistor 517 are provided to control whether the potentials of the node A' and the node D' are discharged to the H potential (VDD).

Since the clock signal CLK has the H potential (VDD), the 24th transistor 524 and the 25th transistor 525 are turned on. Accordingly, the gate of the 29th transistor 529 (the node B') is charged with the L potential (VSS) that is equivalent to that of the input signal B, and the gate of the 28th transistor 528 (the node C') is charged with the H potential (VDD) that is equivalent to that of the input signal A.

Further, since the clock signal CLK has the H potential (VDD), the 24th transistor 524 and the 26th transistor 526 are turned on. Accordingly, the gate of the 30th transistor 530 (the node E') is charged with the H potential (VDD) that is equivalent to that of the signal BB whose phase is the inverse of that of the input signal B, and the gate of the 31st transistor 531 (the node F') is charged with the L potential (VSS) that is equivalent to that of the signal AB whose phase is the inverse of that of the input signal A.

As described above, in the period T1, the node B', the node C', the node E', and the node F' are charged with the potentials corresponding to the input signal A and the potentials corresponding to the input signal B, and the node A' and the node D' are charged with the L potential (VSS).

<Period T2 (see FIG. 25)>

Next, as shown in the period T2 in FIG. 24, the clock signal CLK has the L potential (VSS), and thus the L potential (VSS) is applied to the gate of the 16th transistor 516, the gate of the 17th transistor 517, and the gate of the 32nd transistor 532. At this time, the 16th (n-channel) transistor 516 and the 17th (n-channel) transistor 517 are turned off. Since the 16th transistor 516 is turned off, the L potential (VSS) of the node G' is not extracted to the node A; thus, the node A' keeps the L potential (VSS). Further, since the 17th transistor 517 is turned off, the L potential (VSS) of the node G' is not extracted to the node D; thus, the node D' keeps the L potential (VSS).

The 32nd (p-channel) transistor 532 is turned on.

On the other hand, the signal CLK has the L potential (VSS), and thus the 24th (n-channel) transistor 524 and the 25th (n-channel) transistor 525 are turned off. Since charge corresponding to the L potential (VSS) is accumulated in the node B', when the 25th transistor 525 is off, the charge corresponding to the L potential (VSS) is held in the node B' (charge holding operation). Further, the 29th (p-channel) transistor 529 is turned on in response to the potential of the node B'. Since charge corresponding to the H potential (VDD) is accumulated in the node C', when the 24th transistor 524 is off, the charge corresponding to the H potential (VDD) is held in the node C' (charge holding operation). Further, the 28th (p-channel) transistor 528 is turned off in response to the potential of the node C'.

In a similar manner, since the clock signal CLK has the L potential (VSS), the 26th (n-channel) transistor 526 and the 27th (n-channel) transistor 527 are turned off. Since charge corresponding to the H potential (VDD) is accumulated in the node E', when the 27th transistor 527 is off, the charge corresponding to the H potential (VDD) is held in the node E' (charge holding operation). Further, the 31st (p-channel) transistor 531 is turned off in response to the potential of the node E'. Since charge corresponding to the L potential (VSS) is accumulated in the node F', when the 26th transistor 526 is off, the charge corresponding to the L potential (VSS) is held in the node F' (charge holding operation). Further, the 30th (p-channel) transistor 530 is turned on in response to the potential of the node F'.

At this time, since the 28th transistor 128 and the 29th transistor 129 are electrically connected to each other in series, a current path from the node H' to the node A' is not formed. On the other hand, since the 30th transistor 530 and the 31st transistor 531 are electrically connected to each other in parallel, a current path from the node H' to the node D' is formed. Therefore, current flows from the node H' to the node D' through the on-state 32nd transistor 532 and the on-state 30th transistor 530. That is, the power supply potential (VDD) of the node H' is supplied to the node D'.

Since current flows from the node H' to the node D', the potential of the node D' is gradually increased from the L potential (VSS) to the H potential (VDD). As a result, the H potential (VDD) is applied to the gate of the 15th transistor 515, so that the 15th transistor (n-channel) 515 is turned on. A current path from the node A' to the node G' through the 15th transistor 515 is formed. Therefore, since the potential of the node A' is extracted to the potential of the node G', the potential of the node A' becomes the L potential (VSS). At this time, the potential of the node A' is determined, and the output signal OUT has the L potential (VSS).

The 15th transistor 515 and the 18th transistor 518 have functions of compensating the potentials of the node A' and the node D'. "Compensating the potentials of the node A' and the node D'" means that, for example, in the case where the node A' has the H potential (VDD), the potential of the node D' is extracted to the L potential (VSS) of the node G' by the 15th transistor 515; for example, in the case where the node D' has the H potential (VDD), the potential of the node A' is extracted to the L potential (VSS) of the node G' by the 18th transistor 518. That is, when one of the node A' and the node D' has the H potential (VDD), the potential of the other of the node A' and the node D' is extracted to the L potential (VSS) of the node G'.

Note that the potential of the node A' and the potential of the node D' depend on the on state and the off state of the 32nd transistor 532. In other words, the potential of the output signal OUT is determined only when the clock signal CLK has the L potential (VSS). Accordingly, the potential of the output signal OUT of the NOR circuit 600 is determined in the period T2, the period T4, the period T6, the period T8, and the period T10 in the timing chart of FIG. 24.

In this manner, in the period T2, the output signal OUT having the L potential (VSS) is determined in response to the input of the input signal A having the H potential (VDD) and the input of the input signal B having the L potential (VSS).

As described above, the 15th transistor 515 and the 18th transistor 518 have functions of compensating the potentials, and the 16th transistor 516 and the 17th transistor 517 have discharging functions. Accordingly, these four transistors have a function as a comparator which continuously compares the potential of the node A' with the potential of the node D' and extracts the potential of the node that is the opposite to the node having the H potential (VDD) to the L potential (VSS) of the node G'.

In addition, the 32nd transistor 532 has charging function. The power supply potential (VDD) of the node H' is supplied to the node A' or the node D' through the on-state 32nd transistor 532. As a result, only when the 32nd transistor 532 is on (the clock signal CLK has the L potential (VSS)), the potential of the output signal OUT is determined. Therefore, the 32nd transistor 532 also has a function of determining a definitive potential of the output signal OUT (a function of determining a potential).

<Period T3 (see FIG. 27)>

First, as shown in the period T3 in FIG. 24, a case where the input signal A and the input signal B have the L potential (VSS) is given. At this time, the clock signal CLK has the H potential (VDD), and thus the H potential (VDD) is applied to the gate of the 16th transistor 516 and the gate of the 17th transistor 517. Accordingly, the 16th (n-channel) transistor 516 and the 17th (n-channel) transistor 517 are turned on. At this time, the L potential (VSS) flows into the node D' because the potential of the node D' is extracted to the potential of the node G', and the L potential (VSS) flows into the node A' because the potential of the node A' is extracted to the potential of the node G' (discharging operation).

The signal CLK has the H potential (VDD), and thus, the 24th transistor 524 and the 25th transistor 525 are turned on. Accordingly, the gate of the 29th transistor 529 (the node B') is charged with the L potential (VSS) that is equivalent to that of the input signal B, and the gate of the 28th transistor 528 (the node C') is charged with the L potential (VSS) that is equivalent to that of the input signal A.

Further, since the clock signal CLK has the H potential (VDD), the 26th transistor 526 and the 27th transistor 527 are turned on. Accordingly, the gate of the 31st transistor 531 (the node E') is charged with the H potential (VDD) that is equivalent to that of the signal BB whose phase is the inverse of that of the input signal B, and the gate of the 30th transistor 530 (the node F') is charged with the H potential (VDD) that is equivalent to that of the signal AB whose phase is the inverse of that of the input signal A.

As described above, in the period T3, the node B', the node C', the node E', and the node F' are charged with the potentials corresponding to the input signal A and the potentials corresponding to the input signal B, and the node A' and the node D' are charged with the L potential (VSS).

<Period T4 (see FIG. 28)>

Next, as shown in the period T4 in FIG. 24, the clock signal CLK has the L potential (VSS), and thus the L potential (VSS) is applied to the gate of the 16th transistor 516, the gate of the 17th transistor 517, and the gate of the 32nd transistor 532. At this time, the 16th (n-channel) transistor 516 and the 17th (n-channel) transistor 517 are turned off. Since the 16th transistor 516 is turned off, the L potential (VSS) of the node G' is not extracted to the node A; thus, the node A' keeps the L potential (VSS). Further, since the 17th transistor 517 is turned off, the L potential (VSS) of the node G' is not extracted to the node D; thus, the node D' keeps the L potential (VSS).

The 32nd (p-channel) transistor 532 is turned on.

On the other hand, the signal CLK has the L potential (VSS), and thus the 24th (n-channel) transistor 524 and the 25th (n-channel) transistor 525 are turned off. Since charge corresponding to the L potential (VSS) is accumulated in the node B', when the 25th transistor 525 is off, the charge corresponding to the L potential (VSS) is held in the node B' (charge holding operation). Further, the 29th (p-channel) transistor 529 is turned on in response to the potential of the node B'. Since charge corresponding to the L potential (VSS) is accumulated in the node C', when the 24th transistor 524 is off, the charge corresponding to the L potential (VSS) is held in the node C' (charge holding operation). Further, the 28th (p-channel) transistor 528 is turned on in response to the potential of the node C'.

In a similar manner, since the clock signal CLK has the L potential (VSS), the 26th (n-channel) transistor 526 and the 27th (n-channel) transistor 527 are turned off. Since charge corresponding to the H potential (VDD) is accumulated in the node E', when the 27th transistor 527 is off, the charge corresponding to the H potential (VDD) is held in the node E' (charge holding operation). Further, the 31st (p-channel) transistor 531 is turned off in response to the potential of the node E'. Since charge corresponding to the H potential (VDD) is accumulated in the node F', when the 26th transistor 526 is off, the charge corresponding to the H potential (VDD) is held in the node F' (charge holding operation). Further, the 30th (p-channel) transistor 530 is turned off in response to the potential of the node F'.

At this time, since the 28th transistor 528 and the 29th transistor 529 are electrically connected to each other in series, a current path from the node H' to the node A' is not formed. Therefore, current flows from the node H' to the node A' through the on-state 32nd transistor 532, the on-state 28th transistor 528, and the on-state 29th transistor 529. Since current flows from the node H' to the node A', the potential of the node A' is gradually increased from the L potential (VSS) to the H potential (VDD). That is, the power supply potential (VDD) of the node H' is supplied to the node D'. At this time, the potential of the node A' is determined, and the output signal OUT has the H potential (VDD). On the other hand, since the 30th transistor 530 and the 31st transistor 531 are electrically connected to each other in parallel, a current path from the node H' to the node D' is not formed.

As a result, the H potential (VDD) is applied to the gate of the 18th transistor 518, so that the 18th transistor (n-channel) 518 is turned on. At this time, a current path from the node A' to the node G' through the 18th transistor 518 is formed. Therefore, since the potential of the node D' is extracted to the potential of the node G', the potential of the node D' becomes the L potential (VSS). The output signal OUTB whose phase is the inverse of that of the output signal OUT has the L potential (VSS).

In this manner, in the period T4, the output signal OUT having the H potential (VDD) is determined in response to the input of the input signal A having the L potential (VSS) and the input of the input signal B having the L potential (VSS).

The 28th transistor 528 whose gate corresponds to the node C' having a potential corresponding to the input signal A and the 29th transistor 529 whose gate corresponds to the node B' having a potential corresponding to the input signal B are electrically connected to each other in series. Therefore, when the H potential (VDD) is input as either of the input signals, a current path from the node H' to the node A' is not formed; only when the L potential (VSS) is input as both of the input signals, the current path is formed and thus the power supply potential (VDD) of the node H' is supplied to the node A'. On the other hand, the 30th transistor 530 and the 31st transistor 531 are electrically connected to each other in parallel. Therefore, only when the L potential (VSS) is input as both of the input signals, a current path from the node H' to the node D' is not formed and thus the power supply potential (VDD) of the node H' is not supplied to the node D'.

In other words, when the H potential (VDD) is input to either of the input signals, the potential of the node A' is always the L potential (VSS). The potential of the output signal OUT is always the L potential (VSS) at this time. When the L potential (VSS) is input as both of the input signals, the potential of the node A' is always the H potential (VDD), and the potential of the output signal OUT is always the H potential (VDD) at this time. The NOR circuit is configured to operate in this manner.

Operations in the period T5 and the period T6 are similar to those in the period T1 and the period T2. Operations in the period T7 and the period T8 correspond to those in the period T1 and the period T2 in the case where the L potential (VSS) and the H potential (VDD) are input as the input signal A and the input signal B, respectively. Operations in the period T9 and the period T10 correspond to those in the period T3 and the period T4 in the case where the H potential (VDD) is input as the input signal A and the input signal B.

According to this embodiment, increase in the number of paths of leakage current in the NOR circuit can be suppressed. Accordingly, the power consumption of the NOR circuit can be reduced.

According to this embodiment, the NOR circuit can hold data even when power supply is stopped.

According to this embodiment, it is possible to stack the transistor including an oxide semiconductor and the transistor including a silicon semiconductor in the NOR circuit; therefore, the area of the circuit can be reduced.

This embodiment can be implemented in combination with any of the other embodiments in this specification as appropriate.

Embodiment 6

In this embodiment, another structure of a NOR circuit which has a data holding function and whose power consumption is reduced will be described with reference to FIG. 29 and FIG. 30.

Figure 29:
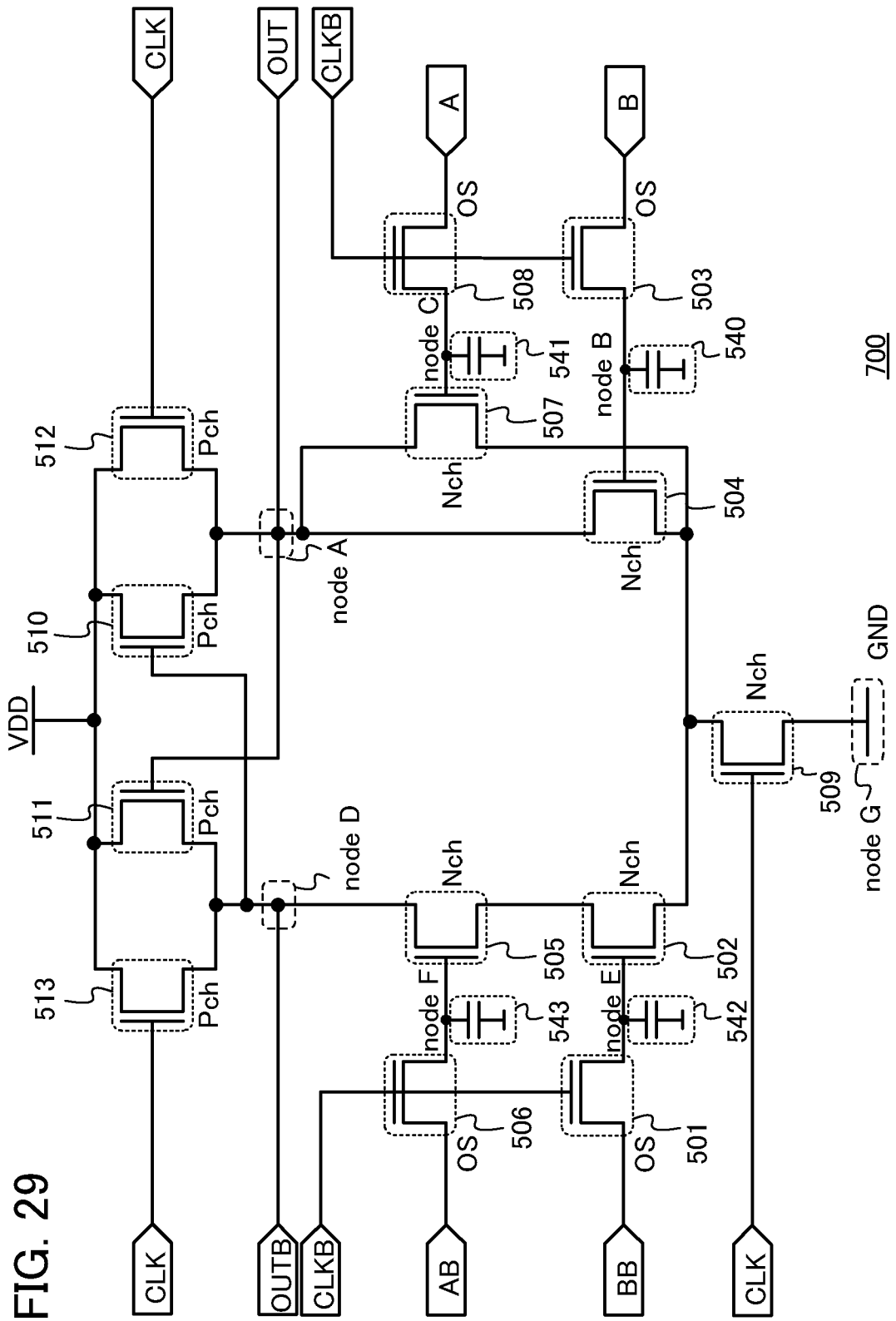
FIG. 29 illustrates a NOR circuit according to Embodiment 6.
Figure 30:
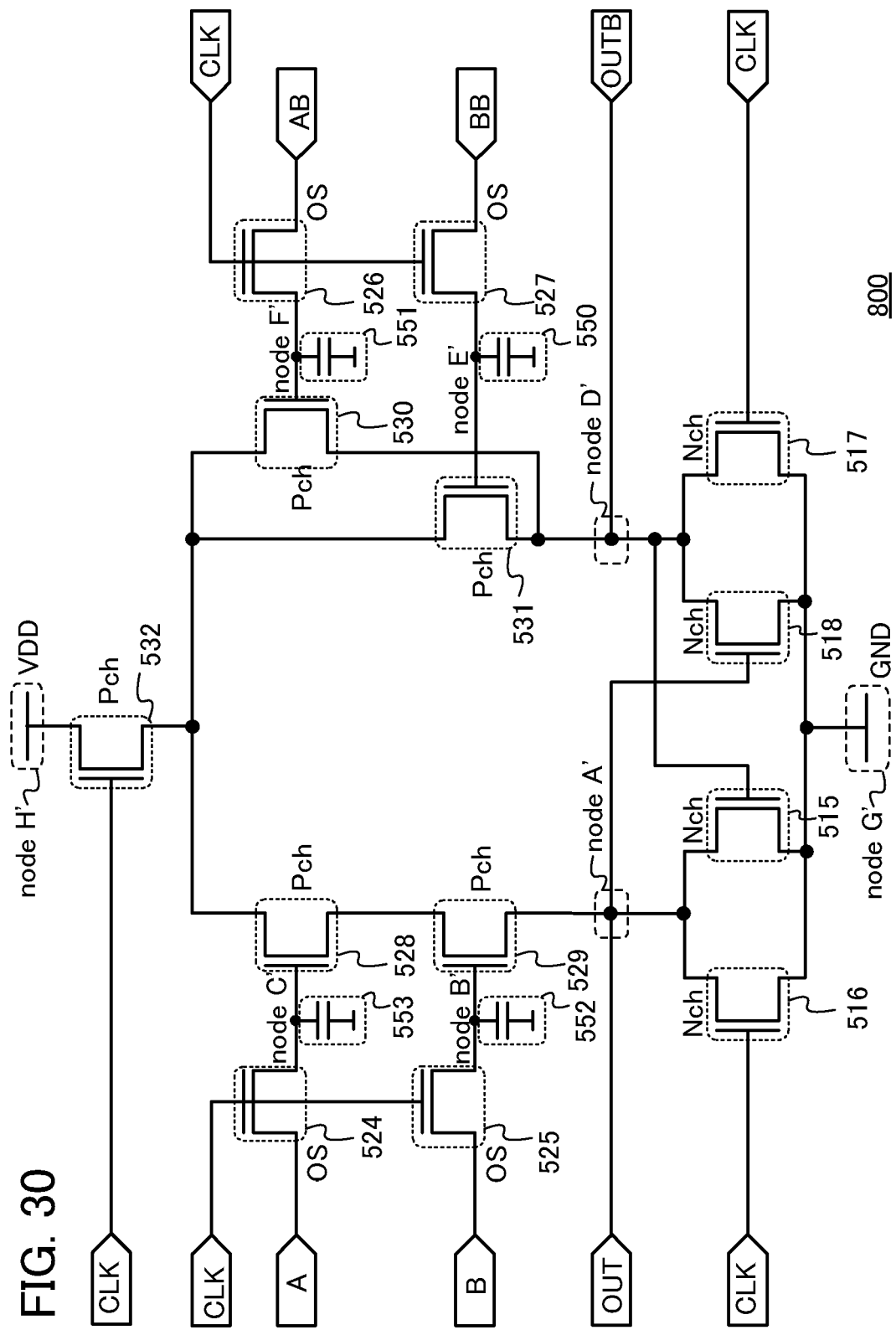
FIG. 30 illustrates a NOR circuit according to Embodiment 6.

FIG. 29 and FIG. 30 are each a circuit diagram of a NOR circuit of this embodiment. A NOR circuit 700 of FIG. 29 has a structure in which a capacitor 540 is connected to the node B, a capacitor 541 is connected to the node C, a capacitor 542 is connected to the node E, and a capacitor 543 is connected to the node F in the NOR circuit 500 of FIG. 17. Structures other than the capacitors 540, 541, 542, and 543 are the same as those in the NOR circuit 500.

A NOR circuit 800 of FIG. 30 has a structure in which a capacitor 552 is connected to the node B', a capacitor 553 is connected to the node C', a capacitor 550 is connected to the node E', and a capacitor 551 is connected to the node F' in the NOR circuit 600 of FIG. 23. Structures other than the capacitors 550, 551, 552, and 553 are the same as those in the NOR circuit 600.

Since the capacitor 540 (the capacitor 550) is connected to the node B (the node B'), the capacitor 541 (the capacitor 551) is connected to the node C (the node C'), the capacitor 542 (the capacitor 552) is connected to the node E (the node E'), and the capacitor 543 (the capacitor 553) is connected to the node F (the node F'), data holding time can be longer. The data holding time can be adjusted by changing the capacitance value of each of the capacitor 540 (the capacitor 550), the capacitor 541 (the capacitor 551), the capacitor 542 (the capacitor 552), and the capacitor 543 (the capacitor 553). In order to lengthen the data holding time, the capacitance value of each of the capacitors is increased.

Further, since the capacitor 540 (the capacitor 550) is connected to the node B (the node B'), the capacitor 541 (the capacitor 551) is connected to the node C (the node C'), the capacitor 542 (the capacitor 552) is connected to the node E (the node E'), and the capacitor 543 (the capacitor 553) is connected to the node F (the node F'), an adverse effect due to a load such as parasitic capacitance in the NOR circuit or the like can be reduced. Consequently, stability of the operation of the NOR circuit can be improved.

Since the operation of the NOR circuit 700 is similar to that of the NOR circuit 500, Embodiment 1 can be referred to. Further, since the operation of the NOR circuit 800 is similar to that of the NOR circuit 600, Embodiment 2 can be referred to.

This embodiment can be implemented in combination with any of the other embodiments in this specification as appropriate.

Embodiment 7

In this embodiment, the transistor which includes an oxide semiconductor and is used in any of Embodiments 1 to 6 will be described.

Figure 31A:
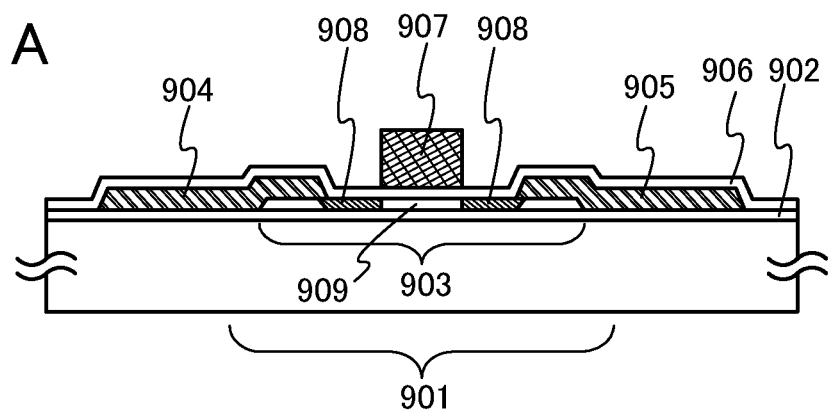
FIGS. 31A and 31B are each a cross-sectional view of a transistor.

A transistor 901 including an oxide semiconductor in FIG. 31A includes an oxide semiconductor layer 903 which is formed over an insulating film 902 and functions as a semiconductor layer; a source electrode 904 and a drain electrode 905 formed over the oxide semiconductor layer 903; a gate insulating film 906 over the oxide semiconductor layer 903, and the source electrode 904 and the drain electrode 905; and a gate electrode 907 which is provided over the gate insulating film 906 so as to overlap with the oxide semiconductor layer 903.

The transistor 901 including an oxide semiconductor in FIG. 31A is of a top-gate type where the gate electrode 907 is formed over the oxide semiconductor layer 903, and is also of a top-contact type where the source electrode 904 and the drain electrode 905 are formed over the oxide semiconductor layer 903. In the transistor 901 including an oxide semiconductor, the source electrode 904 and the drain electrode 905 do not overlap with the gate electrode 907. That is, the distance between the gate electrode 907 and each of the source electrode 904 and the drain electrode 905 is larger than the thickness of the gate insulating film 906. Therefore, in the transistor 901 including an oxide semiconductor, the parasitic capacitance generated between the gate electrode 907 and each of the source electrode 904 and the drain electrode 905 can be small, so that the transistor 901 can operate at high speed.

The oxide semiconductor layer 903 includes a pair of high-concentration regions 908 which are obtained by addition of dopant imparting n-type conductivity to the oxide semiconductor layer 903 after formation of the gate electrode 907. Further, the oxide semiconductor layer 903 includes a channel formation region 909 which overlaps with the gate electrode 907 with the gate insulating film 906 interposed therebetween. In the oxide semiconductor layer 903, the channel formation region 909 is provided between the pair of high-concentration regions 908. The addition of dopant for forming the high-concentration regions 908 can be performed by an ion implantation method. As the dopant, for example, a rare gas such as helium, argon, or xenon, a Group 15 element such as nitrogen, phosphorus, arsenic, or antimony, or the like can be used.

For example, in the case where nitrogen is used as the dopant, the concentration of nitrogen atoms in the high-concentration regions 908 is preferably higher than or equal to $5\times10^{19}/cm^3$ and lower than or equal to $1\times10^{22}/cm^3$.

The high-concentration regions 908 to which the dopant imparting n-type conductivity is added have higher conductivity than the other regions in the oxide semiconductor layer 903. Therefore, by providing the high-concentration regions 908 in the oxide semiconductor layer 903, the resistance between the source electrode 904 and the drain electrode 905 can be decreased.

By decreasing the resistance between the source electrode 904 and the drain electrode 905, high on-state current and high-speed operation can be ensured even when the transistor 901 including an oxide semiconductor is miniaturized. Therefore, the area of a logic circuit including such a transistor can be reduced, so that a semiconductor integrated circuit can be miniaturized.

Figure 31B:
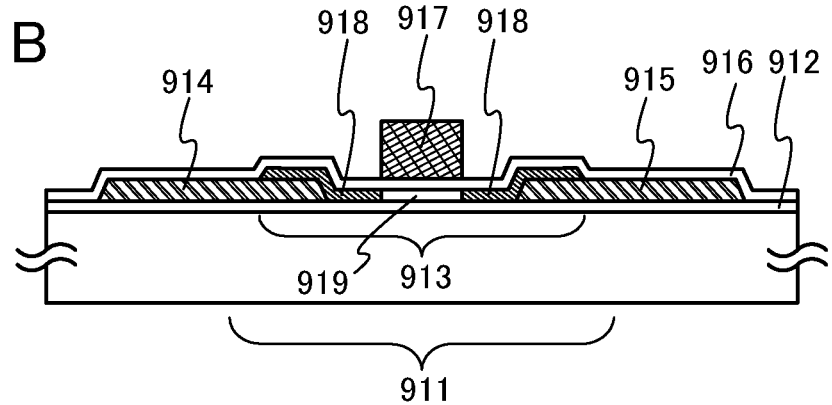

A transistor 911 including an oxide semiconductor in FIG. 31B includes a source electrode 914 and a drain electrode 915 formed over an insulating film 912; the insulating film 912; an oxide semiconductor layer 913 which is formed over the source electrode 914 and the drain electrode 915 and functions as a semiconductor layer; a gate insulating film 916 over the oxide semiconductor layer 913, and the source electrode 914 and the drain electrode 915; and a gate electrode 917 which is provided over the gate insulating film 916 so as to overlap with the oxide semiconductor layer 913.

The transistor 911 including an oxide semiconductor in FIG. 31B is of a top-gate type where the gate electrode 917 is formed over the oxide semiconductor layer 913, and is also of a bottom-contact type where the source electrode 914 and the drain electrode 915 are formed below the oxide semiconductor layer 913. In the transistor 911, the source electrode 914 and the drain electrode 915 do not overlap with the gate electrode 917 as in the transistor 901; thus, the parasitic capacitance generated between the gate electrode 917 and each of the source electrode 914 and the drain electrode 915 can be small, so that the transistor 911 can operate at high speed. Further, a data holding function per unit area in the logic circuit can be improved.

The oxide semiconductor layer 913 includes a pair of high-concentration regions 918 which are obtained by addition of dopant imparting n-type conductivity to the oxide semiconductor layer 913 after formation of the gate electrode 917. Further, the oxide semiconductor layer 913 includes a channel formation region 919 which overlaps with the gate electrode 917 with the gate insulating film 916 interposed therebetween. In the oxide semiconductor layer 913, the channel formation region 919 is provided between the pair of high-concentration regions 918.

Like the above-described high-concentration regions 908 included in the transistor 901, the high-concentration regions 918 can be formed by an ion implantation method. The kind of dopant in the case of the high-concentration regions 908 can be referred to for the kind of dopant for forming the high-concentration regions 918.

The high-concentration regions 918 to which the dopant imparting n-type conductivity is added have higher conductivity than the other regions in the oxide semiconductor layer 913. Therefore, by providing the high-concentration regions 918 in the oxide semiconductor layer 913, the resistance between the source electrode 914 and the drain electrode 915 can be decreased.

When the resistance between the source electrode 914 and the drain electrode 915 is reduced, high on-state current and high-speed operation can be ensured even when the transistor 911 including an oxide semiconductor is miniaturized. Accordingly, when the transistor is used for a logic circuit, the area of the logic circuit can be reduced, so that a semiconductor integrated circuit can be miniaturized. Further, a data holding function per unit area in the logic circuit can be improved.

As described above, the transistor 901 or the transistor 911 is applied to the transistor including an oxide semiconductor which is used in any of Embodiments 1 to 6, whereby a logic circuit whose data holding function per unit area is improved can be obtained. In addition, a NAND circuit or a NOR circuit whose logic circuit has a small area can be obtained.

Note that the structure of the transistor including an oxide semiconductor that is used in any of Embodiments 1 to 6 is not limited to this structure.

The structures, methods, and the like described in this embodiment can be combined as appropriate with any of the structures, methods, and the like described in the other embodiments.

Embodiment 8

In this embodiment, one mode of the structure of the logic circuit in any of Embodiments 1 to 6 will be described.

Figure 32:
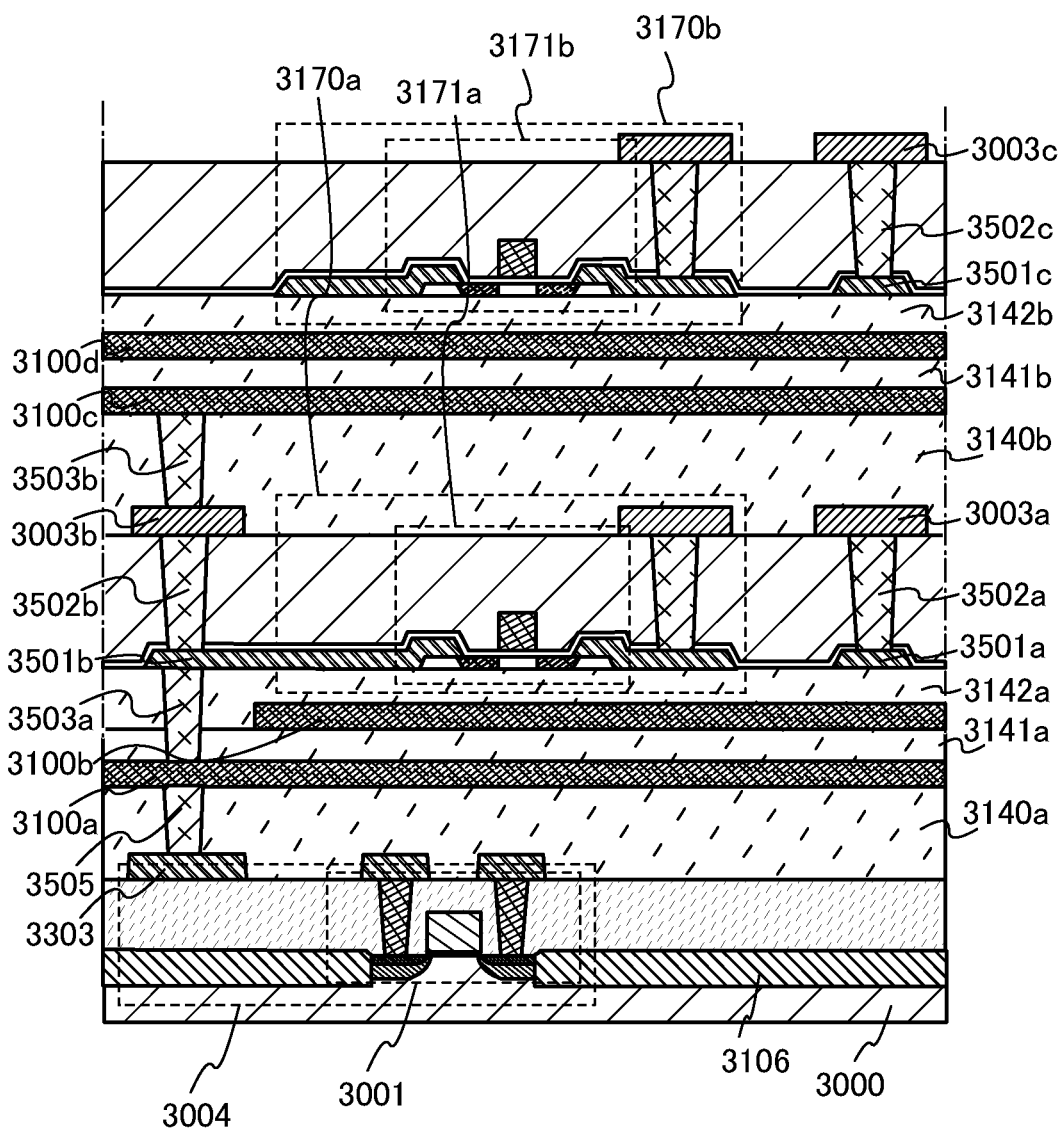
FIG. 32 is a cross-sectional view illustrating a structure of a logic circuit.

FIG. 32 is a cross-sectional view of a logic circuit. A memory device illustrated in FIG. 32 has a staked-layer structure, in which two layers of a memory element 3170a and a memory element 3170b are provided in a top portion, and a logic circuit 3004 is provided in a bottom portion. Note that there are no particular limitations on the number of memory elements, the number of layers in which the memory elements are formed, and the arrangement structure.

The "memory element" in this embodiment includes a transistor including an oxide semiconductor, and refers to an element which can hold data even when power supply is stopped. The memory element 3170a includes a transistor 3171a including an oxide semiconductor, and the memory element 3170b includes a transistor 3171b including an oxide semiconductor.

Although the transistor 3171a used in the memory element 3170a and the transistor 3171b used in the memory element 3170b in FIG. 32 have the same structure as the transistor 901 in FIG. 31A, there is no particular limitation on the structure of the transistor. Alternatively, transistor 3171a and the transistor 3171b may have the same structure as the transistor 911 illustrated in FIG. 31B.

An electrode 3501a which is formed in the same layer as a source electrode and a drain electrode of the transistor 3171a is electrically connected to an electrode 3003a through an electrode 3502a. An electrode 3501c which is formed in the same layer as a source electrode and a drain electrode of the transistor 3171b is electrically connected to an electrode 3003c through an electrode 3502c.

The logic circuit 3004 includes a transistor 3001 including a silicon semiconductor. Note that the logic circuit 3004 may include a transistor including an oxide semiconductor or a transistor including a material other than an oxide semiconductor. The transistor including a silicon semiconductor may overlap with the transistor including an oxide semiconductor.

Further, the transistor 3001 is formed in such a manner that an element separation insulating film 3106 is provided over a substrate 3000 including a semiconductor material (e.g., silicon) and a channel formation region is provided in a region surrounded by the element separation insulating film 3106. Note that the transistor 3001 may be a transistor in which the channel formation region is provided in a semiconductor film such as a silicon film formed on an insulating surface or a silicon film in an SOI substrate. Description of the transistor 3001 is omitted because a known structure can be used.

A wiring 3100a and a wiring 3100b are formed between layers in which the transistor 3171a is formed and layers in which the transistor 3001 is formed. An insulating film 3140a is provided between the wiring 3100a and the layers in which the transistor 3001 is formed. An insulating film 3141a is provided between the wiring 3100a and the wiring 3100b. An insulating film 3142a is provided between the wiring 3100b and the layers in which the transistor 3171a is formed.

Similarly, a wiring 3100c and a wiring 3100d are formed between the layers in which the transistor 3171b is formed and the layers in which the transistor 3171a is formed. An insulating film 3140b is provided between the wiring 3100c and the layers in which the transistor 3171a is formed. An insulating film 3141b is provided between the wiring 3100c and the wiring 3100d. An insulating film 3142b is provided between the wiring 3100d and the layers in which the transistor 3171b is formed.

The insulating films 3140a, 3141a, 3142a, 3140b, 3141b, and 3142b each function as an interlayer insulating film whose surface is planarized.

Through the wiring 3100a, the wiring 3100b, the wiring 3100c, and the wiring 3100d, electrical connection between the memory elements, electrical connection between the logic circuit and the memory element, and the like can be established.

An electrode 3303 included in the logic circuit 3004, an electrode 3505, and an electrode 3503a allow the memory element provided in the top portion and the logic circuit provided in the bottom portion to be electrically connected to each other. For example, as illustrated in FIG. 32, the electrode 3303 can be electrically connected to the wiring 3100a through the electrode 3505. The electrode 3503a allows the wiring 3100a to be electrically connected to an electrode 3501b. In this manner, the electrode 3303 included in the logic circuit 3004 can be electrically connected to the source electrode or the drain electrode of the transistor 3171a included in the memory element 3170a.

An electrode 3502b allows the electrode 3501b to be electrically connected to an electrode 3003b. An electrode 3503b allows the electrode 3003b to be electrically connected to the wiring 3100c.

Although the electrode 3303 is electrically connected to the transistor 3171a through the wiring 3100a in FIG. 32, this embodiment is not limited thereto. The electrode 3303 and the transistor 3171a may be electrically connected to each other through the wiring 3100b, or may be electrically connected to each other through both the wiring 3100a and the wiring 3100b.

FIG. 32 illustrates the structure where two wiring layers, i.e., a wiring layer in which the wiring 3100a is formed and a wiring layer in which the wiring 3100b is formed are provided between the layers in which the transistor 3171a is formed and the layers in which the transistor 3001 is formed; however, the number of wiring layers provided therebetween is not limited to two. One wiring layer may be provided or three or more wiring layers may be provided between the layers in which the transistor 3171*a* is formed and the layers in which the transistor 3001 is formed.

FIG. 32 illustrates the structure where two wiring layers, i.e., a wiring layer in which the wiring 3100*c* is formed and a wiring layer in which the wiring 3100*d* is formed are provided between the layers in which the memory element 3170*a* is formed and the layers in which the memory element 3170*b* is formed; however, the number of wiring layers provided therebetween is not limited to two. One wiring layer may be provided or three or more wiring layers may be provided between the layers in which the memory element 3170*a* is formed and the layers in which the memory element 3170*b* is formed.

As described above, a transistor including an oxide semiconductor, which is included in a memory element, and a transistor including a silicon semiconductor, which is included in a logic circuit, are stacked, whereby the area of the logic circuit can be reduced and a semiconductor integrated circuit can be further miniaturized. In addition, it is possible to obtain a novel logic circuit which can hold data even when power supply is stopped. Note that there is no limitation on the stacked-layer structures of the transistors used in Embodiments 1 to 6.

This embodiment can be implemented in combination with any of the above embodiments as appropriate.

Embodiment 9

In this embodiment, a configuration of a central processing unit (CPU) which is one of signal processing circuits according to one embodiment of the disclosed invention will be described.

Figure 33:
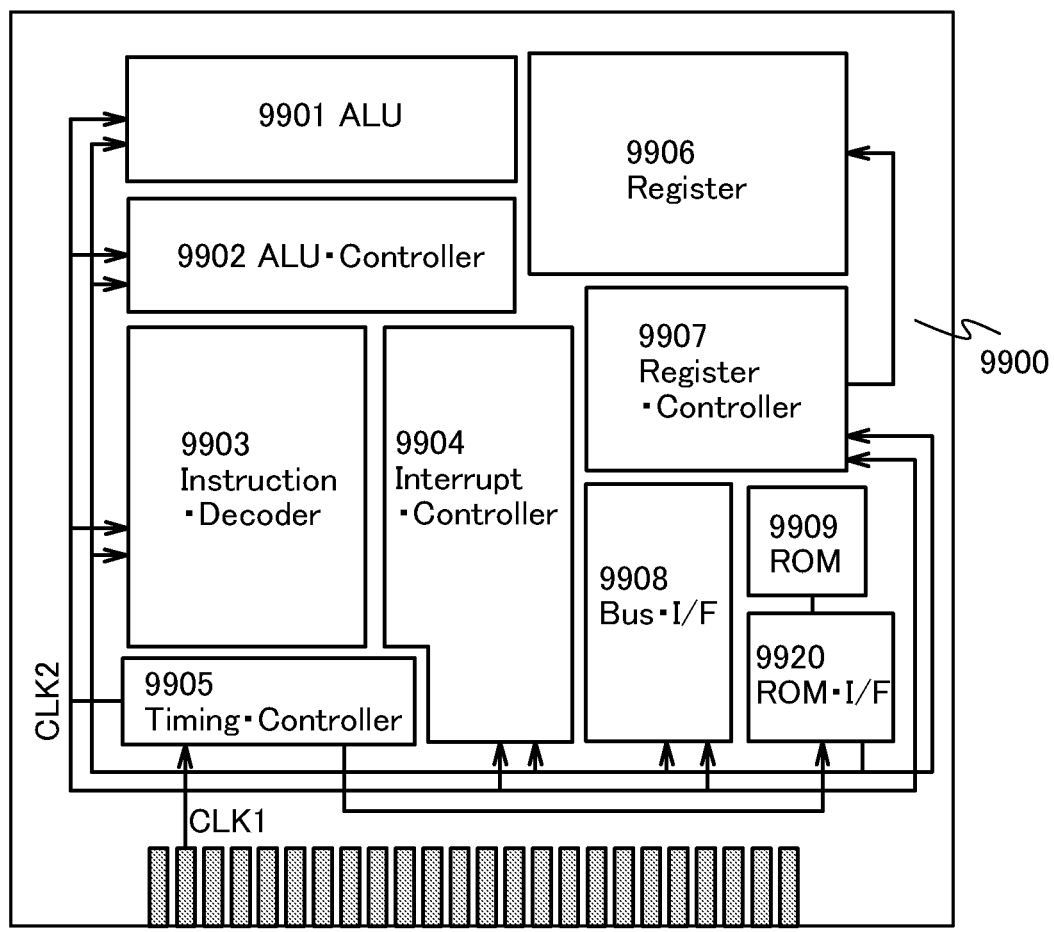
FIG. 33 is a block diagram of a CPU including a logic circuit.

FIG. 33 illustrates a configuration of the CPU in this embodiment. The CPU illustrated in FIG. 33 mainly includes an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920, over a substrate 9900. Further, the ROM 9909 and the ROM I/F 9920 may be provided over different chips. Naturally, the CPU illustrated in FIG. 33 is only an example with a simplified configuration, and an actual CPU may employ a variety of configurations depending on the application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit based on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and supplies the clock signal CLK2 to the above circuits.

In the CPU of this embodiment, the logic circuit described in any of Embodiments 1 to 6 is provided in the register 9906. When the logic circuit that holds data even when power supply is stopped is provided in the CPU of this embodiment, the data holding function can be improved and power consumption can be reduced. In addition, when the logic circuit whose area is reduced is provided in the CPU, the area of the CPU and the number of transistors included in the CPU can be reduced. In the CPU according to this embodiment, a memory circuit having the structure described in any of the above embodiments is provided in the register 9906.

Although the CPU is described as an example in this embodiment, the signal processing circuit of one embodiment of the disclosed invention is not limited to the CPU and can be applied to an LSI such as a microprocessor, an image processing circuit, a DSP, or an FPGA.

This embodiment can be implemented in combination with any of the above embodiments as appropriate.

Embodiment 10

In this embodiment, a transistor which includes an oxide semiconductor and is used in one embodiment of the disclosed invention will be described in detail. Note that a transistor including an oxide semiconductor of this embodiment can be used as the transistor which includes an oxide semiconductor and is described in any of Embodiments 1 to 9.

An oxide semiconductor to be used preferably contains at least indium (In) or zinc (Zn). In particular, In and Zn are preferably contained. As a stabilizer for reducing changes in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as its main component, and there is no limitation on the ratio of In:Ga:Zn. Further, the In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

In an oxide semiconductor having crystallinity, when a surface flatness is improved, higher mobility can be obtained. In order to improve the surface flatness, the oxide semiconductor is preferably formed on a flat surface. Specifically, the oxide semiconductor may be formed on a surface with an average surface roughness ($R_a$) of 1 nm or less, preferably 0.3 nm or less, more preferably 0.1 nm or less.

Note that the average surface roughness ($R_a$) is obtained by expanding, into three dimensions, center line average roughness that is defined by JIS B 0601 so as to be applied to a surface. The $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \quad \text{[Formula 1]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents the average height of the plane to be measured. Further, $R_a$ can be measured using an atomic force microscope (AFM).

An oxide having crystallinity is described below. Specifically, the oxide including a crystal with c-axis alignment (also referred to as c-axis aligned crystal (CAAC)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 34A to 34E, FIGS. 35A to 35C, and FIGS. 36A to 36C. In FIGS. 34A to 34E, FIGS. 35A to 35C, and FIGS. 36A to 36C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 34A to 34E, O surrounded by a circle represents tetracoordinate O and a double circle represents tricoordinate O.

Figure 34A:
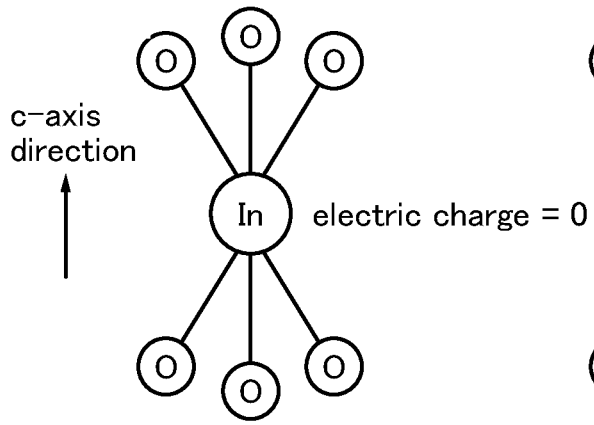
FIGS. 34A to 34E illustrate crystal structures of oxide materials.

FIG. 34A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 34A is actually an octahedral structure, but is illustrated as a planar structure for simplicity. Note that three tetracoordinate O atoms exist in each of an upper half and a lower half in FIG. 34A. In the small group illustrated in FIG. 34A, electric charge is 0.

Figure 34D:
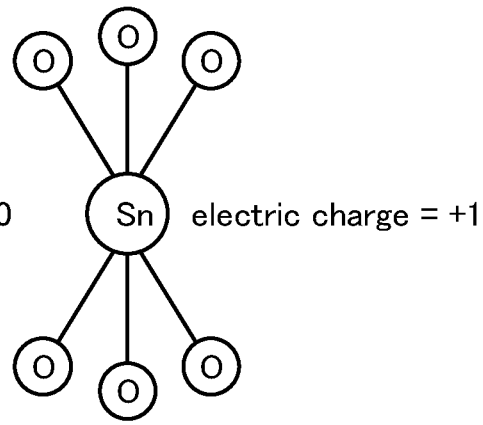
Figure 34B:
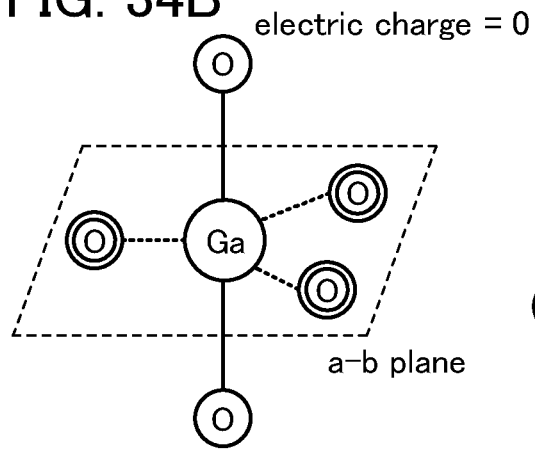

FIG. 34B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 34B. An In atom can also have the structure illustrated in FIG. 34B because an In atom can have five ligands. In the small group illustrated in FIG. 34B, electric charge is 0.

Figure 34E:
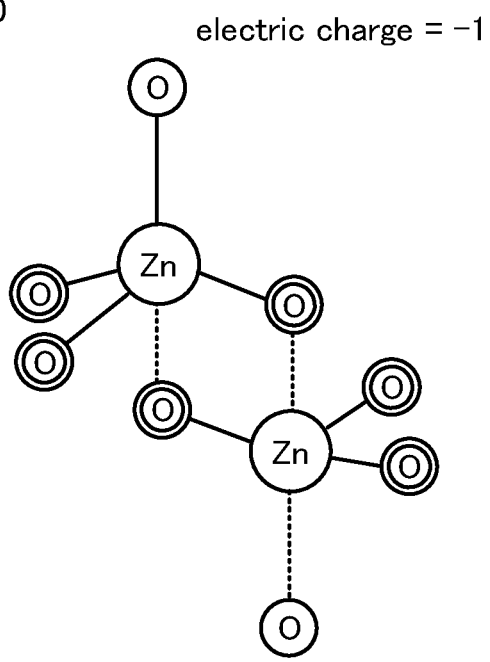
Figure 34C:
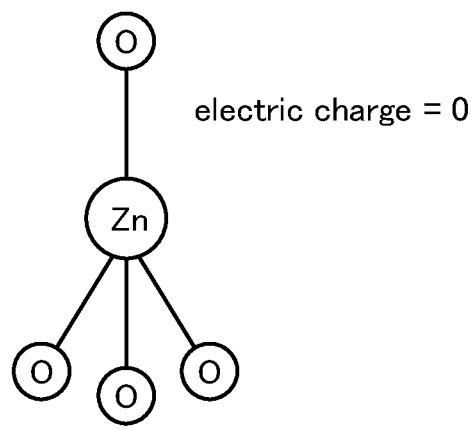

FIG. 34C illustrates a structure including one tetracoordinate Zn atom and four tetracoordinate O atoms proximate to the Zn atom. In FIG. 34C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 34C. In the small group illustrated in FIG. 34C, electric charge is 0.

FIG. 34D illustrates a structure including one hexacoordinate Sn atom and six tetracoordinate O atoms proximate to the Sn atom. In FIG. 34D, three tetracoordinate O atoms exist in each of an upper half and a lower half. In the small group illustrated in FIG. 34D, electric charge is +1.

FIG. 34E illustrates a small group including two Zn atoms. In FIG. 34E, one tetracoordinate O atom exists in each of an upper half and a lower half. In the small group illustrated in FIG. 34E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 34A each have three proximate In atoms in the downward direction, and the three O atoms in the lower half each have three proximate In atoms in the upward direction. The one O atom in the upper half with respect to the pentacoordinate Ga atom in FIG. 34B has one proximate Ga atom in the downward direction, and the one O atom in the lower half has one proximate Ga atom in the upward direction. The one O atom in the upper half with respect to the tetracoordinate Zn atom in FIG. 34C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason is described below. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 35A illustrates a model of a medium group included in a layered structure of an In—Sn—Zn—O-based material. FIG. 35B illustrates a large group including three medium groups. Note that FIG. 35C illustrates an atomic arrangement in the case where the layered structure in FIG. 35B is observed from the c-axis direction.

In FIG. 35A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 35A, one tetracoordinate O atom existing in each of an upper half and a lower half with respect to an In atom is denoted by circled 1. FIG. 35A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based oxide in FIG. 35A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 34E can be given. For example, with one small group including two Zn atoms, electric charge of one small group including a Sn atom can be cancelled, so that the total electric charge of the layered structure can be 0.

When the large group illustrated in FIG. 35B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

As an example, FIG. 36A illustrates a model of a medium group included in a layered structure of an In—Ga—Zn—O-based material.

In the medium group included in the layered structure of the In—Ga—Zn—O-based material in FIG. 36A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 36B illustrates a large group including three medium groups. Note that FIG. 36C illustrates an atomic arrangement in the case where the layered structure in FIG. 36B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 36A but also a medium group in which the arrangement of the In atom, the Ga atom, and the Zn atom is different from that in FIG. 36A.

When the large group illustrated in FIG. 36B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 37A:
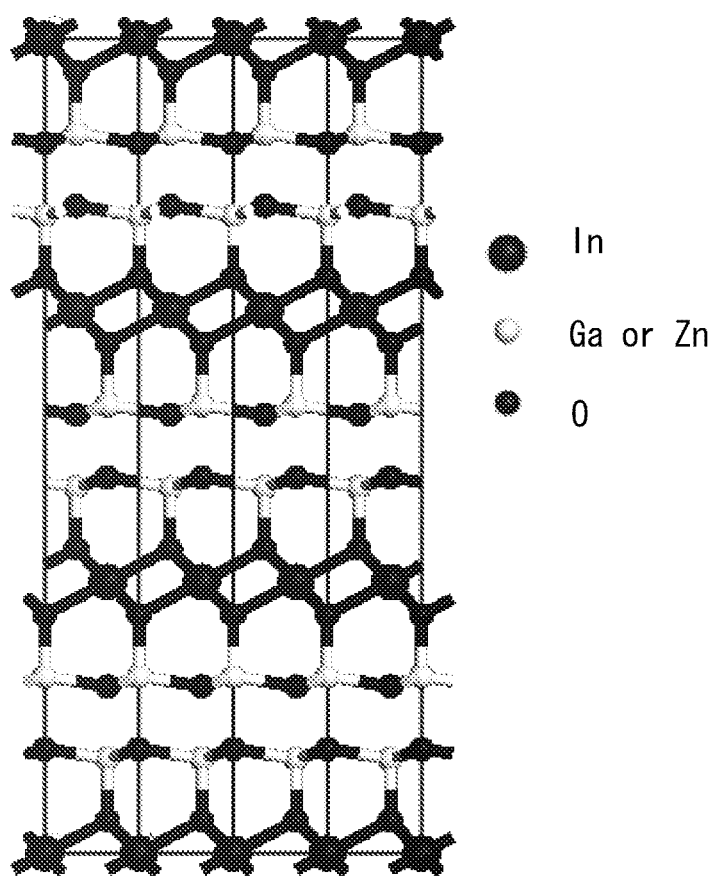
FIGS. 37A and 37B illustrate crystal structures of oxide materials.

In the case where n=1 ($InGaZnO_4$), a crystal structure illustrated in FIG. 37A can be obtained, for example. Note that in the crystal structure in FIG. 37A, since a Ga atom and an In atom each have five ligands as described in FIG. 34B, a structure in which Ga is replaced with In can be obtained.

Figure 37B:
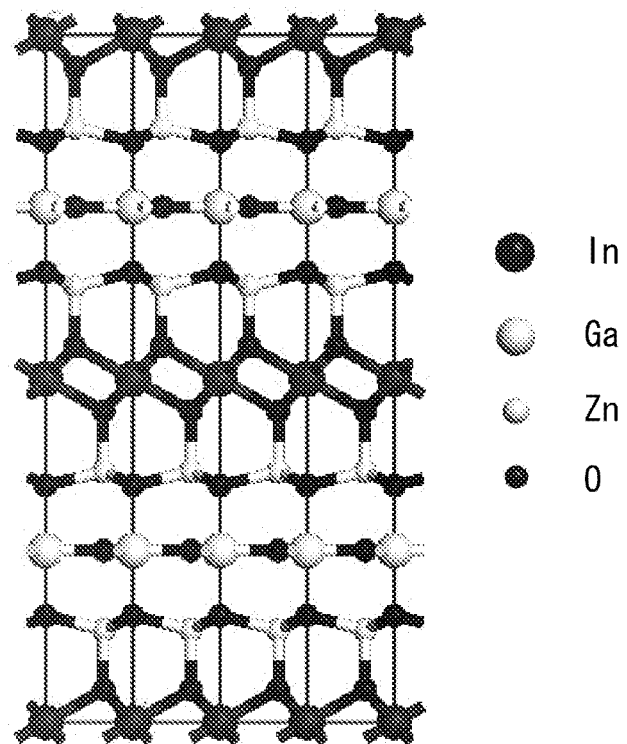

In the case where n=2 ($InGaZn_2O_5$), a crystal structure illustrated in FIG. 37B can be obtained, for example. Note that in the crystal structure in FIG. 37B, since a Ga atom and an In atom each have five ligands as described in FIG. 34B, a structure in which Ga is replaced with In can be obtained.

Embodiment 11

In this embodiment, mobility of a semiconductor used in the transistor described in any of Embodiments 1 to 9 will be described.

The actually measured field-effect mobility of an insulated gate transistor can be lower than its original mobility because of a variety of reasons; this phenomenon occurs not only in the case of an oxide semiconductor. One of the reasons that reduce the mobility is a defect inside a semiconductor or a defect at the interface between the semiconductor and an insulating film. When a Levinson model is used, the field-effect mobility that is based on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following formula.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. When the potential barrier is assumed to be attributed to a defect, the height E of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[Formula 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \quad \text{[Formula 4]}$$

Here, L represents the channel length and W represents the channel width, and L and W are each 10 μm. Further, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g} \quad \text{[Formula 5]}$$

The right side of Formula 5 is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$–$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm$^2$/Vs from Formula 2 and Formula 3. The measured mobility of an In—Sn—Zn oxide including a defect is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at the interface between a channel and a gate insulating film adversely affects the transport property of the transistor. In other words, the mobility $\mu_1$ at a position that is distance x away from the interface between the channel and the gate insulating film can be expressed as the following formula.

$$\frac{1}{\mu_1} = \frac{1}{\mu_0} + \frac{D}{B}\exp\left(-\frac{x}{G}\right)$$ [Formula 6]

Here, D represents the electric field in the gate direction, and B and G are constants. Note that B and G can be obtained from actual measurement results; according to the above measurement results, B is 4.75×10⁷ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 38:
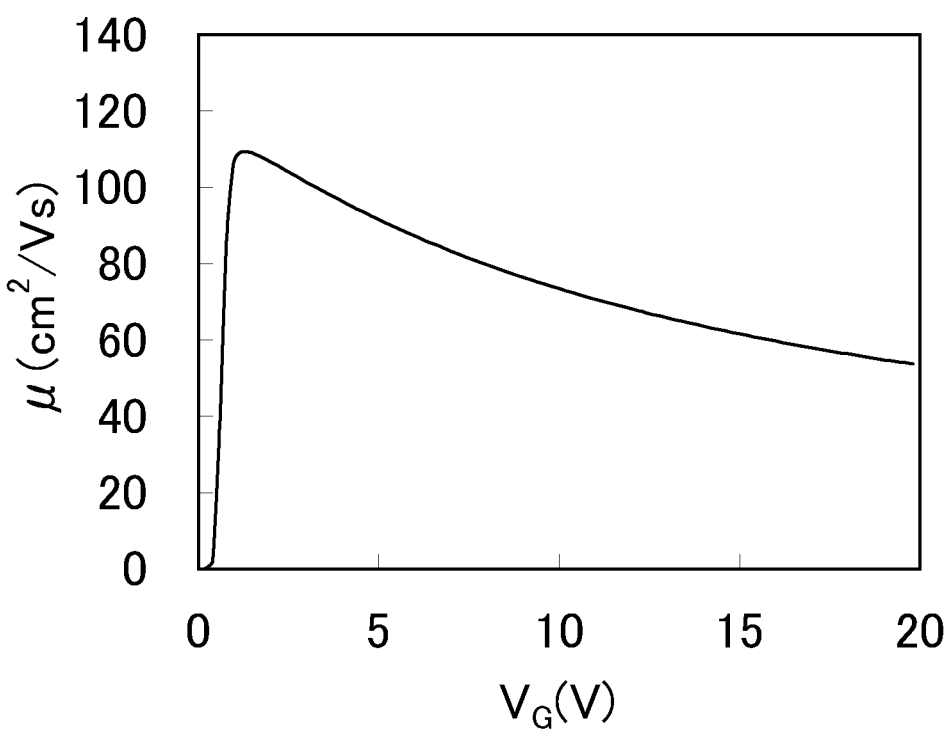
FIG. 38 shows gate voltage dependence of mobility obtained by calculation.

FIG. 38 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 38, the mobility has a peak of 100 cm²/Vs or more at a gate voltage that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors formed using an oxide semiconductor having such a mobility are shown in FIGS. 39A to 39C, FIGS. 40A to 40C, and FIGS. 41A to 41C. FIGS. 42A and 42B illustrate cross-sectional structures of the transistors used for the calculation. The transistors illustrated in FIGS. 42A and 42B each include a semiconductor region 403a and a semiconductor region 403c that have n⁺-type conductivity in an oxide semiconductor layer. The resistivity of the semiconductor regions 403a and 403c is 2×10⁻³ Ωcm.

The transistor in FIG. 42A is formed over a base insulating layer 401 and an embedded insulator 402 that is embedded in the base insulating layer 401 and formed of aluminum oxide. The transistor includes the semiconductor region 403a, the semiconductor region 403c, an intrinsic semiconductor region 403b that is placed between the semiconductor regions 403a and 403c and serves as a channel formation region, and a gate 405. The width of the gate 405 is 33 nm.

A gate insulating film 404 is formed between the gate 405 and the semiconductor region 403b. A sidewall insulator 406a and a sidewall insulator 406b are formed on both side surfaces of the gate 405, and an insulator 407 is formed over the gate 405 so as to prevent a short circuit between the gate 405 and another wiring. The sidewall insulator has a width of 5 nm. A source 408a and a drain 408b are provided in contact with the semiconductor region 403a and the semiconductor region 403c, respectively. Note that the channel width of this transistor is 40 nm.

The transistor in FIG. 42B is the same as the transistor in FIG. 42A in that it is formed over the base insulating layer 401 and the embedded insulator 402 formed of aluminum oxide and that it includes the semiconductor region 403a, the semiconductor region 403c, the intrinsic semiconductor region 403b provided therebetween, the gate 405 having a width of 33 nm, the gate insulating film 404, the sidewall insulator 406a, the sidewall insulator 406b, the insulator 407, the source 408a, and the drain 408b.

The difference between the transistor in FIG. 42A and the transistor in FIG. 42B is the conductivity type of semiconductor regions under the sidewall insulators 406a and 406b. In the transistor in FIG. 42A, the semiconductor regions under the sidewall insulator 406a and the sidewall insulator 406b are part of the semiconductor region 403a having n⁺-type conductivity and part of the semiconductor region 403c having n⁺-type conductivity, whereas in the transistor in FIG. 42B, the semiconductor regions under the sidewall insulator 406a and the sidewall insulator 406b are part of the intrinsic semiconductor region 403b. In other words, in the semiconductor layer of FIG. 42B, a region having a width of $L_{off}$ which overlaps with neither the semiconductor region 403a (the semiconductor region 403c) nor the gate 405 is provided. This region is called an offset region, and the width $L_{off}$ is called an offset length. As is seen from the drawing, the offset length is equal to the width of the sidewall insulator 406a (the sidewall insulator 406b).

Figure 39A:
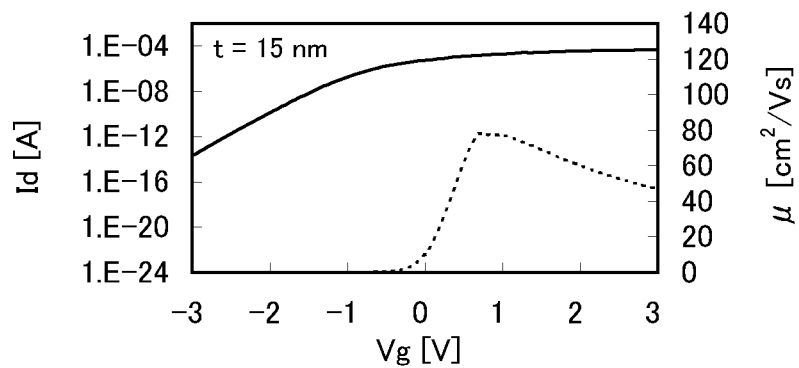
FIGS. 39A to 39C each show gate voltage dependence of drain current and mobility obtained by calculation.
Figure 39B:
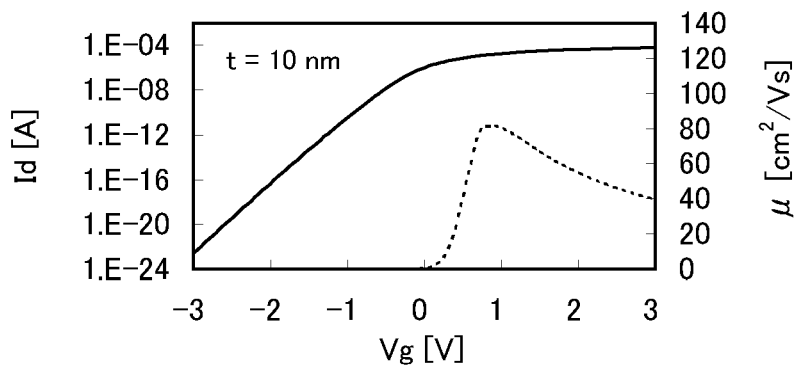
Figure 39C:
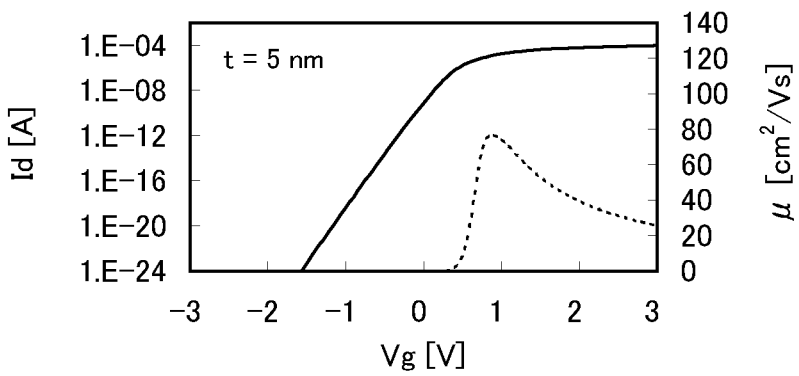

The other parameters used in calculation are as described above. For the calculation, device simulation software Sentaurus Device manufactured by Synopsys, Inc. was used. FIGS. 39A to 39C show the gate voltage ($V_g$: a potential difference between the gate and the source) dependence of the drain current ($I_d$, a solid line) and the mobility (μ, a dotted line) of the transistor having the structure illustrated in FIG. 42A. The drain current $I_d$ is obtained by calculation under the assumption that the drain voltage (a potential difference between the drain and the source) is +1 V, and the mobility μ is obtained by calculation under the assumption that the drain voltage is +0.1 V.

FIG. 39A shows the gate voltage dependence of the transistor in the case where the thickness of the gate insulating film is 15 nm, FIG. 39B shows that of the transistor in the case where the thickness of the gate insulating film is 10 nm, and FIG. 39C shows that of the transistor in the case where the thickness of the gate insulating film is 5 nm. As the gate insulating film is thinner, the drain current $I_d$ in an off state (the off-state current) in particular is significantly decreased. In contrast, there is no noticeable change in peak value of the mobility μ and the drain current $I_d$ in an on state (the on-state current). The graphs show that the drain current exceeds 10 μA at a gate voltage of around 1 V.

Figure 40A:
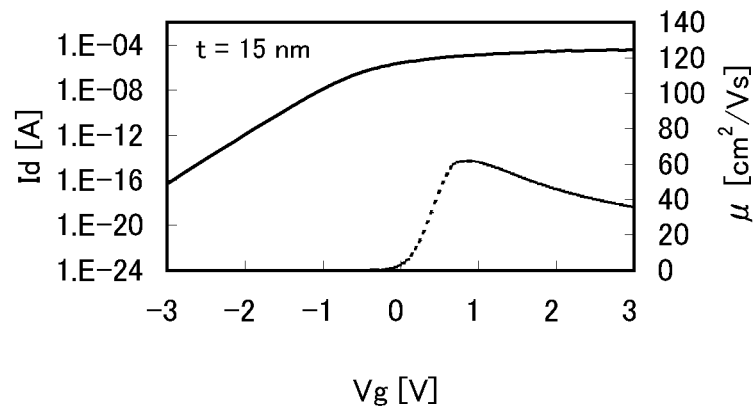
FIGS. 40A to 40C each show gate voltage dependence of drain current and mobility obtained by calculation.
Figure 40B:
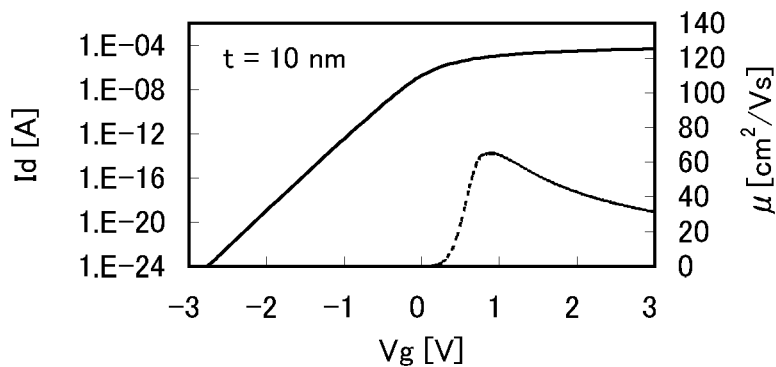
Figure 40C:
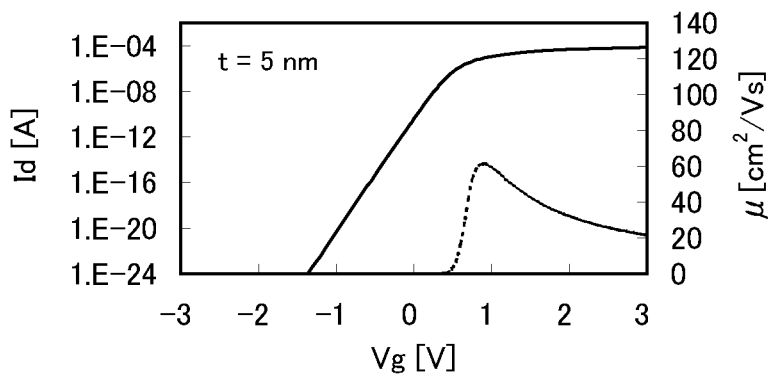

FIGS. 40A to 40C show the gate voltage $V_g$ dependence of the drain current $I_d$ (a solid line) and the mobility μ (a dotted line) of the transistor having the structure in FIG. 42B and an offset length $L_{off}$ of 5 nm. The drain current $I_d$ is obtained by calculation under the assumption that the drain voltage is +1 V, and the mobility μ is obtained by calculation under the assumption that the drain voltage is +0.1 V. FIG. 40A shows the gate voltage dependence of the transistor in the case where the thickness of the gate insulating film is 15 nm, FIG. 40B shows that of the transistor in the case where the thickness of the gate insulating film is 10 nm, and FIG. 40C shows that of the transistor in the case where the thickness of the gate insulating film is 5 nm.

Figure 41A:
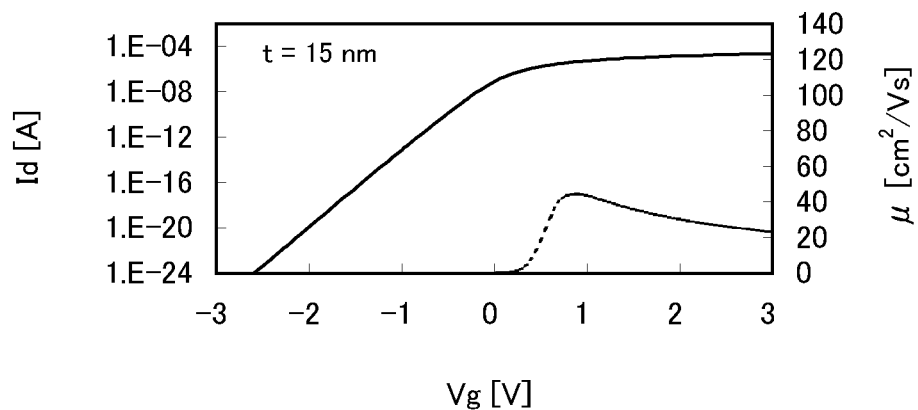
FIGS. 41A to 41C each show gate voltage dependence of drain current and mobility obtained by calculation.
Figure 41B:
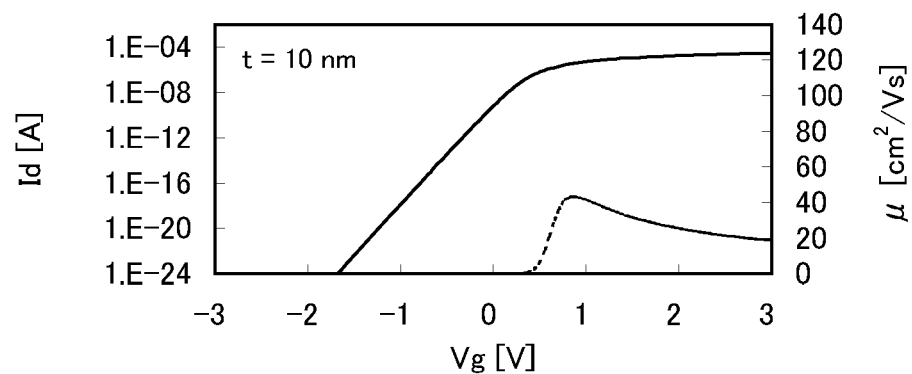
Figure 41C:
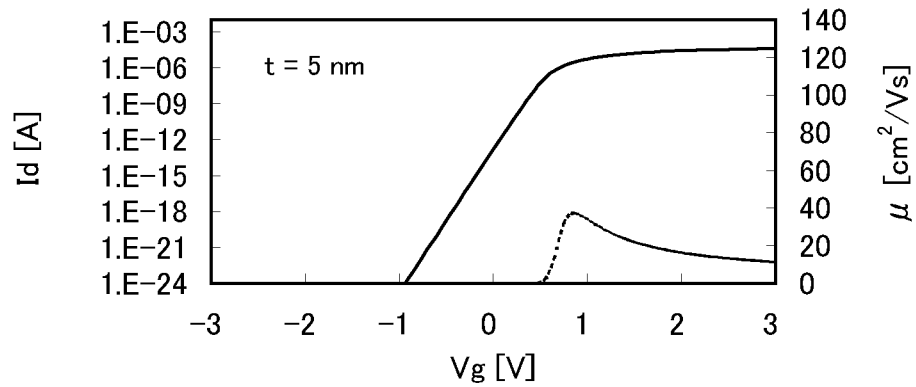
Figure 42A:
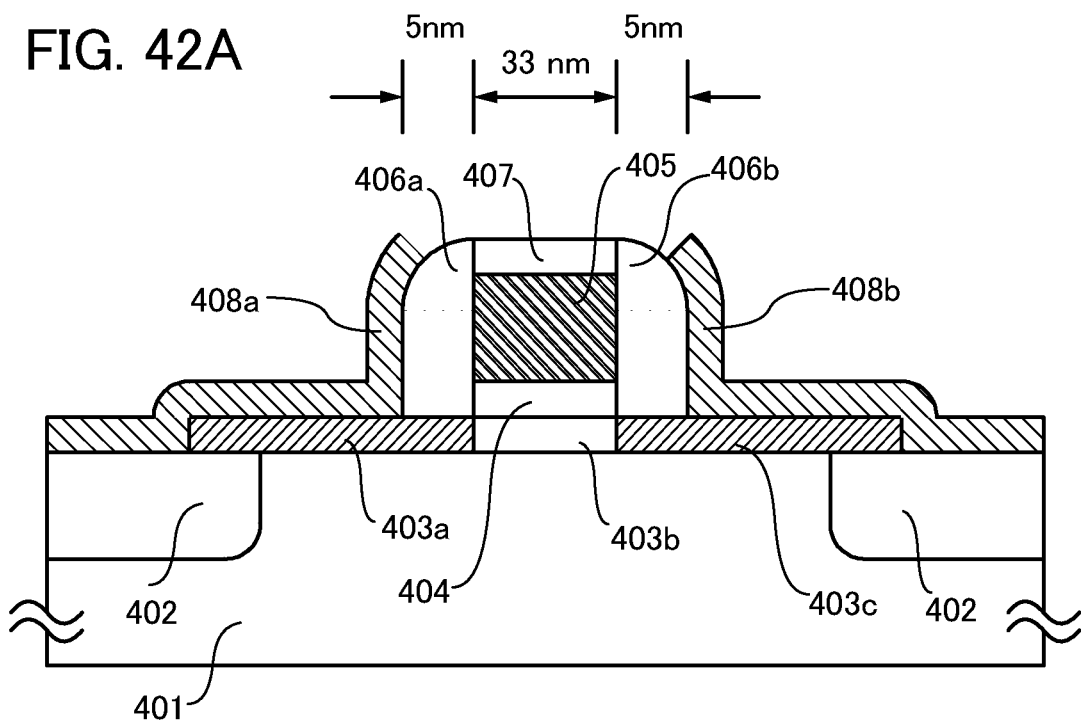
FIGS. 42A and 42B illustrate cross-sectional structures of transistors used for calculation.
Figure 42B:
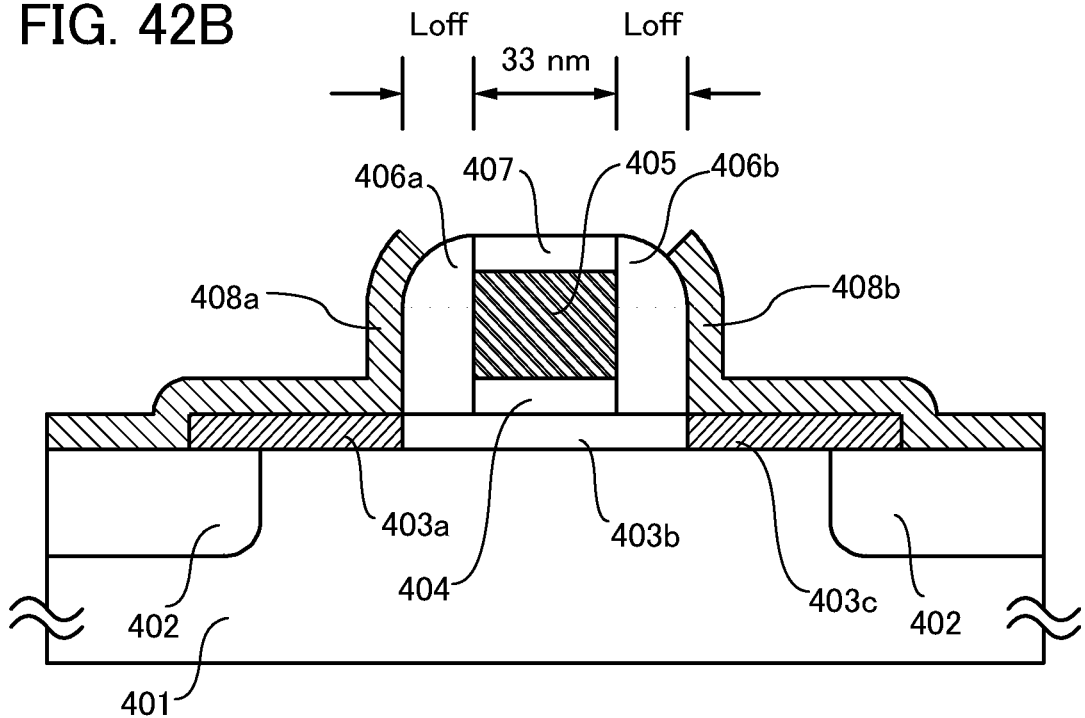

FIGS. 41A to 41C show the gate voltage dependence of the drain current $I_d$ (a solid line) and the mobility μ (a dotted line) of the transistor having the structure in FIG. 42B and an offset length $L_{off}$ of 15 nm. The drain current $I_d$ is obtained by calculation under the assumption that the drain voltage is +1 V, and the mobility μ is obtained by calculation under the assumption that the drain voltage is +0.1 V. FIG. 41A shows the gate voltage dependence of the transistor in the case where the thickness of the gate insulating film is 15 nm, FIG. 41B shows that of the transistor in the case where the thickness of the gate insulating film is 10 nm, and FIG. 41C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm²/Vs in FIGS. 39A to 39C, approximately 60 cm²/Vs in FIGS. 40A to 40C, and approximately 40 cm²/Vs in FIGS. 41A to 41C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA at a gate voltage of around 1 V.

A transistor in which an oxide semiconductor film containing In, Sn, and Zn as main components is used for a channel formation region can have favorable characteristics by forming the oxide semiconductor film while heating a substrate or by performing heat treatment after the oxide semiconductor film is formed. Note that a main component refers to an element included in a composition at 5 atomic % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 43A:
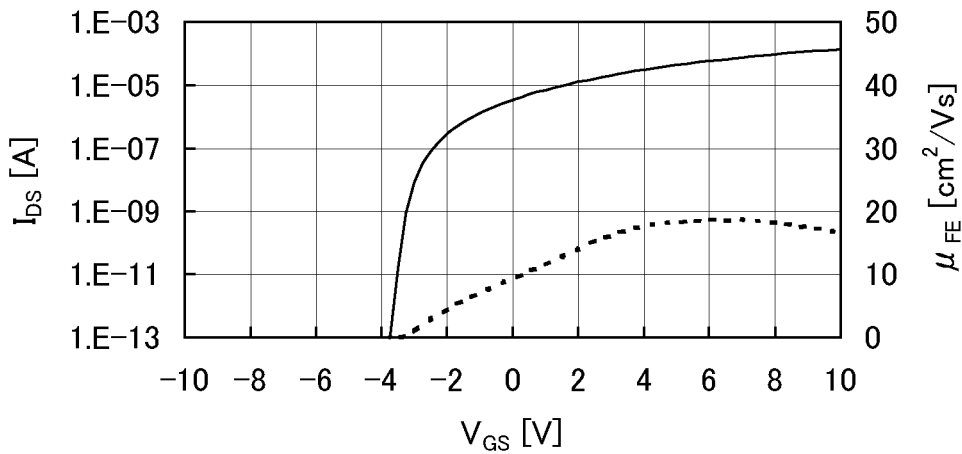
FIGS. 43A to 43C are graphs showing characteristics of transistors each including an oxide semiconductor film.
Figure 43B:
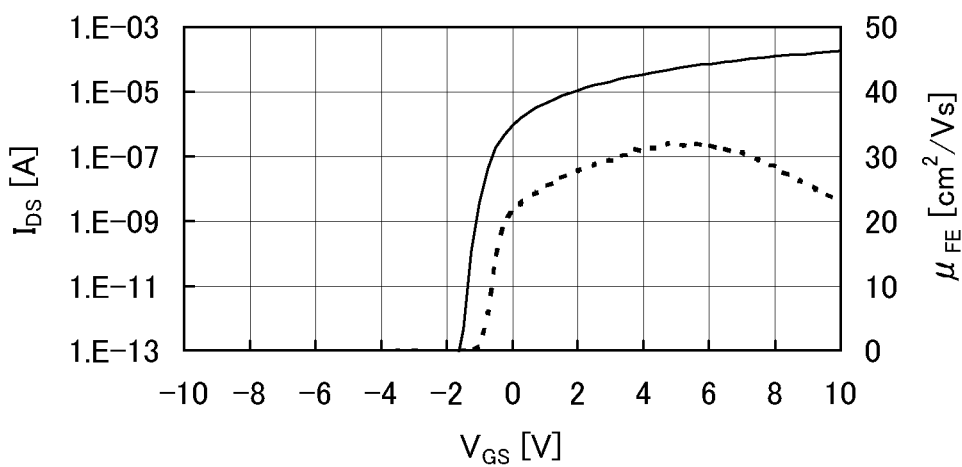
Figure 43C:
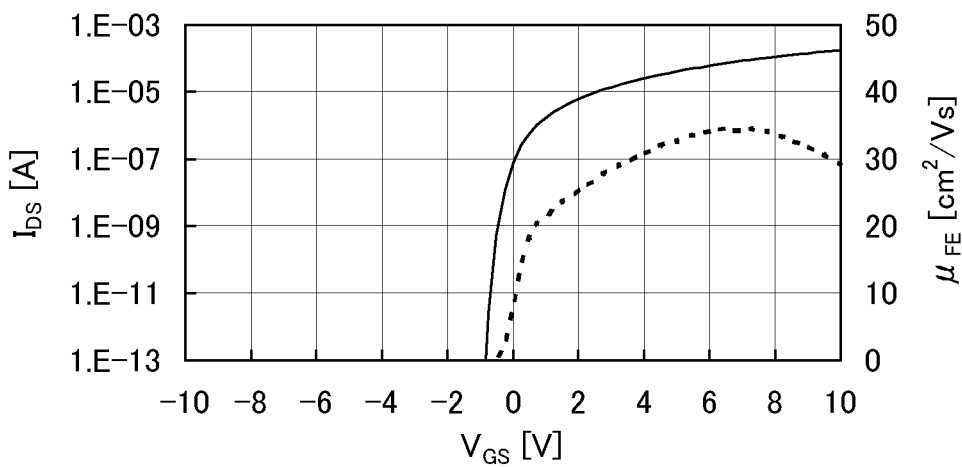

As an example, FIGS. 43A to 43C are graphs each showing characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 43A is a graph showing characteristics of a transistor whose oxide semiconductor film containing In, Sn, and Zn as main components was formed by a sputtering method without heating a substrate intentionally. The field-effect mobility of the transistor was 18.8 cm²/Vsec. On the other hand, when the oxide semiconductor film containing In, Sn, and Zn as main components is formed while heating the substrate intentionally, the field-effect mobility can be improved. FIG. 43B shows characteristics of a transistor whose oxide semiconductor film containing In, Sn, and Zn as main components was formed while heating a substrate at 200° C. The field-effect mobility of the transistor was 32.2 cm²/Vsec.

The field-effect mobility can be further improved by performing heat treatment after formation of the oxide semiconductor film containing In, Sn, and Zn as main components. FIG. 43C shows characteristics of a transistor whose oxide semiconductor film containing In, Sn, and Zn as main components was formed by sputtering at 200° C. and then subjected to heat treatment at 650° C. The field-effect mobility of the transistor was 34.5 cm²/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 cm²/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film which contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 43A and 43B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be achieved by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set in the range of $1\times10^{16}/cm^3$ to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 46:
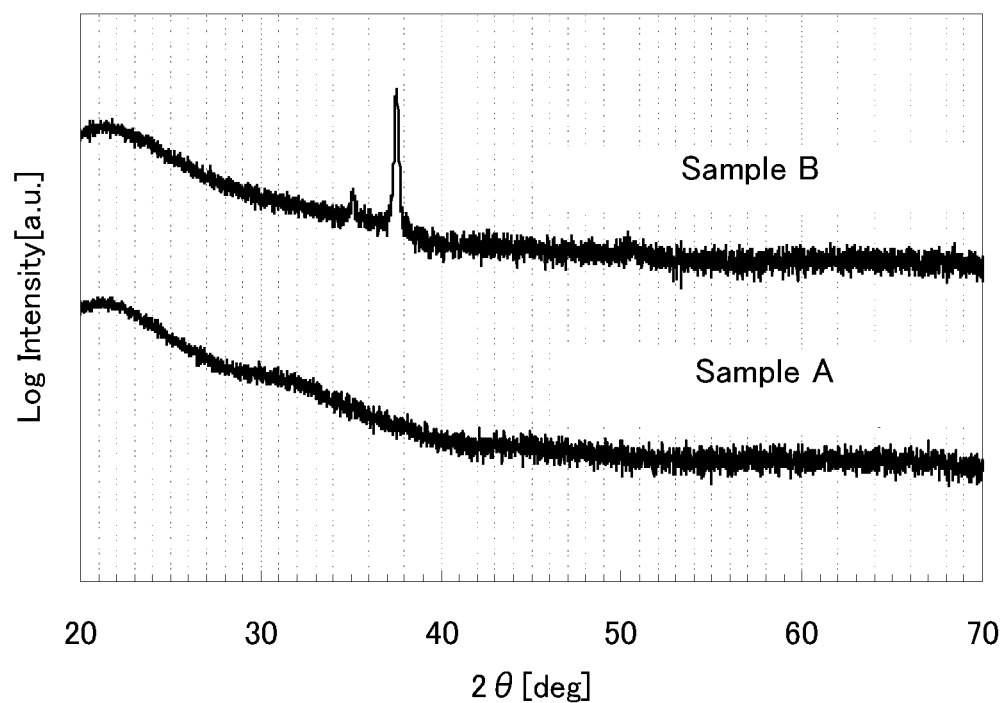
FIG. 46 shows XRD spectra of Sample A and Sample B.

FIG. 46 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the film formation, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 47:
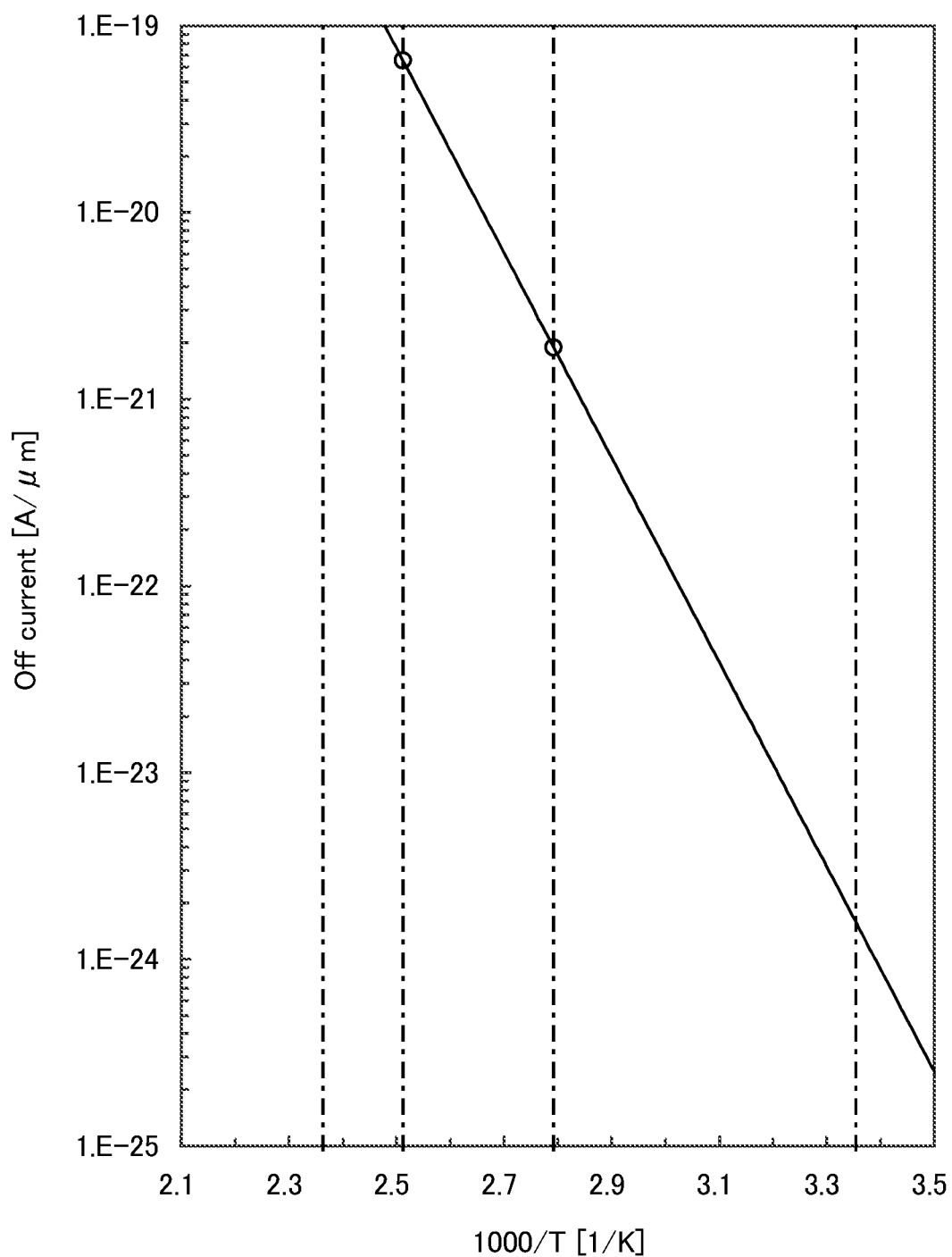
FIG. 47 is a graph showing a relation between off-state current and substrate temperature in measurement of a transistor.

FIG. 47 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 47, the off-state current can be 1 aA/μm ($1\times10^{-18}$ A/μm) or lower when the substrate temperature is 125° C., and 100 zA/μm ($1\times10^{-19}$ A/μm) or lower when the substrate temperature is 85° C. The proportional relation between the logarithm of the off-state current and the inverse of the temperature suggests that the off-state current is 1 zA/μm ($1\times10^{-21}$ A/μm) or lower at room temperature (27° C.). Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively. The above values of off-state currents are clearly much lower than that of the transistor using Si as a semiconductor film. By using a transistor including an oxide semiconductor whose off-state current value is extremely low as the transistor described in any of Embodiments 1 to 6, a logic circuit whose data holding characteristics are kept extremely high even after power is turned off can be provided. Further, since data holding characteristics are improved, a logic circuit with low power consumption can be provided.

The relation between the substrate temperature and electrical characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C.

One example of a transistor used for the measurement will be described with reference to FIGS. 44A and 44B and FIGS. 45A and 45B. Note that in FIGS. 44A and 44B and FIGS. 45A and 45B, an In—Sn—Zn—O film is used as a semiconductor film.

Figure 44A:
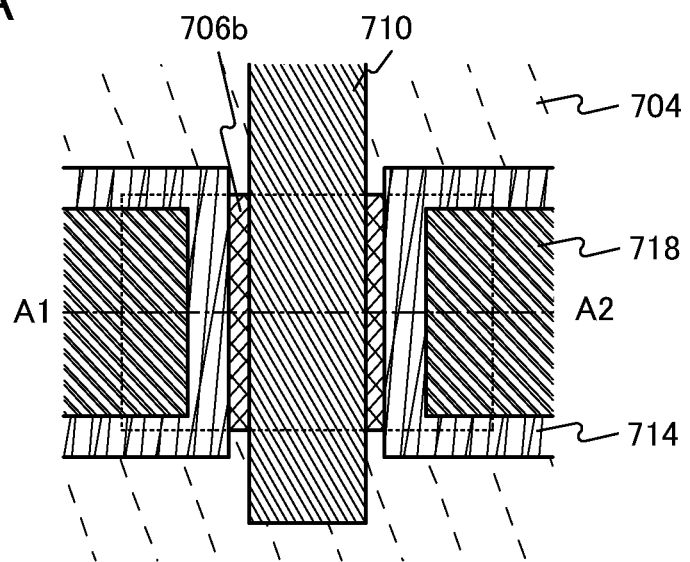
FIGS. 44A and 44B are a top view and a cross-sectional view illustrating a structure of a transistor.
Figure 44B:
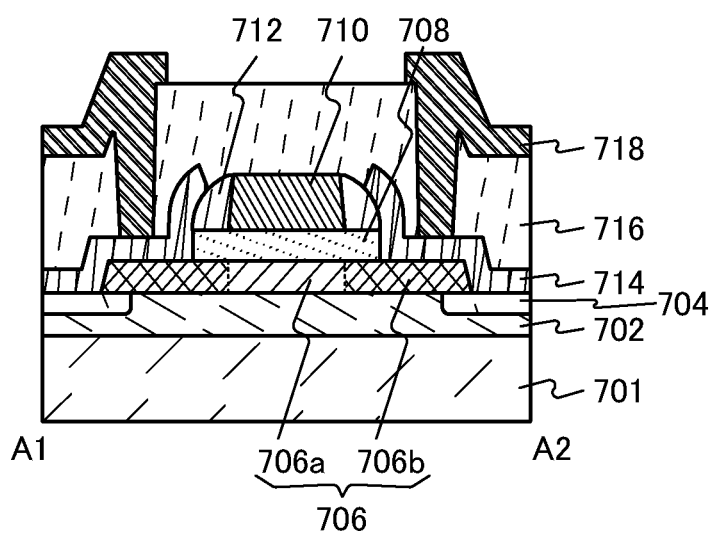

FIGS. 44A and 44B are a top view and a cross-sectional view of a coplanar transistor having a top-gate top-contact structure. FIG. 44A is the top view of the transistor. FIG. 44B is the cross-sectional view taken along dashed-dotted line A1-A2 in FIG. 44A.

The transistor illustrated in FIG. 44B includes a substrate 701; a base insulating film 702 provided over the substrate 701; a protective insulating film 704 provided in the periphery of the base insulating film 702; an oxide semiconductor film 706 which is provided over the base insulating film 702 and the protective insulating film 704 and includes a high-resistance region 706a and low-resistance regions 706b; a gate insulating film 708 provided over the oxide semiconductor film 706; a gate electrode 710 provided to overlap with the oxide semiconductor film 706 with the gate insulating film 708 positioned therebetween; a sidewall insulating film 712 provided in contact with a side surface of the gate electrode 710; a pair of electrodes 714 provided in contact with at least the low-resistance regions 706b; an interlayer insulating film 716 provided to cover at least the oxide semiconductor film 706, the gate electrode 710, and the pair of electrodes 714; and a wiring 718 provided to be connected to at least one of the pair of electrodes 714 through an opening formed in the interlayer insulating film 716.

Although not illustrated, a protective film may be provided to cover the interlayer insulating film 716 and the wiring 718. With the protective film, a minute amount of leakage current generated by surface conduction of the interlayer insulating film 716 can be reduced and thus the off-state current of the transistor can be reduced.

Figure 45A:
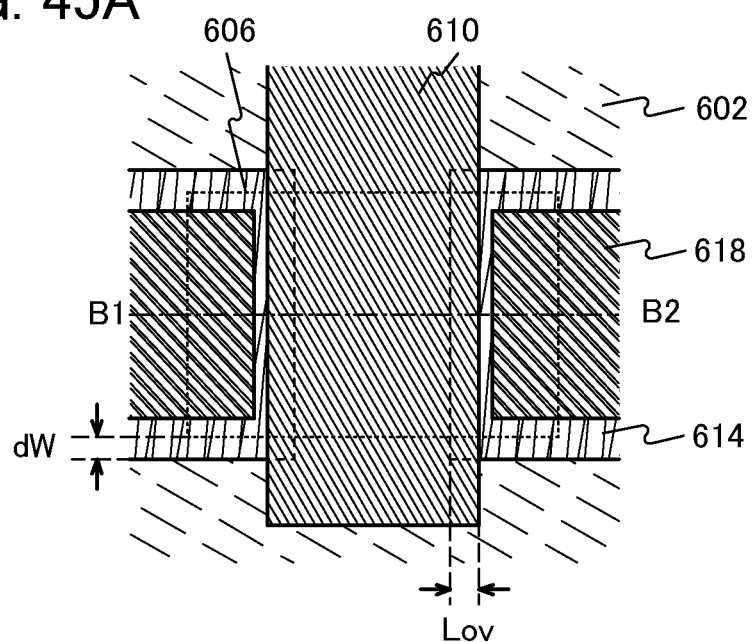
FIGS. 45A and 45B are a top view and a cross-sectional view illustrating a structure of a transistor.
Figure 45B:
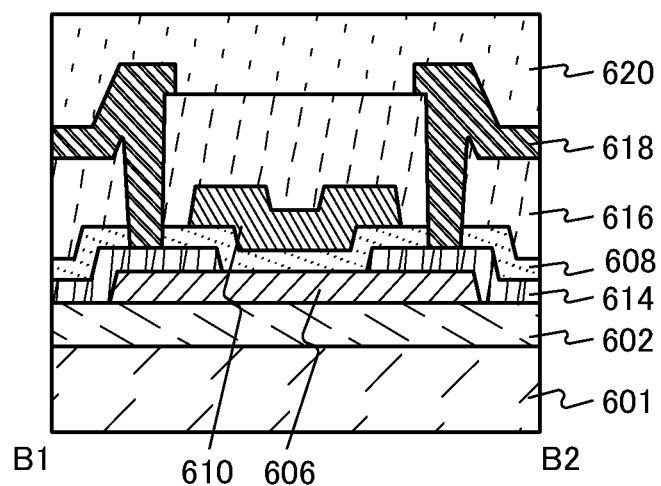

FIGS. 45A and 45B are a top view and a cross-sectional view of a transistor having a top-gate top-contact structure. FIG. 45A is the top view of the transistor. FIG. 45B is the cross-sectional view taken along dashed-dotted line B1-B2 in FIG. 45A.

The transistor illustrated in FIG. 45B includes a substrate 601; a base insulating film 602 provided over the substrate 601; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 601, a glass substrate can be used. As the base insulating film 602, a silicon oxide film can be used. As the oxide semiconductor film 606, an In—Sn—Zn—O film can be used. As the pair of electrodes 614, a tungsten film can be used. As the gate insulating film 608, a silicon oxide film can be used. The gate electrode 610 can have a stacked structure of a tantalum nitride film and a tungsten film. The interlayer insulating film 616 can have a stacked structure of a silicon oxynitride film and a polyimide film. The wirings 618 can each have a stacked structure in which a titanium film, an aluminum film, and a titanium film are formed in this order. As the protective film 620, a polyimide film can be used.

Note that in the transistor having the structure illustrated in FIG. 45A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

Figure 48:
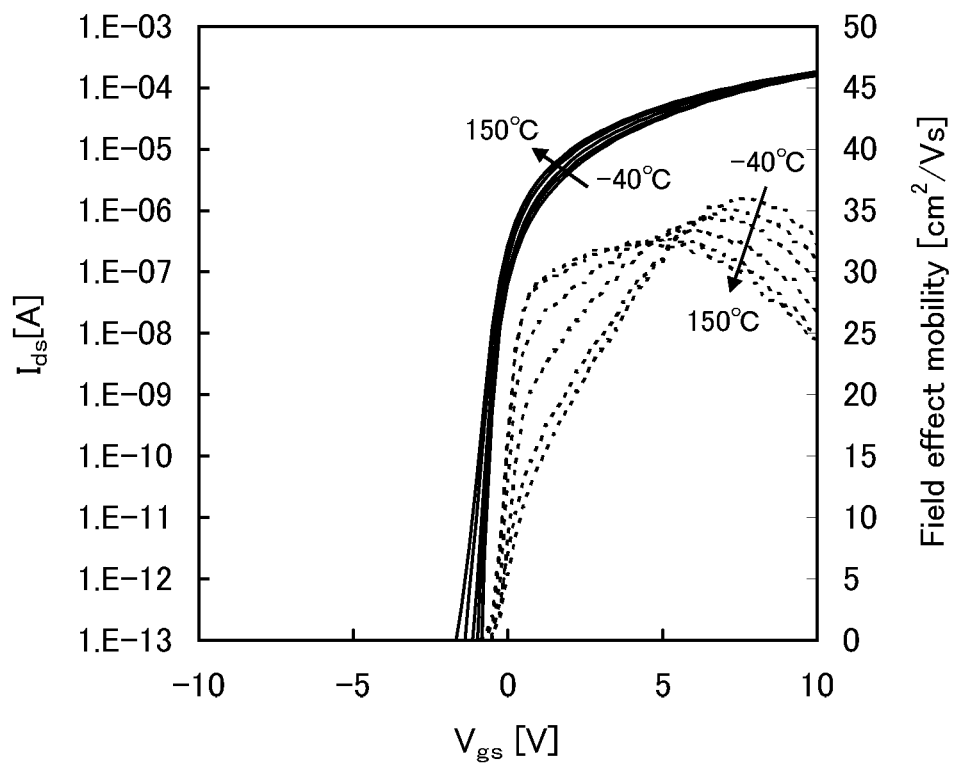
FIG. 48 is a graph showing $V_g$, dependence of $I_{ds}$ and field-effect mobility.
Figure 49A:
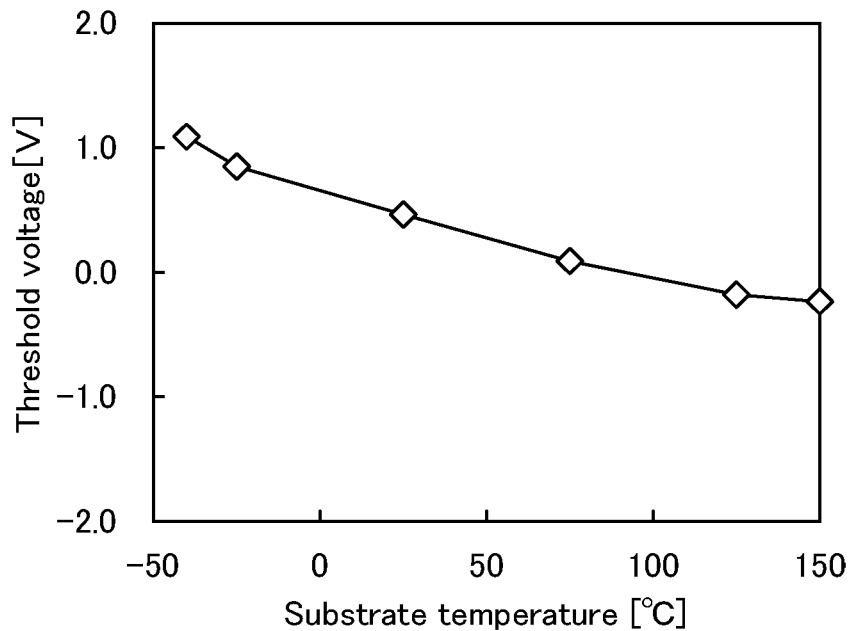
FIG. 49A shows a relation between substrate temperature and threshold voltage.

FIG. 48 shows the $V_{gs}$ dependence of $I_{ds}$ (a solid line) and field-effect mobility (a dotted line). FIG. 49A shows a relation between the substrate temperature and the threshold voltage, and FIG. 49B shows a relation between the substrate temperature and the field-effect mobility.

From FIG. 49A, it is found that the threshold voltage gets lower as the substrate temperature increases. Note that the threshold voltage is decreased from 1.09 V to −0.23 V in the range from −40° C. to 150° C.

Figure 49B:
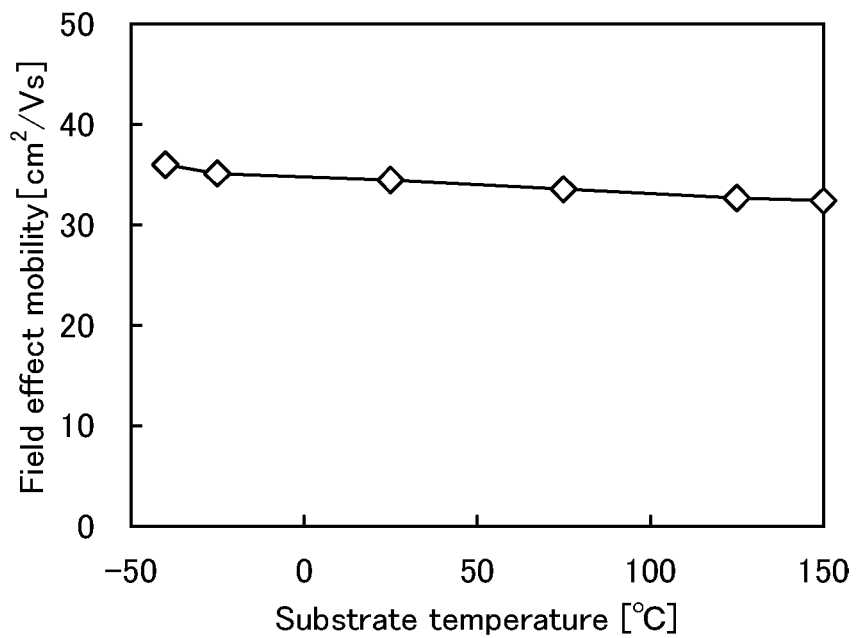
FIG. 49B shows a relation between substrate temperature and field-effect mobility.

From FIG. 49B, it is found that the field-effect mobility gets lower as the substrate temperature increases. Note that the field-effect mobility is decreased from 36 $cm^2$/Vs to 32 $cm^2$/Vs in the range from −40° C. to 150° C. Thus, it is found that variation in electrical characteristics is small in the above temperature range.

In a transistor in which such an oxide semiconductor containing In, Sn, and Zn as main components is used as a channel formation region, a field-effect mobility of 30 $cm^2$/Vsec or higher, preferably 40 $cm^2$/Vsec or higher, further preferably 60 $cm^2$/Vsec or higher can be obtained with the off-state current kept at 1 aA/μm or lower, which can achieve on-state current needed for a logic circuit. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor. With such characteristics, a logic circuit having a novel function can be achieved without decreasing the operation speed even when a transistor including an oxide semiconductor is provided in a logic circuit formed using a silicon semiconductor.

This application is based on Japanese Patent Application serial no. 2011-113430 filed with Japan Patent Office on May 20, 2011, the entire contents of which are hereby incorporated by reference.

What is claimed is:

1. A semiconductor integrated circuit including a logic circuit, the logic circuit comprising:
   a comparator configured to compare potentials of two output nodes;
   a charge holding portion electrically connected to the comparator, the charge holding portion comprising:
      a first transistor;
      a second transistor;
      a third transistor;
      a fourth transistor;
      a fifth transistor;
      a sixth transistor;
      a seventh transistor; and
      an eighth transistor; and
   an output-node-potential determining portion,
   wherein one of a source and a drain of the first transistor is electrically connected to one of a source and a drain of the third transistor,
   wherein one of a source and a drain of the fifth transistor is electrically connected to one of a source and a drain of the seventh transistor and one of the two output nodes,
   wherein the other of the source and the drain of the first transistor is electrically connected to the other of the two output nodes,
   wherein the other of the source and the drain of the fifth transistor is electrically connected to the other of the source and drain of the seventh transistor and the output-node-potential determining portion,
   wherein the other of the source and the drain of the third transistor is electrically connected to the output-node-potential determining portion,
   wherein a gate of the first transistor is electrically connected to one of a source and a drain of the second transistor,
   wherein a gate of the third transistor is electrically connected to one of a source and a drain of the fourth transistor,
   wherein a gate of the fifth transistor is electrically connected to one of a source and a drain of the sixth transistor,
   wherein a gate of the seventh transistor is electrically connected to one of a source and a drain of the eighth transistor,
   wherein the other of the source and the drain of the second transistor is configured to receive a first signal input,
   wherein the other of the source and the drain of the fourth transistor is configured to receive a second signal input,
   wherein the other of the source and the drain of the sixth transistor is configured to receive a third signal input, and
   wherein the other of the source and the drain of the eighth transistor is configured to receive a fourth signal input.

2. The semiconductor integrated circuit according to claim 1,
wherein the comparator comprises a first p-channel transistor, a second p-channel transistor, a third p-channel transistor, and a fourth p-channel transistor,
wherein each of a gate of the first p-channel transistor and a gate of the second p-channel transistor is supplied with a clock signal,
wherein a gate of the third p-channel transistor is electrically connected to one of the two output nodes, and
wherein a gate of the fourth p-channel transistor is electrically connected to the other of the two output nodes.

3. The semiconductor integrated circuit according to claim 1,
wherein the output-node-potential determining portion is one n-channel transistor,
wherein a gate of the n-channel transistor is supplied with a clock signal, and
wherein one of a source and a drain of the n-channel transistor is electrically connected to a ground potential terminal.

4. The semiconductor integrated circuit according to claim 3, wherein the n-channel transistor comprises an oxide semiconductor layer.

5. The semiconductor integrated circuit according to claim 1,
wherein the comparator comprises a first n-channel transistor, a second n-channel transistor, a third n-channel transistor, and a fourth n-channel transistor,
wherein each of a gate of the first n-channel transistor and a gate of the second n-channel transistor is supplied with a clock signal,
wherein a gate of the third n-channel transistor is electrically connected to a first output node, and
wherein a gate of the fourth n-channel transistor is electrically connected to a second output node.

6. The semiconductor integrated circuit according to claim 5, wherein each of the first n-channel transistor, the second n-channel transistor, the third n-channel transistor and the fourth n-channel transistor comprises an oxide semiconductor.

7. The semiconductor integrated circuit according to claim 1,
wherein the output-node-potential determining portion is one p-channel transistor,
wherein a gate of the p-channel transistor is supplied with a clock signal, and
wherein one of a source and a drain of the p-channel transistor is electrically connected to a power supply potential terminal.

8. The semiconductor integrated circuit according to claim 1, wherein the charge holding portion further comprises:
a first storage capacitor electrically connected to the gate of the first transistor and one of the source and the drain of the second transistor;
a second storage capacitor electrically connected to the gate of the third transistor and one of the source and the drain of the fourth transistor;
a third storage capacitor electrically connected to the gate of the fifth transistor and one of the source and the drain of the sixth transistor; and
a fourth storage capacitor electrically connected to the gate of the seventh transistor and one of the source and the drain of the eighth transistor.

9. The semiconductor integrated circuit according to claim 1,
wherein the first transistor and the second transistor are stacked with each other,
wherein the third transistor and the fourth transistor are stacked with each other,
wherein the fifth transistor and the sixth transistor are stacked with each other, and
wherein the seventh transistor and the eighth transistor are stacked with each other.

10. The semiconductor integrated circuit according to claim 1,
wherein the first transistor comprises a first layer comprising silicon,
wherein the second transistor comprises a second layer comprising an oxide semiconductor,
wherein the third transistor comprises a third layer comprising silicon,
wherein the fourth transistor comprises a fourth layer comprising an oxide semiconductor,
wherein the fifth transistor comprises a fifth layer comprising silicon,
wherein the sixth transistor comprises a sixth layer comprising an oxide semiconductor,
wherein the seventh transistor comprises a seventh layer comprising silicon, and
wherein the eighth transistor comprises an eighth layer comprising an oxide semiconductor.

11. A semiconductor device including a logic circuit, the logic circuit comprising:
a comparator configured to compare potentials of a first output node and a second output node;
a charge holding portion electrically connected to the comparator, the charge holding portion comprising:
a first circuit comprising a first terminal and a second terminal, the first circuit comprising a first transistor and a second transistor; and
a second circuit comprising a third terminal and a fourth terminal, the second circuit comprising a third transistor and a fourth transistor; and
an output-node-potential determining portion,
wherein the first transistor and the second transistor are electrically connected in series,
wherein the third transistor and the fourth transistor are electrically connected in parallel,
wherein the first terminal is electrically connected to the first output node,
wherein the third terminal is electrically connected to the second output node,
wherein the second terminal and the fourth terminal are electrically connected to the output-node-potential determining portion,
wherein a gate of the first transistor is configured to receive and hold a first signal input,
wherein a gate of the second transistor is configured to receive and hold a second signal input,
wherein a gate of the third transistor is configured to receive and hold a third signal input, and
wherein a gate of the fourth transistor is configured to receive and hold a fourth signal input.

12. The semiconductor device according to claim 11,
wherein the comparator comprises a fifth transistor, a sixth transistor, a seventh transistor, and an eighth transistor,
wherein the fifth transistor, the sixth transistor, the seventh transistor, and the eighth transistor are one of n-channel type and p-channel type,
wherein each of a gate of the fifth transistor and a gate of the sixth transistor is supplied with a clock signal, wherein a gate of the seventh transistor is electrically connected to the first output node, and wherein a gate of the eighth transistor is electrically connected to the second output node.

13. The semiconductor device according to claim 12, wherein the output-node-potential determining portion is a ninth transistor, wherein the ninth transistor is n-channel type when the fifth transistor, the sixth transistor, the seventh transistor, and the eighth transistor are p-channel type and the ninth transistor is p-channel type when the fifth transistor, the sixth transistor, the seventh transistor, and the eighth transistor are n-channel type, wherein a gate of the ninth transistor is supplied with the clock signal, and wherein one of a source and a drain of the ninth transistor is electrically connected to a ground potential terminal when the ninth transistor is n-channel type and to a power supply potential terminal when the ninth transistor is p-channel type.

14. The semiconductor device according to claim 11, wherein a gate of each of the first transistor, the second transistor, the third transistor, and the fourth transistor is connected to one of a source and a drain of a transistor.

15. The semiconductor device according to claim 14, wherein the transistor comprises an oxide semiconductor layer.

16. The semiconductor device according to claim 11, wherein the charge holding portion further comprises:

a first storage capacitor electrically connected to the gate of the first transistor;

a second storage capacitor electrically connected to the gate of the second transistor;

a third storage capacitor electrically connected to the gate of the third transistor; and a fourth storage capacitor electrically connected to the gate of the fourth transistor.

* * * * *

UNITED STATES PATENT AND TRADEMARK OFFICE
CERTIFICATE OF CORRECTION

PATENT NO. : 8,587,342 B2  Page 1 of 1
APPLICATION NO. : 13/471920
DATED : November 19, 2013
INVENTOR(S) : Yuto Yakubo et al.

It is certified that error appears in the above-identified patent and that said Letters Patent is hereby corrected as shown below:

In the Specification

At column 5, line 15, "$V_g$," should be --$V_{gs}$--;

At column 7, line 61, "terminal Consequently," should be --terminal. Consequently,--;

At column 15, line 62, "terminal Consequently," should be --terminal. Consequently,--;

At column 17, line 25, "to the node A;" should be --to the node A';--;

At column 17, line 28, "to the node D;" should be --to the node D';--;

At column 19, line 34, "to the node A;" should be --to the node A';--;

At column 19, line 37, "to the node D;" should be --to the node D';--;

At column 26, line 11, "G Since" should be --G. Since--;

At column 31, line 36, "terminal Consequently," should be --terminal. Consequently,--;

At column 32, line 65, "to the node A;" should be --to the node A';--;

At column 33, line 2, "to the node D;" should be --to the node D';--;

At column 35, line 6, "to the node A;" should be --to the node A';--;

At column 35, line 9, "to the node D;" should be --to the node D';--.

Signed and Sealed this
Twenty-second Day of April, 2014

Michelle K. Lee
*Deputy Director of the United States Patent and Trademark Office*